(12) United States Patent
Oh et al.

(10) Patent No.: US 11,848,335 B2
(45) Date of Patent: Dec. 19, 2023

(54) DISPLAY DEVICE

(71) Applicant: SAMSUNG DISPLAY CO., LTD., Yongin-si (KR)

(72) Inventors: Won Sik Oh, Yongin-si (KR); Hyun Min Cho, Yongin-si (KR); Dae Hyun Kim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/755,970

(22) PCT Filed: Oct. 8, 2020

(86) PCT No.: PCT/KR2020/013811
§ 371 (c)(1),
(2) Date: May 12, 2022

(87) PCT Pub. No.: WO2021/096070
PCT Pub. Date: May 20, 2021

(65) Prior Publication Data
US 2022/0392923 A1 Dec. 8, 2022

(30) Foreign Application Priority Data

Nov. 13, 2019 (KR) .......................... 10-2019-0145116

(51) Int. Cl.
*H01L 27/12* (2006.01)
*G09G 3/32* (2016.01)
(Continued)

(52) U.S. Cl.
CPC ............. *H01L 27/124* (2013.01); *G09G 3/32* (2013.01); *H01L 24/24* (2013.01); *H01L 24/25* (2013.01);
(Continued)

(58) Field of Classification Search
CPC ....... H01L 27/124; H01L 24/25; H01L 33/62; H01L 27/12; H01L 21/67; H01L 25/167;
(Continued)

(56) References Cited

U.S. PATENT DOCUMENTS 9,818,341 B2 * 11/2017 Kwon .................. G09G 3/3291
9,928,776 B2    3/2018 Kim
(Continued)

FOREIGN PATENT DOCUMENTS

CN      109147693 A    1/2019
KR   10-1368049 B1    2/2014
(Continued)

OTHER PUBLICATIONS

LEDs Magazine, LED Design Forum Avoiding thermal runaway when driving multiple LED strings (Magazine), Apr. 21, 2009.
(Continued)

*Primary Examiner* — Vinh T Lam
(74) *Attorney, Agent, or Firm* — Lewis Roca Rothgerber Christie LLP

(57) ABSTRACT

A display device may include a first scan line, a first data line and a second data line, a first read-out line and a second read-out line. A first sub-pixel may be connected to the first scan line, the first data line, and the first read-out line. A second sub-pixel may be connected to the first scan line, the first data line, and the second read-out line. A third sub-pixel may be connected to the first scan line, the second data line, and the first read-out line. Each of the first sub-pixel, the second sub-pixel, and the third sub-pixel may include at least one light emitting element.

20 Claims, 29 Drawing Sheets

(51) Int. Cl.
  *H01L 23/00* (2006.01)
  *H01L 25/16* (2023.01)
  *H01L 33/62* (2010.01)
  *H01L 33/32* (2010.01)

(52) U.S. Cl.
  CPC ............ *H01L 25/167* (2013.01); *H01L 33/62* (2013.01); *G09G 2300/0408* (2013.01); *G09G 2300/0426* (2013.01); *G09G 2300/0452* (2013.01); *G09G 2300/0852* (2013.01); *G09G 2320/0223* (2013.01); *H01L 33/32* (2013.01); *H01L 2224/24051* (2013.01); *H01L 2224/24147* (2013.01); *H01L 2224/2512* (2013.01); *H01L 2224/25175* (2013.01); *H01L 2924/12041* (2013.01)

(58) Field of Classification Search
  CPC ................... H01L 21/768; H01L 24/24; H01L 2224/2512; H01L 25/0753; H01L 2224/24051; H01L 33/32; H01L 2924/12041; H01L 2224/24147; H01L 2224/25175; G09G 3/32; G09G 2300/0452; G09G 2300/0408; G09G 2300/0852; G09G 2300/0426; G09G 2320/0223
  See application file for complete search history.

(56) References Cited

U.S. PATENT DOCUMENTS

| | | | |
|---|---|---|---|
| 10,008,159 B2 | 6/2018 | Song | |
| 10,187,596 B2* | 1/2019 | Kurokawa | H01L 27/1464 |
| 10,424,601 B2* | 9/2019 | Chen | H01L 27/124 |
| 10,482,825 B2 | 11/2019 | Kim | |
| 10,762,822 B2* | 9/2020 | Huang | G09G 3/2003 |
| 10,923,507 B2* | 2/2021 | Cheng | H01L 27/124 |
| 10,943,085 B2* | 3/2021 | Cheng | G06V 40/1318 |
| 11,024,233 B2* | 6/2021 | Park | G09G 3/3233 |
| 11,037,914 B2* | 6/2021 | Kim | H01L 25/167 |
| 11,282,915 B2* | 3/2022 | Yuan | G09G 3/3233 |
| 11,403,997 B2* | 8/2022 | Kwag | G09G 3/32 |
| 11,574,578 B2* | 2/2023 | Yang | G09G 3/3291 |
| 11,600,679 B2* | 3/2023 | Bang | H10K 59/126 |
| 11,605,689 B2* | 3/2023 | Yuan | G09G 3/3233 |
| 2005/0179625 A1* | 8/2005 | Choi | G09G 3/3233 345/76 |
| 2010/0289829 A1* | 11/2010 | Yamamoto | G09G 3/3233 345/690 |
| 2012/0092302 A1* | 4/2012 | Imai | G02F 1/13318 345/175 |
| 2014/0267200 A1* | 9/2014 | Iwasa | G09G 3/3611 345/204 |
| 2015/0364107 A1* | 12/2015 | Sakariya | G06F 3/042 345/82 |
| 2016/0125784 A1* | 5/2016 | Son | G09G 3/3607 345/694 |
| 2016/0267839 A1* | 9/2016 | Yang | G09G 3/3283 |
| 2017/0039952 A1* | 2/2017 | Kim | G09G 3/3233 |
| 2017/0169767 A1* | 6/2017 | Song | G09G 3/3233 |
| 2017/0294166 A1* | 10/2017 | Kim | G11C 19/28 |
| 2018/0101271 A1* | 4/2018 | Tsai | G06F 3/0412 |
| 2018/0190750 A1* | 7/2018 | Choi | G09G 3/3275 |
| 2018/0330137 A1* | 11/2018 | Moon | G06V 40/1376 |
| 2019/0056609 A1* | 2/2019 | Kim | G02F 1/1368 |
| 2019/0114970 A1 | 4/2019 | Moradi et al. | |
| 2019/0148464 A1* | 5/2019 | Yeom | H10K 59/1216 257/40 |
| 2019/0164502 A1* | 5/2019 | Yoon | G09G 3/3233 |
| 2019/0259325 A1* | 8/2019 | Chaji | G06T 7/90 |
| 2019/0278407 A1* | 9/2019 | Ma | G09G 3/3275 |
| 2019/0377446 A1* | 12/2019 | Lin | G06V 40/1318 |
| 2020/0027941 A1* | 1/2020 | Luan | G09G 3/3233 |
| 2020/0042759 A1* | 2/2020 | Kim | G06F 3/0445 |
| 2020/0043422 A1* | 2/2020 | Kim | G09G 3/3291 |
| 2020/0335035 A1* | 10/2020 | Gai | G09G 3/325 |
| 2020/0380920 A1* | 12/2020 | Lee | G09G 3/3233 |
| 2021/0201804 A1* | 7/2021 | Feng | G09G 3/3266 |
| 2021/0217739 A1* | 7/2021 | Lee | H01L 33/50 |
| 2021/0242380 A1 | 8/2021 | Kim et al. | |
| 2021/0343784 A1* | 11/2021 | Kwag | H01L 29/78633 |

FOREIGN PATENT DOCUMENTS

| | | |
|---|---|---|
| KR | 10-2016-0081635 A | 7/2016 |
| KR | 10-2017-0018135 A | 2/2017 |
| KR | 10-2017-0117284 A | 10/2017 |
| KR | 10-2019-0012054 A | 2/2019 |
| KR | 10-2019-0124359 A | 11/2019 |
| KR | 10-2020-0105598 A | 9/2020 |
| KR | 10-2020-0139297 A | 12/2020 |

OTHER PUBLICATIONS

International Search Report of PCT/KR2020/013811, dated Jan, 19, 2021 (4 pages) with English Translation (3 pages).
Written Opinion of PCT/KR2020/013811, dated Jan. 19, 2021 (4 pages) with English Translation (2 pages).

* cited by examiner

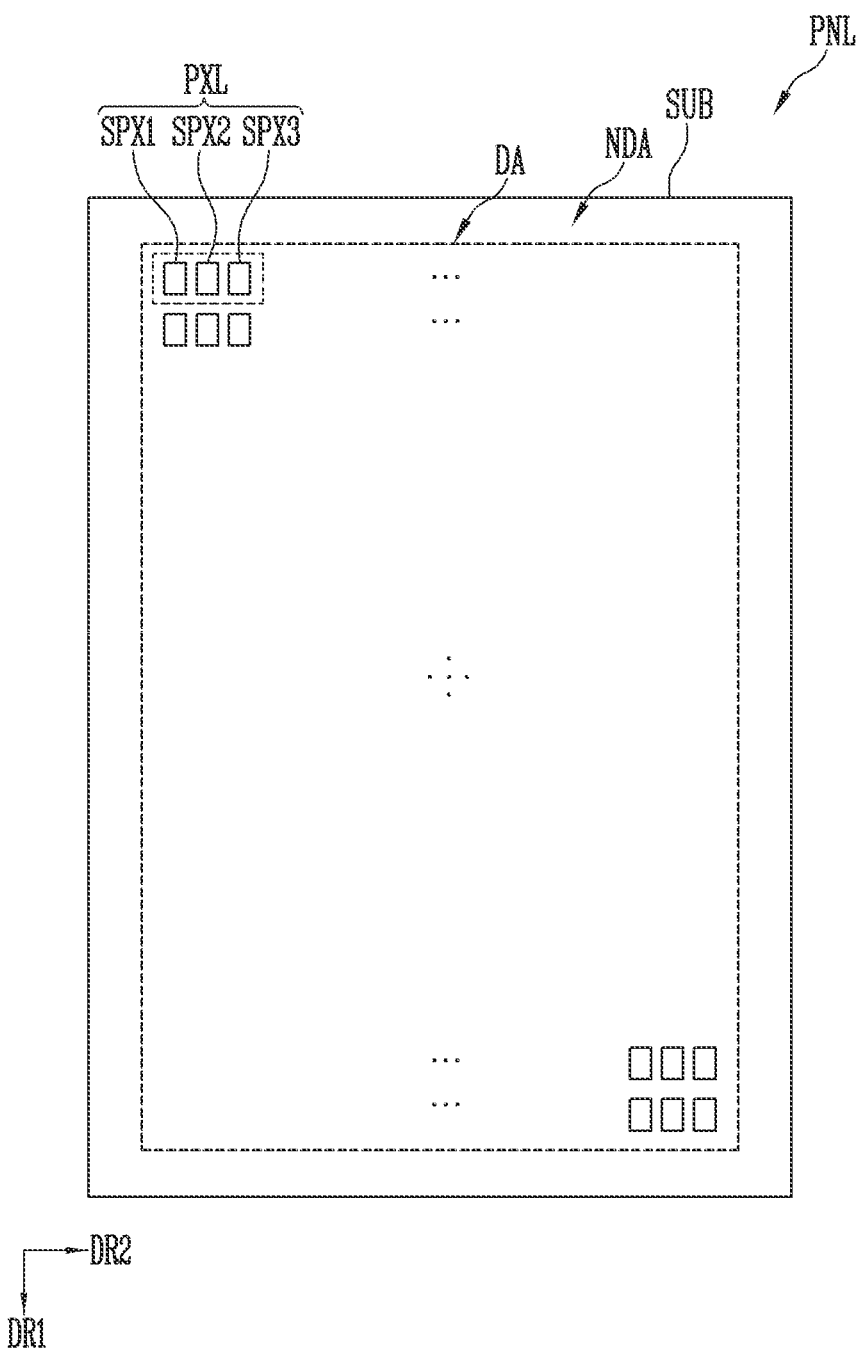

DISPLAY DEVICE

CROSS-REFERENCE TO RELATED APPLICATIONS

This application is a U.S. National Phase Patent Application of International Patent Application Number PCT/KR2020/013811, filed on Oct. 8, 2020, which claims priority to Korean Patent Application Number 10-2019-0145116, filed on Nov. 13, 2019, the entire contents of all of which are incorporated by reference herein.

BACKGROUND

1. Field

Various embodiments of the present disclosure relate to a display device.

2. Description of the Related Art

Recently, a technique of manufacturing a subminiature light emitting element using a material having a reliable inorganic crystal structure and manufacturing a light emitting device using the light emitting element has been developed. For example, a technique of configuring a light source of a light emitting device using subminiature light emitting elements having a small size corresponding to a range from a nanoscale size to a microscale size has been developed. Such a light emitting device may be used in various electronic devices such as a display device and a lighting device.

SUMMARY

Each pixel that forms a display device may include a driving transistor and a plurality of subminiature light emitting elements coupled to the driving transistor. Although it is desired that driving current provided from the driving transistor is evenly distributed to the light emitting elements so that the light emitting elements uniformly emit light, the driving current may be focused on a specific light emitting element (e.g., a light emitting element having a lowest forward voltage drop (Vf)) due to a characteristic deviation (e.g., a Vf deviation attributable to a light emitting element) of the light emitting elements, whereby only the specific light emitting element may emit light.

One or more embodiments of the present disclosure are directed to a display device in which light emitting elements in each pixel may uniformly emit light.

In order to accomplish the above aspects of the present disclosure, a display device in accordance with one or more embodiments of the present disclosure may include: a first scan line; a first data line and a second data line; a first read-out line and a second read-out line; a first sub-pixel connected to the first scan line, the first data line, and the first read-out line; a second sub-pixel connected to the first scan line, the first data line, and the second read-out line; and a third sub-pixel connected to the first scan line, the second data line, and the first read-out line. Each of the first sub-pixel, the second sub-pixel, and the third sub-pixel may include at least one light emitting element.

In one or more embodiments, the display device may further include: a third read-out line; and a fourth sub-pixel connected to the first scan line, the second data line, and the third read-out line.

In one or more embodiments, the first sub-pixel may include a first light emitting element, a first transistor configured to transmit, to the first light emitting element, driving current corresponding to a first data signal received through the first data line in response to a first scan signal received through the first scan line, and a second transistor connected between one electrode of the first light emitting element and the first read-out line.

In one or more embodiments, the second sub-pixel may include a second light emitting element, a first transistor configured to transmit, to the second light emitting element, the driving current corresponding to the first data signal received through the first data line in response to the first scan signal received through the first scan line, and a second transistor connected between one electrode of the second light emitting element and the second read-out line. The second sub-pixel is configured to emit light having a color same as a color of light emitted from the first sub-pixel.

In one or more embodiments, the display device may further include a second scan line. The second transistor of each of the first sub-pixel and the second sub-pixel may include a gate electrode connected to the second scan line.

In one or more embodiments, the first data line, the second data line, the first read-out line, and the second read-out line may extend in a first direction. The second sub-pixel may be adjacent to the first sub-pixel in the first direction. The third sub-pixel may be adjacent to the first sub-pixel in a second direction. The second direction may be perpendicular to the first direction.

In one or more embodiments, a first distance between the first data line and the second data line may be less than a second distance between the first read-out line and the second read-out line.

In one or more embodiments, the display device may further include: a substrate; a pixel circuit layer on the substrate, and including the first data line, the second data line, the first scan line, the first read-out line, and the second read-out line; a first electrode on the pixel circuit layer; and second electrodes on the pixel circuit layer and facing the first electrode, and spaced from each other and electrically separated from each other. A first light emitting element of the first sub-pixel may be located between a first sub-electrode of the second electrodes and the first electrode. A second light emitting element of the second sub-pixel may be located between a second sub-electrode of the second electrodes and the first electrode.

In one or more embodiments, the first electrode may extend in the first direction. The second electrodes may extend in the first direction and be spaced from each other along the first direction.

In one or more embodiments, the display device may further include a bank on the pixel circuit layer. The first light emitting element of the first sub-pixel and the second light emitting element of the second sub-pixel may be in one emission area defined by the partition wall.

In one or more embodiments, the display device may further include a third electrode between the first sub-electrode and the first electrode, and spaced from the first sub-electrode and the first electrode. The first light emitting element may be located between two adjacent electrodes from among the first sub-electrode, the first electrode, and the third electrode.

In one or more embodiment, the display device may further include: a third read-out line; and a fourth sub-pixel connected to the first scan line, the first data line, and the third read-out line.

In one or more embodiments, the display device may further include: a third data line; and a fifth sub-pixel connected to the first scan line, the third data line, and the first read-out line.

In one or more embodiments, the display device may further include: a substrate; a pixel circuit layer on the substrate, and including the first data line, the second data line, the first scan line, the first read-out line, and the second read-out line; and a first sub-electrode and a second sub-electrode located in each of first area, second area, and third area on the pixel circuit layer and spaced from each other. A first light emitting element of the first sub-pixel may be located between the first sub-electrode and the second sub-electrode in the first area. A second light emitting element of the second sub-pixel may be located between the first sub-electrode and the second sub-electrode in the second area. A third light emitting element of the fourth sub-pixel may be located between the first sub-electrode and the second sub-electrode in the third area.

In one or more embodiments, in each of the first area, the second area, and the third area, one sub-electrode of the first sub-electrode and the second sub-electrode may have a circular planar shape, and another sub-electrode of the first sub-electrode and the second sub-electrode may have a shape enclosing a perimeter of the one sub-electrode of the first to the third areas.

In one or more embodiments, the first light emitting element, the second light emitting element, and the third light emitting element may be located between the first sub-electrode and the second sub-electrode along a circumferential direction with respect to the first sub-electrode in a corresponding area.

In order to accomplish an object of the present disclosure, a display device in accordance with embodiments of the present disclosure may include: a first scan line; a first data line; first to k-th read-out lines (here, k is an integer of 2 or more); and first sub-pixels connected to the first scan line and the first data line. A first sub-pixel of the first sub-pixels may be connected to the first read-out line. A k-th sub-pixel of the first sub-pixels may be connected to the k-th read-out line.

In one or more embodiments, the display device may further include: a second data line; a k+1-th read-out line; and second sub-pixels connected to the first scan line and the second data line. A first sub-pixel of the second sub-pixels may be connected to a second read-out line of the first to the k-th read-out lines. A k-th sub-pixel of the second sub-pixels may be connected to the k+1-th read-out line.

In one or more embodiments, the display device may further include: a second data line; and the second sub-pixels connected to the first scan line and the second data line. The first sub-pixel of the second sub-pixels may be connected to the first read-out line. The k-th sub-pixel of the second sub-pixels may be connected to the k-th read-out line.

In one or more embodiments, each of the first sub-pixel may include at least one light emitting element, a first transistor configured to transmit, to the at least one light emitting element, driving current corresponding to a first data signal received through the first data line in response to a first scan signal received through the first scan line, and a second transistor connected to one electrode of the at least one light emitting element and a corresponding read-out line of the first to the k-th read-out lines.

In a display device in accordance with one or more embodiments of the present disclosure, one pixel configured to emit light in response to one data signal is divided into sub-pixels (or unit pixels, or multiple domains) that may emit light independently from each other, so that the pixel may have a uniform light output distribution.

Furthermore, because the sub-pixels are connected to different read-out lines, characteristics of the sub-pixels (e.g., threshold voltages of a driving transistor) may be sensed independently from each other, and variation in characteristics of each of the sub-pixels may be more accurately compensated for.

Moreover, adjacent pixels share read-out lines, so that characteristics of the sub-pixels may be sensed without using additional read-out lines.

BRIEF DESCRIPTION OF THE DRAWINGS

FIG. 5 is a plan view illustrating a display device in accordance with one or more embodiments of the present disclosure.

DETAILED DESCRIPTION

Figure 1A:
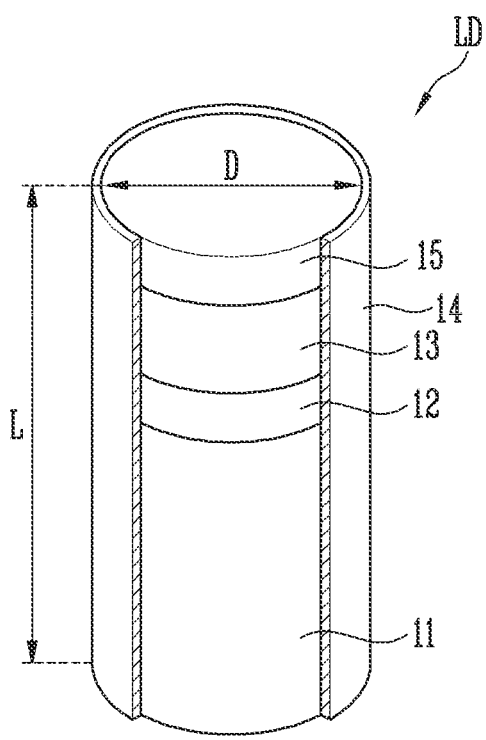
FIG. 1A is a diagram illustrating a cutaway view of a light emitting element in accordance with one or more embodiments of the present disclosure.

Reference will now be made in detail to various embodiments of the present disclosure, specific examples of which are illustrated in the accompanying drawings and described below, because the embodiments of the present disclosure can be variously modified in many different forms. However, the present disclosure is not limited to the following embodiments and may be modified into various forms.

Some elements that are not directly related to the features of the present disclosure in the drawings may be omitted to clearly explain the present disclosure. Furthermore, the sizes, ratios, etc. of some elements in the drawings may be slightly exaggerated. It should be noted that the same reference numerals are used to designate the same or similar elements throughout the drawings, and repetitive explanation will be omitted.

Figure 1B:
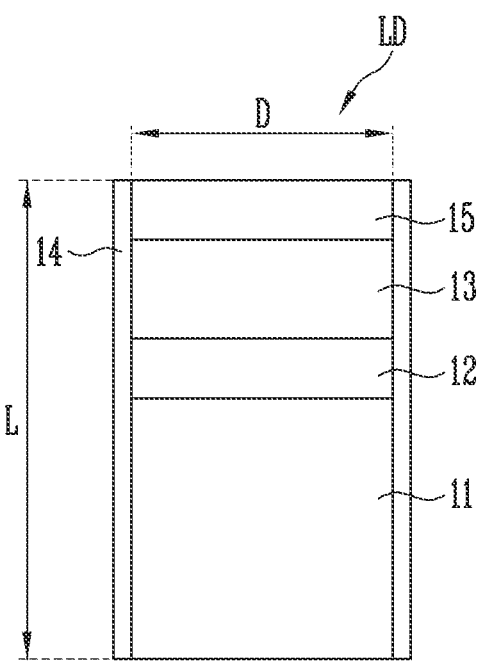
FIG. 1B is a sectional view of the light emitting element of FIG. 1A.
Figure 2A:
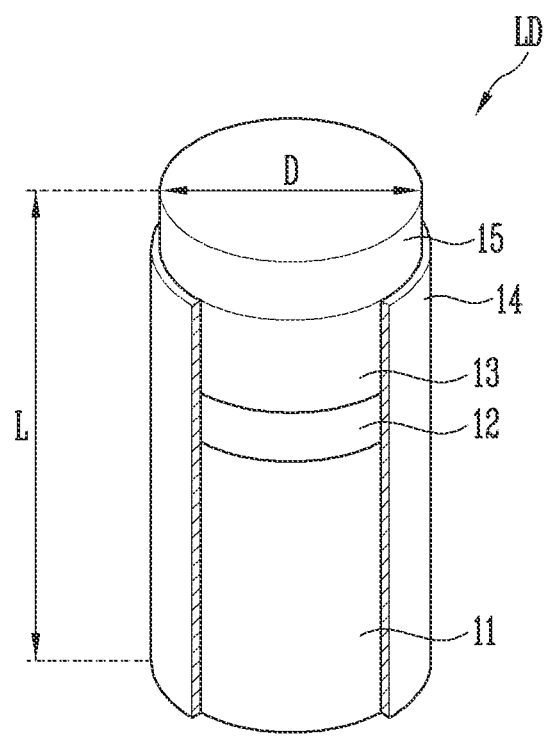
FIG. 2A is a diagram illustrating a cutaway view of a light emitting element in accordance with one or more embodiments of the present disclosure.
Figure 2B:
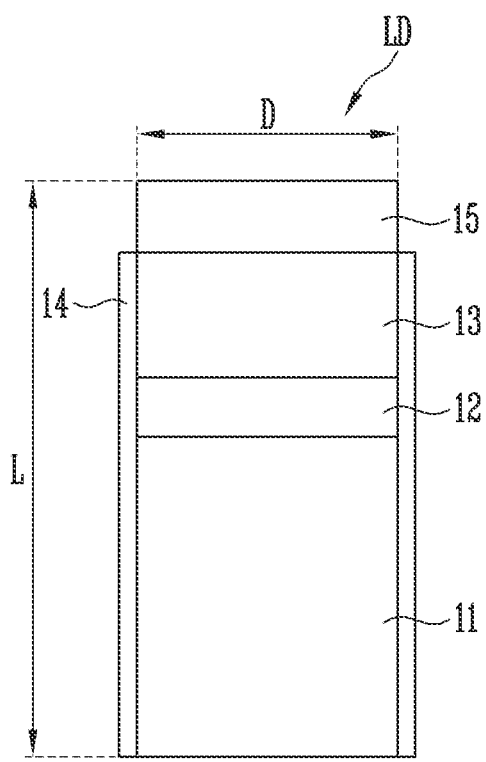
FIG. 2B is a sectional view of the light emitting element of FIG. 2A.
Figure 3A:
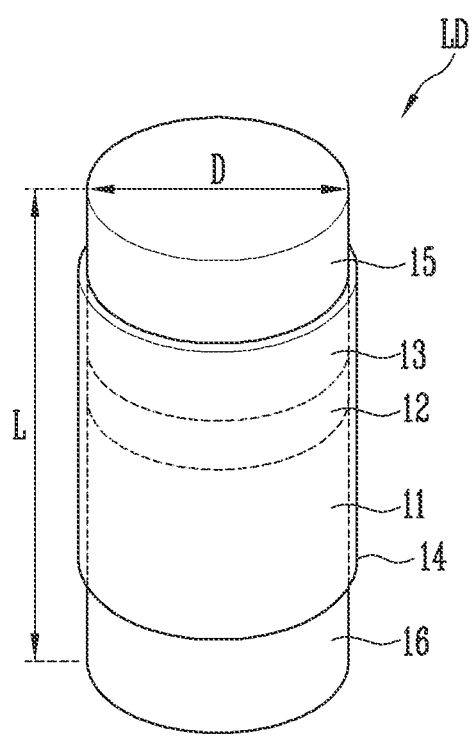
FIG. 3A is a diagram illustrating a light emitting element in accordance with one or more embodiments of the present disclosure.
Figure 3B:
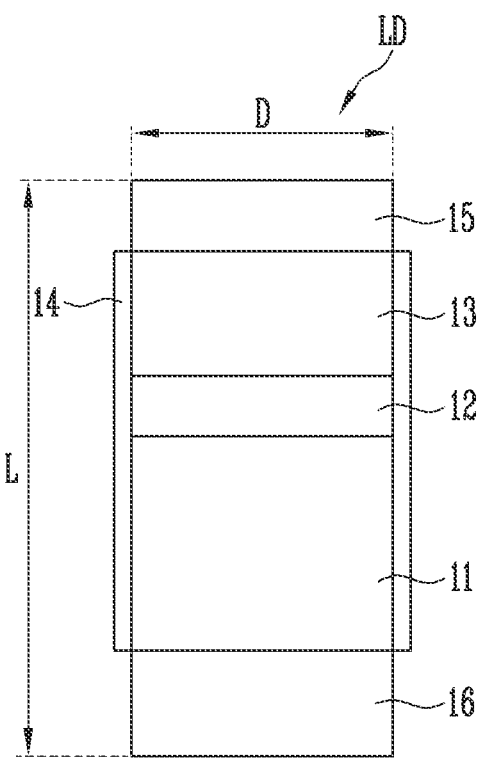
FIG. 3B is a sectional view of the light emitting element of FIG. 3A.
Figure 4A:
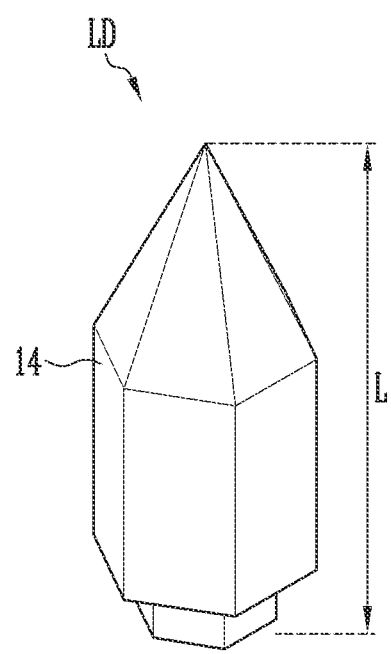
FIG. 4A is a diagram illustrating a light emitting element in accordance with one or more embodiments of the present disclosure.
Figure 4B:
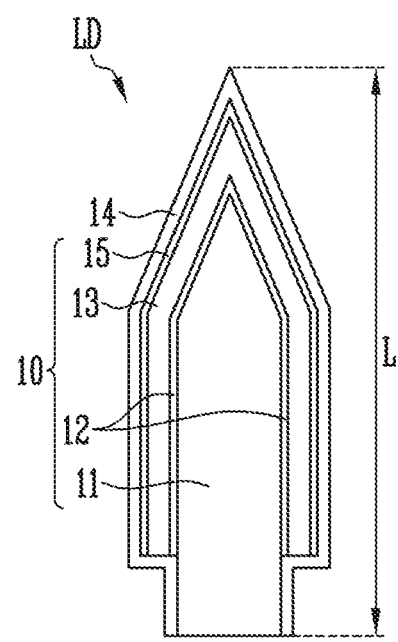
FIG. 4B is a sectional view of the light emitting element of FIG. 4A.

FIG. 1A is a diagram illustrating a cutaway view of a light emitting element in accordance with one or more embodiments of the present disclosure. FIG. 1B is a sectional view of the light emitting element of FIG. 1A. FIG. 2A is a diagram illustrating a cutaway view of a light emitting element in accordance with another embodiment of the present disclosure. FIG. 2B is a sectional view of the light emitting element of FIG. 2A. FIG. 3A is a diagram illustrating a light emitting element in accordance with one or more embodiments of the present disclosure. FIG. 3B is a sectional view of the light emitting element of FIG. 3A. FIG. 4A is a diagram illustrating a light emitting element in accordance with one or more embodiments of the present disclosure. FIG. 4B is a sectional view of the light emitting element of FIG. 4A.

A light emitting element fabricated by an etching method will be described with reference to FIGS. 1A, 1B, 2A, 2B, 3A, and 3B, and then a light emitting element fabricated by a growth method will be described with reference to FIGS. 4A and 4B. The type and/or shape of the light emitting element is not limited to the embodiments illustrated in FIGS. 1A, 1B, 2A, 2B, 3A, 3B, 4A, and 4B.

Referring to FIGS. 1A, 1B, 2A, 2B, 3A, and 3B, a light emitting element LD may include a first semiconductor layer 11, a second semiconductor layer 13, and an active layer 12 interposed between the first and second semiconductor layers 11 and 13. For example, the light emitting element LD may be implemented as an emission stack formed by successively stacking the first semiconductor layer 11, the active layer 12, and the second semiconductor layer 13.

In one or more embodiments, the light emitting element LD may have a shape extending in one direction. If an extension direction of the light emitting element LD is defined as a longitudinal direction, the light emitting element LD may have one end and a remaining end with respect to the extending direction. Any one semiconductor layer of the first and second semiconductor layers 11 and 13 may be disposed on the one end of the light emitting element LD, and the other one of the first and second semiconductor layers 11 and 13 may be disposed on the remaining end of the light emitting element LD.

The light emitting element LD may have various shapes. For example, the light emitting element LD may have a rod-like shape or a bar-like shape extending in the longitudinal direction (i.e., to have an aspect ratio greater than 1). For example, a length L of the light emitting element LD with respect to the longitudinal direction may be greater than a diameter D (or a width of a cross-section) thereof. The light emitting element LD may include a light emitting diode fabricated to have a subminiature size with a diameter D and/or a length L corresponding to the microscale or the nanoscale. The size of the light emitting element LD may be changed so as to meet requirements (or design conditions) of a lighting device or a self-light emissive display device to which the light emitting element LD is to be applied.

The first semiconductor layer 11 may include at least one n-type semiconductor layer. For instance, the first semiconductor layer 11 may include an n-type semiconductor layer that includes any one semiconductor material of InAlGaN, GaN, AlGaN, InGaN, AlN, and InN and is doped with a first conductive dopant such as Si, Ge, or Sn. However, the constituent material of the first semiconductor layer 11 is not limited to thereto, and various other materials may be used to form the first semiconductor layer 11.

The active layer 12 may be disposed on the first semiconductor layer 11 and have a single or multiple quantum well structure. The location of the active layer 12 may be changed in various ways depending on the type of the light emitting element LD. The active layer 12 may emit light having a wavelength ranging from 400 nm to 900 nm, and use a double heterostructure. A cladding layer doped with a conductive dopant may be formed over and/or under the active layer 12. For example, the cladding layer may be formed of an AlGaN layer or an InAlGaN layer. In one or more embodiments, a material such as AlGaN or AlInGaN may be used to form the active layer 12, and various other materials may be used to form the active layer 12.

If an electric field of a suitable voltage (e.g., a set or predetermined voltage) or more is applied to the opposite ends of the light emitting element LD, the light emitting element LD emits light by coupling of electron-hole pairs in the active layer 12. Because light emission of the light emitting element LD may be controlled based on the foregoing principle, the light emitting element LD may be used as a light source of various light emitting devices as well as a pixel of the display device.

The second semiconductor layer 13 may be disposed on the active layer 12 and include a semiconductor layer having a type different from that of the first semiconductor layer 11. The second semiconductor layer 13 may include at least one p-type semiconductor layer. For instance, the second semiconductor layer 13 may include a p-type semiconductor layer that includes at least one semiconductor material of InAlGaN, GaN, AlGaN, InGaN, AlN, and InN, and is doped with a second conductive dopant such as Mg. However, the material for forming the second semiconductor layer 13 is not limited thereto, and various other materials may be used to form the second semiconductor layer 13.

In one or more embodiments of the present disclosure, the first semiconductor layer 11 and the second semiconductor layer 13 may have different widths (or thicknesses) with respect to the longitudinal direction (L) of the light emitting element LD. For example, the first semiconductor layer 11 may have a relatively large width (or thickness) compared to that of the second semiconductor layer 13 with respect to the longitudinal direction (L) of the light emitting element LD.

Hence, as illustrated in FIGS. 1A to 3B, the active layer 12 of the light emitting element LD may be disposed at a position closer to an upper surface of the second semiconductor layer 13 than to a lower surface of the first semiconductor layer 11.

In one or more embodiments, the light emitting element LD may further include an additional electrode 15 disposed over the second semiconductor layer 13, as well as including the first semiconductor layer 11, the active layer 12, and the second semiconductor layer 13. In one or more embodiments, as shown in FIGS. 3A and 3B, the light emitting element LD may further include an additional electrode 16 disposed on one end of the first semiconductor layer 11.

Although each of the additional electrodes 15 and 16 may be an ohmic contact electrode, the present disclosure is not limited thereto, and it may be a Schottky contact electrode depending on embodiments. Furthermore, each of the additional electrodes 15 and 16 may include metal or metallic oxide. For example, chrome (Cr), titanium (Ti), aluminum (Al), gold (Au), nickel (Ni), ITO, and an oxide or alloy thereof may be used alone or in combination with each other. However, the present disclosure is not limited thereto.

Materials included in the respective additional electrodes 15 and 16 may be equal to or different from each other. The additional electrodes 15 and 16 may be transparent or semitransparent. Therefore, light generated from the light emitting element LD may pass through the additional electrodes 15 and 16 and then be emitted outside the light emitting element LD. In one or more embodiments, in case that light generated from the light emitting element LD is emitted outside the light emitting element LD through an area other than the opposite ends of the light emitting element LD rather than passing through the additional electrodes 15 and 16, the additional electrodes 15 and 16 may include opaque metal.

In one or more embodiments, the light emitting element LD may further include an insulating layer 14 around the outer surface (e.g., the outer peripheral or circumferential surface) of the light emitting element LD. However, in one or more embodiments, the insulating layer 14 may be omitted, or may be provided to cover only some of the first semiconductor layer 11, the active layer 12, and the second semiconductor layer 13.

The insulating layer 14 may prevent the active layer 12 from short-circuiting due to making contact with a conductive material except the first semiconductor 11 layer and the second semiconductor layer 13. Furthermore, because of the insulating layer 14, occurrence of a defect on the surface of the light emitting element LD may be reduced or minimized, whereby the lifetime and efficiency of the light emitting element LD may be improved. In case that a plurality of light emitting elements LD are disposed in close contact with each other, the insulating layer 14 may prevent an undesired short-circuit from occurring between the light emitting elements LD. It is not limited whether the insulating layer 14 is provided, so long as the active layer 12 can be prevented from short-circuiting with external conductive material.

As illustrated in FIGS. 1A and 1B, the insulating layer 14 may be provided in a shape enclosing an overall outer surface (e.g., an overall outer peripheral or circumferential surface) of the emission stack including the first semiconductor layer 11, the active layer 12, the second semiconductor layer 13, and the additional electrode 15. For the sake of explanation, FIG. 1A illustrates the insulating layer 14 a portion of which has been removed. The first semiconductor layer 11, the active layer 12, the second semiconductor layer 13, and the additional electrode 15 that are included in the light emitting element LD may be enclosed by the insulating layer 14.

Although in the above-mentioned embodiment the insulating layer 14 has been described as enclosing the overall outer surface (e.g., the overall outer peripheral or circumferential surface) of each of the first semiconductor layer 11, the active layer 12, the second semiconductor layer 13, and the additional electrode 15, the present disclosure is not limited thereto.

In one or more embodiments, as illustrated in FIGS. 2A and 2B, the insulating layer 14 may enclose the respective outer surfaces (e.g., outer peripheral or circumferential surfaces) of the first semiconductor layer 11, the active layer 12, and the second semiconductor layer 13, and may not enclose the entirety of the outer surface (e.g., outer peripheral or circumferential surface) of the additional electrode 15 disposed on the second semiconductor layer 13 or may enclose only a portion of the outer surface (e.g., outer peripheral or circumferential surface) of the additional electrode 15 without enclosing the other portion of the outer surface (e.g., outer peripheral or circumferential surface) of the additional electrode 15. Here, the insulating layer 14 may allow at least the opposite ends of the light emitting element LD to be exposed to the outside. For example, the insulating layer 14 may allow not only the additional electrode 15 disposed on one end of the second semiconductor layer 13 but also one end of the first semiconductor layer 11 to be exposed to the outside. In one or more embodiments, as illustrated in FIGS. 3A and 3B, in case that the additional electrodes 15 and 16 are disposed on the respective opposite ends of the light emitting element LD, the insulating layer 14 may allow at least one area of each of the additional electrodes 15 and 16 to be exposed to the outside. Alternatively, in one or more embodiments, the insulating layer 14 may not be provided.

In one or more embodiments of the present disclosure, the insulating layer 14 may include transparent insulating material. For example, the insulating layer 14 may include at least one insulating material selected from the group consisting of $SiO_2$, $Si_3N_4$, $Al_2O_3$, and $TiO_2$, but it is not limited thereto. Various materials having insulating properties may be employed.

If the insulating layer 14 is provided on the light emitting element LD, the active layer 12 may be prevented from short-circuiting with a first and/or second electrode, which is not illustrated. Furthermore, because of the insulating layer 14, occurrence of a defect on the surface of the light emitting element LD may be reduced or minimized, whereby the lifetime and efficiency of the light emitting element LD may be improved. In case that a plurality of light emitting elements LD are disposed in close contact with each other, the insulating layer 14 may prevent an undesired short-circuit from occurring between the light emitting elements LD.

The light emitting element LD may be employed as a light source for various display devices. The light emitting element LD may be fabricated through a surface treatment process. For example, the light emitting element LD may be surface-treated so that, when a plurality of light emitting elements LD are mixed with a fluidic solution (or solvent) and then supplied to each emission area (e.g., an emission area of each pixel or an emission area of each sub-pixel), the light emitting elements LD can be evenly distributed rather than unevenly aggregating in the solution.

A light emitting device including the light emitting element LD described above may be used in various devices including a display device that requires a light source. For instance, in case that a plurality of light emitting elements LD are disposed in the emission area of each pixel of a display panel, the light emitting elements LD may be used as a light source of the pixel. However, the application field of the light emitting element LD is not limited to the above-mentioned examples. For example, the light emitting element LD may also be used in other types of devices such as a lighting device, which requires a light source.

Next, a light emitting element LD fabricated by the growth method will be described with reference to FIGS. 4A and 4B.

The following description of the light emitting element LD fabricated by the growth method will be focused on differences from the above-mentioned embodiments, and components of the light emitting element LD that are not separately explained in the following description may comply with that of the preceding embodiments. The same reference numerals will be used to designate the same components, and similar reference numerals will be used to designate similar components.

Referring to FIGS. 4A and 4B, the light emitting element LD in accordance with one or more embodiments of the present disclosure may include a first semiconductor layer 11, a second semiconductor layer 13, and an active layer 12 interposed between the first and second semiconductor layers 11 and 13. In one or more embodiments, the light emitting element LD may include an emission pattern 10 having a core-shell structure. The emission pattern 10 may include a first semiconductor layer 11 disposed in a central portion of the light emitting element LD, an active layer 12 enclosing at least one side of the first semiconductor layer 11, a second semiconductor layer 13 enclosing at least one side of the active layer 12, and an additional electrode 15 enclosing at least one side of the second semiconductor layer 13.

The light emitting element LD may be formed in a polypyramid shape extending in one direction. For example, the light emitting element LD may have a hexagonal pyramid shape. If the extension direction of the light emitting element LD is defined as a longitudinal direction (L), the light emitting element LD may have one end (or a lower end) and a remaining end (or an upper end) with respect to the longitudinal direction (L). A portion of any one semiconductor layer of the first and second semiconductor layers 11 and 13 on the one end (or the lower end) of the light emitting element LD may be exposed to the outside. In one or more embodiments, portion of the other semiconductor layer of the first and second semiconductor layers 11 and 13 on the remaining end (or the upper end) of the light emitting element LD may be exposed to the outside. For example, in one or more embodiments, a portion of the first semiconductor layer 11 on the one end (or the lower end) of the light emitting element LD may be exposed, and a portion of the second semiconductor layer 13 on the remaining end (or the upper end) of the light emitting element LD may be exposed. In this case, if the light emitting element LD is used as a light source of a display device, the exposed portion of the first semiconductor layer 11 may contact one driving electrode of driving electrodes configured to drive the light emitting element LD, and the exposed portion of the second semiconductor layer 13 may contact a remaining driving electrode.

In one or more embodiments, in case that the light emitting element LD includes the additional electrode 15, a portion of the additional electrode 15 that encloses at least one side of the second semiconductor layer 13 on the remaining end (or the upper end) of the light emitting element LD may be exposed. In this case, if the light emitting element LD is used as the light source of the display device, the exposed portion of the additional electrode 15 may contact the remaining driving electrode and may be electrically connected to one electrode.

In one or more embodiments, the first semiconductor layer 11 may be disposed in a core, i.e., a central (or middle) portion, of the light emitting element LD. The light emitting element LD may have a shape corresponding to the shape of the first semiconductor layer 11. For instance, if the first semiconductor layer 11 has a hexagonal pyramid shape, the light emitting element LD and the emission pattern 10 each may also have a hexagonal pyramid shape.

The active layer 12 may be provided and/or formed in a shape enclosing the outer surface (e.g., outer peripheral or circumferential surface) of the first semiconductor layer 11 in the longitudinal direction of the light emitting element LD. In detail, the active layer 12 may be provided and/or formed in a shape enclosing an area of the first semiconductor layer 11, other than a lower end of the opposite ends of the first semiconductor layer 11, in the longitudinal direction of the light emitting element LD.

The second semiconductor layer 13 may be provided and/or formed in a shape enclosing the active layer 12 in the longitudinal direction (L) of the light emitting element LD, and may include a semiconductor layer having a type different from that of the first semiconductor layer 11. For example, the second semiconductor layer 13 may include at least one p-type semiconductor layer.

In one or more embodiments, the light emitting element LD may include the additional electrode 15 that encloses at least one side of the second semiconductor layer 13. The additional electrode 15 may be an ohmic contact electrode or a Schottky contact electrode that is electrically connected to the second semiconductor layer 13, but the present disclosure is not limited thereto.

As described above, the light emitting element LD may have a hexagonal pyramid shape with the opposite ends protruding outward, and may be implemented as the emission pattern 10 with a core-shell structure including the first semiconductor layer 11 provided in the central portion thereof, the active layer 12 that encloses the first semiconductor layer 11, the second semiconductor layer 13 that encloses the active layer 12, and the additional electrode 15 that encloses the second semiconductor layer 13. The first semiconductor layer 11 may be disposed on the one end (or the lower end) of the light emitting element LD having a hexagonal pyramid shape, and the additional electrode 15 may be disposed on the remaining end (or the upper end) of the light emitting element LD.

In one or more embodiments, the light emitting element LD may further include an insulating layer 14 provided on the outer surface (e.g., the outer peripheral or circumferential surface) of the emission pattern 10 having a core-shell structure. The insulating layer 14 may include transparent insulating material.

FIG. 5 is a plan view illustrating a display device in accordance with one or more embodiments of the present disclosure. In one or more embodiments, FIG. 5 illustrates a display device, particularly, a display panel PNL provided in the display device, as an example of a device which may use, as a light source, the light emitting element LD described with reference to FIGS. 1A to 4B. In accordance with the described embodiment, FIG. 5 simply illustrates the structure of the display panel PNL, focused on a display area DA. In one or more embodiments, although not illustrated, at least one driving circuit component (e.g., at least one of a scan driver and a data driver) and/or a plurality of lines may be further disposed on the display panel PNL.

Referring to FIG. 5, the display panel PNL may include a base layer SUB (or a substrate), and a pixel PXL disposed on the base layer SUB. In detail, the display panel PNL and the base layer SUB may include a display area DA configured to display an image, and a non-display area NDA other than the display area DA.

In one or more embodiments, the display area DA may be disposed in a central area of the display panel PNL, and the non-display area NDA may be disposed along a border of the display panel PNL in such a way as to enclose the display area DA along the edge or periphery of the display area DA. The locations of the display area DA and the non-display area NDA are not limited to the foregoing examples, and the locations thereof may be changed.

The base layer SUB may form a base of the display panel PNL. For example, the base layer SUB may form a base of a lower panel (e.g., a lower plate of the display panel PNL).

In one or more embodiments, the base layer SUB may be a rigid or flexible substrate, and the material or properties thereof are not particularly limited. For example, the base layer SUB may be a rigid substrate made of glass or reinforced glass, or a flexible substrate formed of a thin film made of plastic or metal. Furthermore, the base layer SUB may be a transparent substrate, but it is not limited thereto. For instance, the base layer SUB may be a translucent substrate, an opaque substrate, or a reflective substrate.

An area on the base layer SUB is defined as the display area DA in which the pixels PXL are disposed, and the other area thereof is defined as the non-display area NDA. For example, the base layer SUB may include the display area DA including a plurality of pixel areas on which the pixels PXL are formed, and the non-display area NDA disposed around the display area DA. Various lines and/or internal circuits that are connected to the pixels PXL of the display area DA may be disposed in the non-display area NDA.

The pixel PXL may include at least one light emitting element LD, e.g., at least one rod-type light emitting diode according to any one of embodiments shown in FIGS. 1A to 4B, which is driven by a corresponding scan signal and a corresponding data signal. For example, the pixel PXL may include a plurality of rod-type light emitting diodes, each of which has a small size ranging from the nanoscale to the microscale, and which are connected parallel to each other. The plurality of rod-type light emitting diodes may form a light source of the pixel PXL.

Furthermore, the pixel PXL may include a plurality of sub-pixels. For example, the pixel PXL may include a first sub-pixel SPX1, a second sub-pixel SPX2, and a third sub-pixel SPX3. In one or more embodiments, the first, second, and third sub-pixels SPX1, SPX2, and SPX3 may emit different colors of light. For instance, the first sub-pixel SPX1 may be a red sub-pixel configured to emit red light, the second sub-pixel SPX2 may be a green sub-pixel configured to emit green light, and the third sub-pixel SPX3 may be a blue sub-pixel configured to emit blue light. However, the colors, types and/or number of sub-pixels forming each pixel PXL are not particularly limited. For example, the color of light that is emitted from each sub-pixel may be changed in various ways. Although in FIG. 5 there is illustrated an embodiment where the pixels PXL are arranged in the display area DA in a stripe or a PENTILE® arrangement structure, but the present disclosure is not limited thereto. This PENTILE® arrangement structure may be referred to as an RGBG matrix structure (e.g., a PENTILE® matrix structure or an RGBG structure (e.g., a PENTILE® structure)). PENTILE® is a registered trademark of Samsung Display Co., Ltd., Republic of Korea. For example, the pixels PX may be arranged in various pixel array forms that are known.

In one or more embodiments, each of the sub-pixels SPX1, SPX2, and SPX3 may include a plurality of unit pixels. In other words, each of the sub-pixels SPX1, SPX2, and SPX3 may be formed of multiple domains.

Figure 6A:
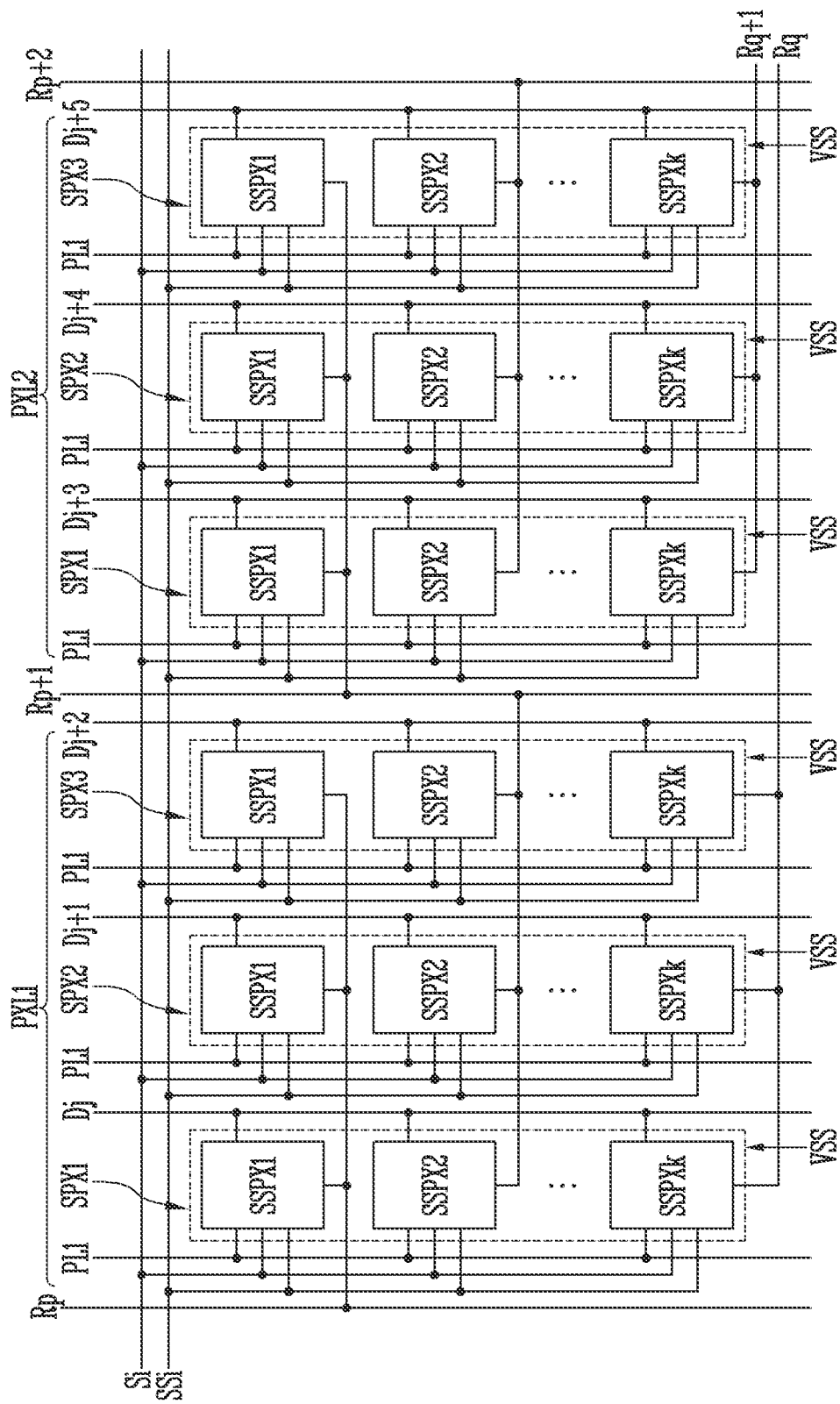
FIG. 6A is a circuit diagram illustrating an example of the display device of FIG. 5.
Figure 6B:
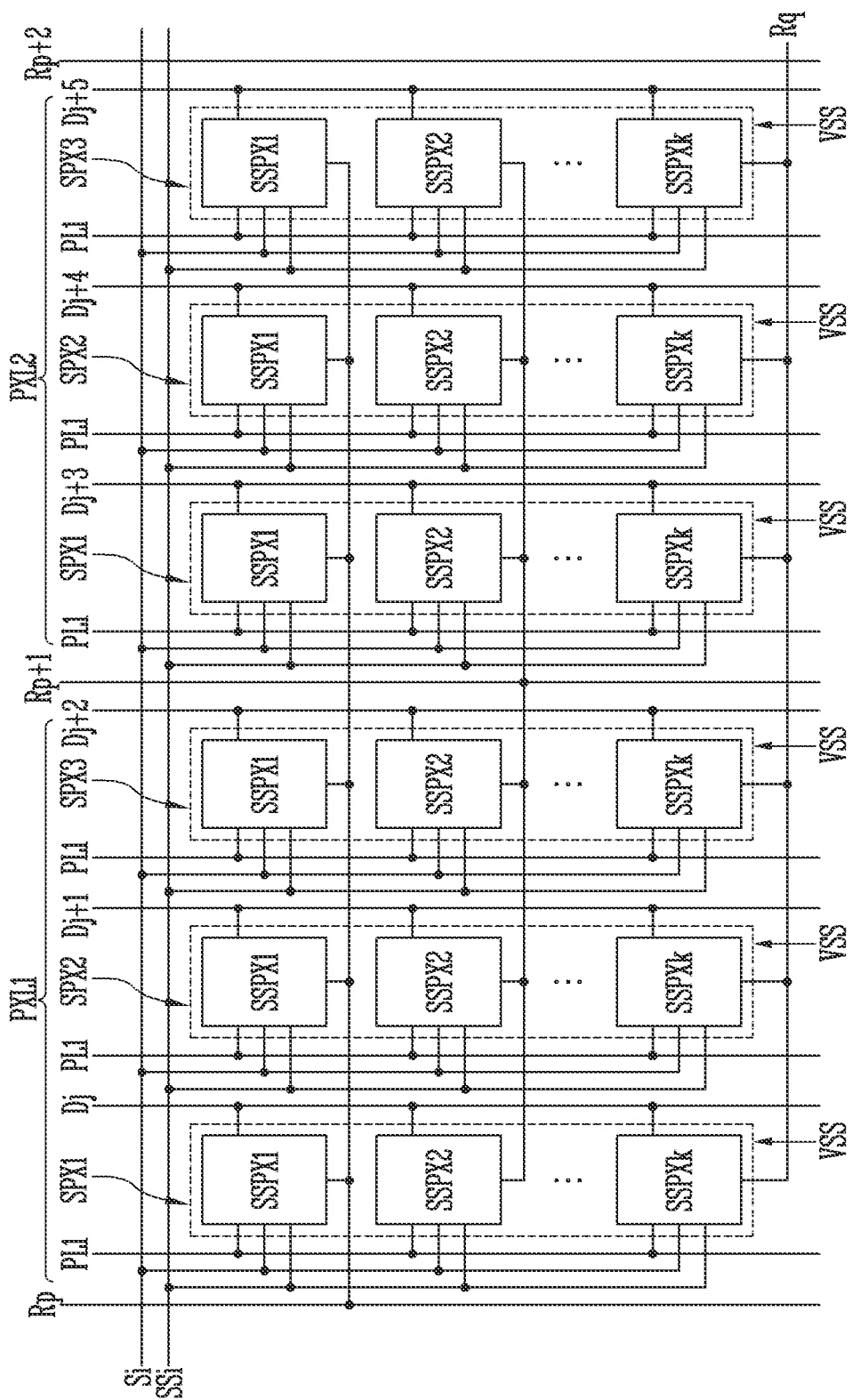
FIG. 6B is a circuit diagram illustrating an example of the display device of FIG. 5.

FIG. 6A is a circuit diagram illustrating an example of the display device of FIG. 5. FIG. 6B is a circuit diagram illustrating an example of the display device of FIG. 5. FIGS. 6A and 6B each simply illustrate a display device, focused on a first pixel PXL1 and a second pixel PXL2. Each of the first pixel PXL1 and the second pixel PXL2 may be substantially the same as the pixel PXL included in the display device of FIG. 5.

Referring to FIG. 6A, the display device may include an i-th scan line Si (here, i is a positive integer), a sensing line SSi (or a sensing control line), read-out lines Rp to Rp+2 (here, p is a positive integer), a first power line PL1, data lines Dj to Dj+5 (here, j is a positive integer), and first and second pixels PXL1 and PXL2. The first and second pixels PXL1 and PXL2 may be respectively provided in pixels areas partitioned by the scan line Si and the read-out lines Rp to Rp+2. A separation distance between the read-out lines Rp to Rp+2 may be greater than a separation distance between the data lines Dj to Dj+5. The number of read-out lines Rp to Rp+2 provided in a unit area may be less than the number of data lines Dj to Dj+5.

The first pixel PXL1 may include a first sub-pixel SPX1, a second sub-pixel SPX2, and a third sub-pixel SPX3 described with reference to FIG. 4a. The first to third sub-pixels SPX1, SPX2, and SPX3 may be substantially the same as each other, except the fact that the first to third sub-pixels SPX1, SPX2, and SPX3 are respectively connected to the corresponding data lines Dj, Dj+1, and Dj+2. Therefore, the first to third sub-pixels SPX1, SPX2, and SPX3 will be comprehensively described, based on the first sub-pixel SPX1.

The first to third sub-pixels SPX1, SPX2, and SPX3 of the first pixel PXL1 may be respectively disposed in areas partitioned by an i-th scan line Si (and a scan line adjacent thereto) and the data lines Dj, Dj+1, and Dj+2. For example, the second sub-pixel SPX2 may be disposed in an area defined by the i-th scan lines Si and the j-th and j+1-th data lines Dj and Dj+1. However, the arrangement of the first to third sub-pixels SPX1, SPX2, and SPX3 is not limited thereto.

Figure 7:
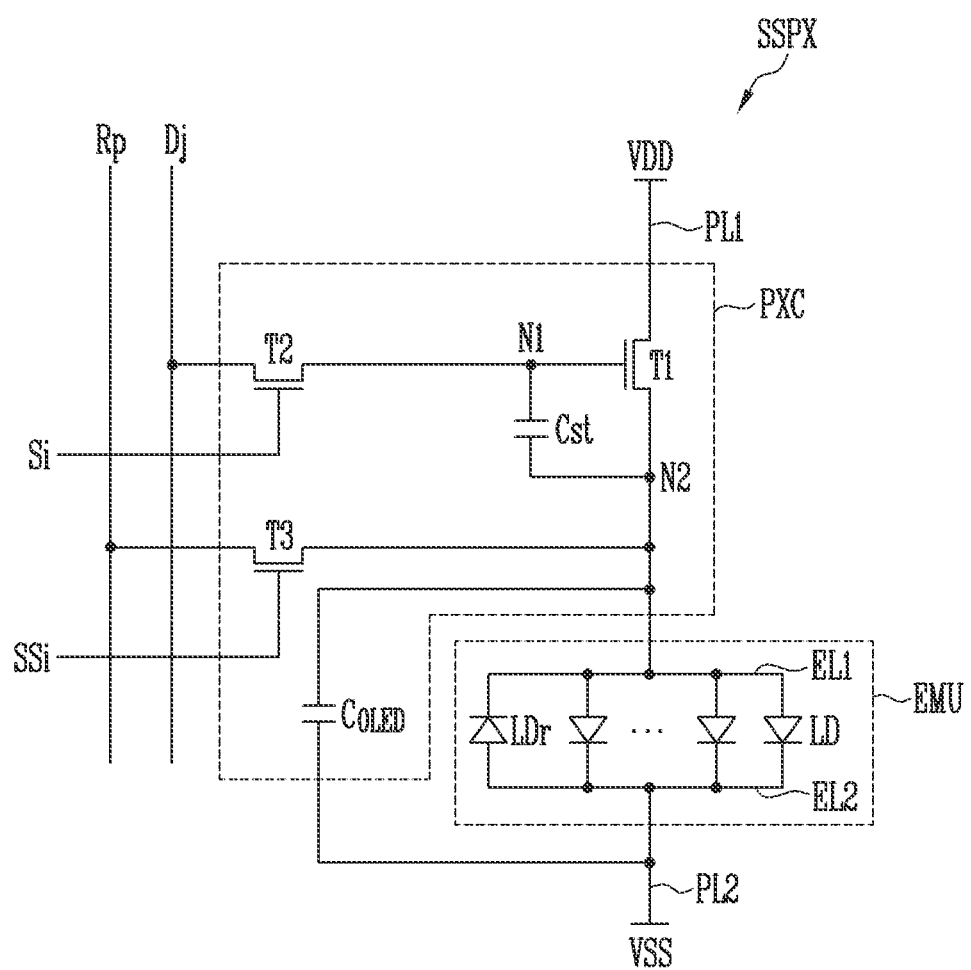
FIG. 7 is a circuit diagram illustrating an example of a unit pixel included in the display device of FIG. 6A.

The first sub-pixel SPX1 of the first pixel PXL1 may be connected to the i-th scan line Si and the j-th data line Dj, and connected to the first power line PL1 and a second power line PL2 (refer to FIG. 7). Here, a first power supply VDD (refer to FIG. 7) (or a first power voltage) may be applied to the first power line PL1. A second power supply VSS (or a second power voltage) may be applied to the second power line. The first power line PL1 and the second power line each may be a common line connected to a plurality of sub-pixels. The first and second power supplies VDD and VSS may have different potentials to allow the first sub-pixel SPX1 to emit light. The first power supply VDD may have a voltage level higher than that of the second power supply VSS.

In one or more embodiments, each of the unit pixels SSPX1 to SSPXk (or the sub-pixels SPX1 to SPX3) may be formed of an active pixel. However, the types, structures, and/or driving schemes of the unit pixels capable of being applied to the display device according to the present disclosure are not particularly limited. For example, the unit pixel may be formed of a pixel of the display device having various passive or active structures that are known.

In one or more embodiments, the first sub-pixel SPX1 of the first pixel PXL1 may include a plurality of unit pixels SSPX1 to SSPXk (here, k is an integer of 2 or more).

Each of the unit pixel SSPX1 to SSPXk may be connected to the scan line Si and one of the data lines Dj, Dj+1, and Dj+2, and also may be connected to the first power line PL1 and the second power line. Each of the unit pixels SSPX1 to SSPXk may emit light having a luminance corresponding to a data signal transmitted through the corresponding data line Dj, Dj+1, or Dj+2, in response to a scan signal transmitted through the scan line Si. The unit pixels SSPX1 to SSPXk may include substantially the same pixel structure or pixel circuit.

In other words, the first sub-pixel SPX1 of the first pixel PXL1 may include unit pixels SSPX1 to SSPXk that emit light independently from each other, in response to one scan signal and one data signal.

For reference, in case that the first sub-pixel SPX1 includes a plurality of light emitting elements (i.e., the light emitting elements LD described with reference to FIGS. 1A to 4B), driving current may be focused on a specific light emitting element of the light emitting elements depending on characteristic deviations and disposition positions of the light emitting elements, so that the emission efficiency of the first sub-pixel SPX1 may be reduced. In case that the first sub-pixel SPX1 includes unit pixels SSPX1 to SSPXk, driving current may be prevented from being focused on a specific light emitting element, and the emission efficiency of the first sub-pixel SPX1 may be enhanced.

In one or more embodiments, in the first sub-pixel SPX1 of the first pixel PXL1, the first unit pixel SSPX1 may be connected to a p-th read-out line Rp, the second unit pixel SSPX2 may be connected to a p+1-th read-out line Rp+1, and the k-th unit pixel SSPXk may be connected to a q-th read-out line Rq. Here, q may be k−1.

Although will be described with reference to FIG. 8, in case that the first to k-th unit pixels SSPX1 to SSPXk of the first sub-pixel SPX1 are connected different read-out lines, characteristics of the first to k-th unit pixels SSPX1 to SSPXk of the first sub-pixel SPX1 (e.g., mobilities, threshold voltages, etc. of driving transistors respectively provided in the first to k-th unit pixels SSPX1 to SSPXk) may be independently and concurrently (e.g., simultaneously) sensed. A configuration provided to sense the characteristics of the first to k-th unit pixels SSPX1 to SSPXk of the first sub-pixel SPX1 will be described with reference to FIGS. 8 and 9.

Likewise, in the second sub-pixel SPX2 of the first pixel PXL1, the first unit pixel SSPX1 may be connected to the p-th read-out line Rp, the second unit pixel SSPX2 may be connected to the p+1-th read-out line Rp+1, and the k-th unit pixel SSPXk may be connected to the q-th read-out line Rq. In the third sub-pixel SPX3 of the first pixel PXL1, the first unit pixel SSPX1 may be connected to the p-th read-out line Rp, the second unit pixel SSPX2 may be connected to the p+1-th read-out line Rp+1, and the k-th unit pixel SSPXk may be connected to the q-th read-out line Rq.

As illustrated in FIG. 6A, in each of the first to third sub-pixels SPX1, SPX2, and SPX3 of the second pixel PXL2, the first unit pixel SSPX1 may be connected to the p+1-th read-out line Rp+1, the second unit pixel SSPX2 may be connected to a p+2-th read-out line Rp+2, and the k-th unit pixel SSPXk may be connected to a q+1-th read-out line Rq+1. However, the second pixel PXL2 is not limited thereto.

As illustrated in FIG. 6B, in each of the first to third sub-pixels SPX1, SPX2, and SPX3 of the second pixel PXL2, the first unit pixel SSPX1 may be connected to the p-th read-out line Rp, the second unit pixel SSPX2 may be connected to the p+1-th read-out line Rp+1, and the k-th unit pixel SSPXk may be connected to the q-th read-out line Rq. In other words, the first to third sub-pixels SPX1, SPX2, and SPX3 of the second pixel PXL2 may be connected to the read-out lines Rp, Rp+1, and Rq, in a manner similar to that of the first to third sub-pixels SPX1, SPX2, and SPX3 of the first pixel PXL1.

As described with reference to FIGS. 6A and 6B, a sub-pixel (e.g., the first sub-pixel SPX1) connected to one scan line (e.g., the i-th scan line Si) and one data line (e.g., the j-th data line Dj) may include a plurality of unit pixels SSPX1 to SSPXk, or may be divided into the unit pixels SSPX1 to SSPXk. The unit pixels SSPX1 to SSPXk may be connected to different read-out lines (e.g., the p-th to p+2-th read-out lines Rp to Rp+2 and the q-th read-out line Rq). Therefore, the emission efficiency of the sub-pixel and display quality of the display device including the sub-pixel may be improved.

FIG. 7 is a circuit diagram illustrating an example of the unit pixel included in the display device of FIG. 6A. Because the first to k-th unit pixels SSPX1 to SSPXk illustrated in FIG. 6A are substantially the same as each other, a unit pixel SSPX will be described as a representative example embracing the first to k-th unit pixels SSPX1 to SSPXk.

Referring to FIG. 7, the unit pixel SSPX may include an emission unit EMU and a pixel circuit PXC.

The emission unit EMU may include a plurality of light emitting elements LD connected in parallel to each other between the first power line PL1 and the second power line PL2. Here, the first power supply VDD may be applied to the first power line PL1. The second power supply VSS may be applied to the second power line PL2.

The emission unit EMU may include a first electrode EL1 (or a first alignment electrode) connected to the first power supply VDD via the pixel circuit PXC and the first power line PL1, a second electrode EL2 (or a second alignment electrode) connected to the second power supply VSS through the second power line PL2, and a plurality of light emitting elements LD connected in parallel to each other in the same direction between the first and second electrodes EL1 and EL2. For example, the first electrode EL1 may be an anode electrode, and the second electrode EL2 may be a cathode electrode.

Each of the light emitting elements LD included in the emission unit EMU may include a first end connected to the first power supply VDD by the first electrode EL1, and a second end connected to the second power supply VSS by the second electrode EL2. The first power supply VDD may be set to a high-potential power supply, and the second power supply VSS may be set to a low-potential power supply. Here, a difference in potential between the first and second power supplies VDD and VSS may be set to a value equal to or greater than a threshold voltage of the light emitting elements LD during an emission period of the unit pixel SSPX.

As described above, each of the light emitting elements LD that are connected in parallel to each other in the same direction (e.g., in a forward direction) between the first electrode EL1 and the second electrode EL2 to which voltages having different potentials are respectively supplied may form a valid light source.

The light emitting elements LD of the emission unit EMU may emit light having a luminance corresponding to driving current supplied thereto through the pixel circuit PXC. For example, during each frame period, the pixel circuit PXC may supply driving current corresponding to a gray scale value of corresponding frame data to the emission unit EMU. The driving current supplied to the emission unit EMU may be divided into the light emitting elements LD connected to each other in the same direction. Hence, each of the light emitting elements LD may emit light having a luminance corresponding to current applied thereto, so that the emission unit EMU may emit light having a luminance corresponding to the driving current.

Although FIG. 7 illustrates an embodiment in which the light emitting elements LD are connected to each other in the same direction between the first and second power supplies VDD and VSS, the present disclosure is not limited thereto. In one or more embodiments, the emission unit EMU may further include at least one invalid light source, as well as including the light emitting elements LD that form the respective valid light sources. For example, at least a reverse light emitting element LDr may be further connected between the first and second electrodes EL1 and EL2 of the emission unit EMU. The reverse light emitting element LDr, along with the light emitting elements LD that form the valid light sources, may be connected in parallel to each other between the first and second electrodes EL1 and EL2, and may be connected between the first and second electrodes EL1 and EL2 in a direction opposite to that of the light emitting elements LD. Even when a suitable driving voltage (e.g., a set or predetermined driving voltage, e.g., a normal directional driving voltage) is applied between the first and second electrodes EL1 and EL2, the reverse light emitting element LDr remains disabled. Hence, current may not substantially flow through the reverse light emitting element LDr.

The pixel circuit PXC may include first to third transistors T1, T2, and T3, and a storage capacitor Cst.

A first electrode of the first transistor (T1; e.g., a driving transistor) may be connected (or coupled) to the first power line PL1, a second electrode thereof may be connected to a second node N2, and a gate electrode thereof may be connected to a first node N1. For example, the first electrode may be a source electrode, and the second electrode may be a drain electrode. The first transistor T1 may control the amount of driving current to be supplied to the light emitting elements LD in response to the voltage of the first node N1.

A first electrode of the second transistor (T2; e.g., a switching transistor) may be connected to the j-th data line Dj, a second electrode thereof may be connected to the first node N1, and a gate electrode thereof may be connected to the i-th scan line Si. When a scan signal having a voltage (e.g., a high-level voltage) capable of turning on the second transistor T2 is supplied from the i-th scan line Si, the second transistor T2 is turned on to electrically connect the j-th data line Dj with the first node N1. Here, the j-th data line Dj may be supplied with a data signal of a corresponding frame, so that the data signal may be transmitted to the first node N1. The data signal transmitted to the first node N1 may be charged to the storage capacitor Cst.

One electrode of the storage capacitor Cst may be connected to the first node N1, and a remaining electrode thereof may be connected to the second node N2. The storage capacitor Cst may be charged with a voltage corresponding to a data signal supplied to the first node N1, and maintain the charged voltage until a data signal of a subsequent frame is supplied.

A first electrode of the third transistor T3 may be connected to the p-th read-out line Rp, a second electrode thereof may be connected to the second node N2, and a gate electrode thereof may be connected to the sensing line SSi. The third transistor T3 may be turned on by a control signal having a gate-on voltage (e.g., a high level) supplied to the sensing line SSi during a sensing period so that the p-th read-out line Rp and the second node N2 may be electrically connected to each other.

In one or more embodiments, the sensing period may be a period in which characteristic information (e.g., the threshold voltage, etc. of the first transistor T1) of the unit pixel SSPX (or each of the sub-pixels SPX1 to SPX3 (refer to FIGS. 5 and 6A)) disposed in the display area DA (e.g., a threshold voltage, etc. of the first transistor T1) is extracted. During the sensing period, the first transistor T1 may be turned on by supplying a suitable reference voltage (e.g., a set or predetermined reference voltage) capable of turning on the first transistor T1 to the first node N1 through the j-th data line Dj and the second transistor T2, or connecting each unit pixel SSPX to a current source or the like. Furthermore, the third transistor T3 may be turned on by supplying a control signal having a gate-on voltage to the third transistor T3, so that the first transistor T1 may be connected to the p-th read-out line Rp. Hence, the characteristic information of the unit pixel SSPX that includes the threshold voltage, etc. of the first transistor T1 may be extracted through the p-th read-out line Rp. The extracted characteristic information may be used to convert image data to compensate for a deviation in characteristics between unit pixels SSPX.

Although FIG. 7 illustrates an embodiment where all of the first to third transistors T1 to T3 are N-type transistors, the present disclosure is not limited thereto. For example, at least one of the first to third transistors T1 to T3 may be changed to a P-type transistor.

Although FIG. 7 illustrates an embodiment in which all of the light emitting elements LD that form each emission unit EMU are connected in parallel to each other, the present disclosure is not limited thereto. In one or more embodiments, the emission unit EMU may include at least one serial set including a plurality of light emitting elements LD connected in parallel to each other. In other words, the emission unit EMU may be formed of a serial/parallel combination structure. This will be described later with reference to FIG. 19. In one or more embodiments, a capacitor $C_{OLED}$ may be connected between the first and second electrodes EL1 and EL2 of the emission unit EMU.

Figure 8:
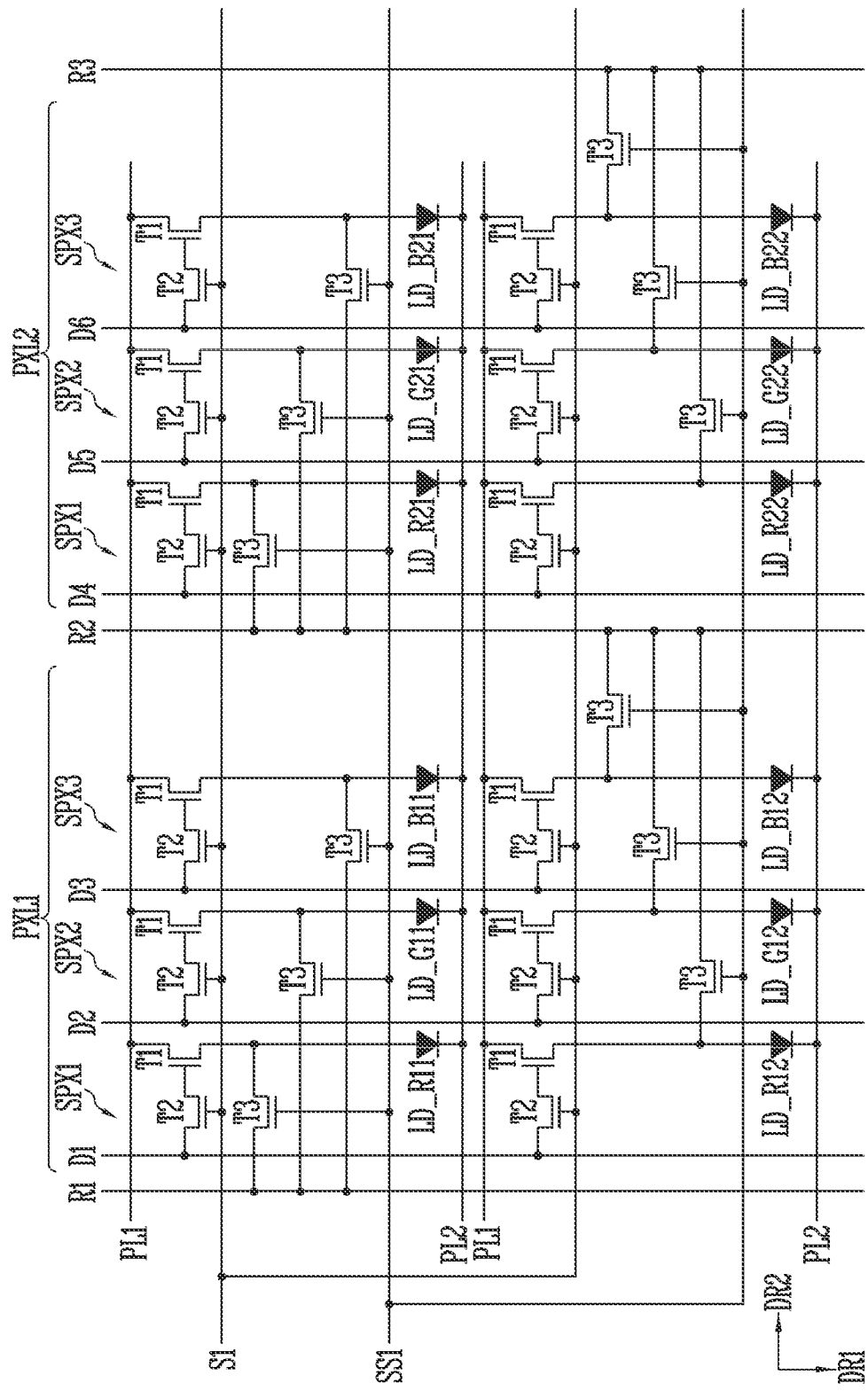
FIG. 8 is a circuit diagram illustrating an example of the display device of FIG. 6A.

FIG. 8 is a circuit diagram illustrating an example of the display device of FIG. 6A. FIG. 8 illustrates the case where each of the sub-pixels SPX1 to SPX3 of FIG. 6A includes first and second unit-pixels SSPX1 and SSPX2 (in other words, the case of k=2). Because a circuit configuration of each of the first and second unit pixels SSPX1 and SSPX2 is substantially the same as the circuit configuration of the unit pixel SSPX described with reference to FIG. 7, repetitive explanation thereof will be omitted.

Referring to FIG. 8, in the first pixel PXL1, the first and second unit pixels SSPX1 and SSPX2 of the first sub-pixel SPX1 may include first color light emitting elements LD_R11 and LD_R12. Each of the first color light emitting elements LD_R11 and LD_R12 may be substantially the same as the emission unit EMU described with reference to FIG. 7, may include light emitting elements LD (refer to FIG. 7) connected in parallel to each other, and may emit light having a first color (e.g., red). In the first sub-pixel SPX1, a second transistor T2 of the first unit pixel SSPX1 may be connected to a first data line D1, and a third transistor T3 of the first unit pixel SSPX1 may be connected to a first read-out line R1. Likewise, in the first sub-pixel SPX1, a second transistor T2 of the second unit pixel SSPX2 may be connected to the first data line D1, and a third transistor T3 of the second unit pixel SSPX2 may be connected to a second read-out line R2.

In the first pixel PXL1, the first and second unit pixels SSPX1 and SSPX2 of the second sub-pixel SPX2 may include second color light emitting elements LD_G11 and LD_G12. Each of the second color light emitting elements LD_G11 and LD_G12 may emit light having a second color (e.g., green). In the second sub-pixel SPX2, a second transistor T2 of the first unit pixel SSPX1 may be connected to a second data line D2, and a third transistor T3 of the first unit pixel SSPX1 may be connected to the first read-out line R1. Likewise, in the second sub-pixel SPX2, a second transistor T2 of the second unit pixel SSPX2 may be connected to the second data line D2, and a third transistor T3 of the second unit pixel SSPX2 may be connected to the second read-out line R2.

In the first pixel PXL1, the first and second unit pixels SSPX1 and SSPX2 of the third sub-pixel SPX3 may include third color light emitting elements LD_B11 and LD_B12. Each of the third color light emitting elements LD_B11 and LD_B12 may emit light having a third color (e.g., blue). In the third sub-pixel SPX3, a second transistor T2 of the first unit pixel SSPX1 may be connected to a third data line D3, and a third transistor T3 of the first unit pixel SSPX1 may be connected to a first read-out line R1. Likewise, in the third sub-pixel SPX3, a second transistor T2 of the second unit pixel SSPX2 may be connected to the third data line D3, and a third transistor T3 of the second unit pixel SSPX2 may be connected to the second read-out line R2.

Likewise, in the second pixel PXL2, the first and second unit pixels SSPX1 and SSPX2 of the first sub-pixel SPX1 may include first color light emitting elements LD_R21 and LD_R22, the first and second unit pixels SSPX1 and SSPX2 of the second sub-pixel SPX2 may include second color light emitting elements LD_G21 and LD_G22, and the first and second unit pixels SSPX1 and SSPX2 of the third sub-pixel SPX3 may include third color light emitting elements LD_B21 and LD_B22. In the first sub-pixel SPX1, a second transistor T2 of the first unit pixel SSPX1 may be connected to a fourth data line D4, and a third transistor T3 of the first unit pixel SSPX1 may be connected to the second read-out line R2. Likewise, in the first sub-pixel SPX1, a second transistor T2 of the second unit pixel SSPX2 may be connected to a fourth data line D4, and a third transistor T3 of the second unit pixel SSPX2 may be connected to a third read-out line R3. In the second sub-pixel SPX2, a second transistor T2 of the first unit pixel SSPX1 may be connected to the fifth data line D5, a third transistor T3 of the first unit pixel SSPX1 may be connected to the second read-out line R2, a second transistor T2 of the second unit pixel SSPX2 may be connected to the fifth data line D5, and a third transistor T3 of the second unit pixel SSPX2 may be connected to the third read-out line R3. In the third sub-pixel SPX3, a second transistor T2 of the first unit pixel SSPX1 may be connected to a sixth data line D6, a third transistor T3 of the first unit pixel SSPX1 may be connected to the second read-out line R2, a second transistor T2 of the second unit pixel SSPX2 may be connected to the sixth data line D6, and a third transistor T3 of the second unit pixel SSPX2 may be connected to the third read-out line R3.

In other words, the second unit pixels in the first pixel PXL1 and the first unit pixels in the second pixel PXL2 may share the second read-out line R2.

Operations of the first pixel PXL1 and the second pixel PXL2 during a sensing period may be described with reference to FIG. 9.

Figure 9:
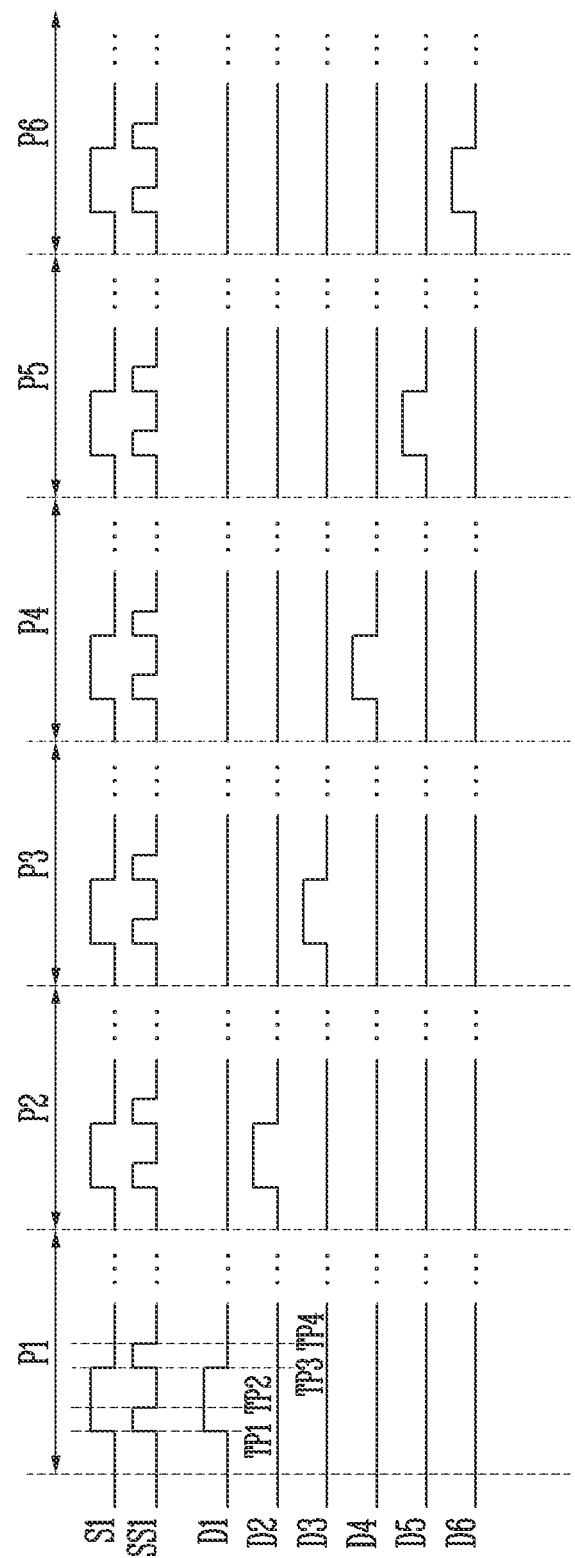
FIG. 9 is a waveform diagram for describing a sensing operation of the display device of FIG. 8.

FIG. 9 is a waveform diagram for describing a sensing operation of the display device of FIG. 8.

Referring to FIGS. 8 and 9, a sensing period may include first to sixth sections P1 to P6.

At a first time point TP1 of the first section P1, a first scan signal having a logical high level (or a gate-on voltage) may be applied to a first scan line S1, and a first control signal (or a first sensing control signal) having a logical high level (or a gate-on voltage) may be applied to a first sensing line SS1. Furthermore, a test voltage having a specific voltage level (e.g., a data voltage corresponding to a maximum gray scale value) may be applied to the first data line D1. A reference voltage (e.g., a data voltage corresponding to a minimum gray scale value) may be applied to each of second to sixth data lines D2 to D6.

In this case, a voltage corresponding to the test voltage may be stored in the storage capacitor Cst of each of the first and second unit pixels SSPX1 and SSPX2 of the first sub-pixel SPX1 in the first pixel PXL1 illustrated in FIG. 8.

At a second time point TP2, the first control signal applied to the first sensing line SS1 may make a transition to a gate-off voltage. In this case, the threshold voltage of the first transistor T1 may be reflected in the voltage stored in the storage capacitor Cst.

Thereafter, at a third time point TP3, the first scan signal applied to the first scan line S1 may make a transition to a gate-off voltage. The first control signal applied to the first sensing line SS1 may make a transition to the gate-on voltage. In this case, during a section between the third time point TP3 and the fourth time point TP4, first driving current corresponding to the voltage stored in the storage capacitor Cst (i.e., the voltage in which the threshold voltage of the first transistor T1 has been reflected) may flow from the first unit pixel SSPX1 of the first sub-pixel SPX1 in the first pixel PXL1 to an external device (e.g., an external sensing driver) through the first read-out line R1. Because the first driving current varies depending on variation in characteristics (e.g., the threshold voltage and the mobility) of the first transistor T1, the characteristics of the first unit pixel SSPX1 (or the first transistor T1) may be sensed based on the driving current measured through the first read-out line R1.

Likewise, second driving current corresponding to the voltage stored in the storage capacitor Cst may flow from the second unit pixel SSPX2 of the first sub-pixel SPX1 in the first pixel PXL1 to an external device through the second read-out line R2, so that variation in characteristics of the second unit pixel SSPX2 (or the first transistor T1) may be computed.

In other words, in the first section P1, characteristics of the first and second unit pixels SSPX1 and SSPX2 of the first sub-pixel SPX1 in the first pixel PXL1 may be sensed independently from each other.

In the second section P2, a test voltage having a specific voltage level may be applied to the second data line D2, and characteristics of each of the first and second unit pixels SSPX1 and SSPX2 of the second sub-pixel SPX2 in the first pixel PXL1 may be sensed. In the third section P3, a test voltage having a specific voltage level may be applied to the third data line D3, and characteristics of each of the first and second unit pixels SSPX1 and SSPX2 of the third sub-pixel SPX3 in the first pixel PXL1 may be sensed.

Likewise, in the fourth section P4 to the sixth section P6, test voltages each having a specific voltage level may be sequentially applied to the fourth data line D4 to the sixth data line D6, so that characteristics of the first and second unit pixels SSPX1 and SSPX2 of the first sub-pixel SPX1 in the second pixel PXL2, characteristics of the first and second unit pixels SSPX1 and SSPX2 of the second sub-pixel SPX2 in the second pixel PXL2, and characteristics of the first and second unit pixels SSP1 and SSP2 of the third sub-pixel SPX3 in the second pixel PXL2 each may be sensed.

As described with reference to FIGS. 8 and 9, unit pixels (e.g., the first and second unit pixels SSPX1 and SSPX2) included in one sub-pixel (e.g., the first sub-pixel SPX1) may be connected to different read-out lines (e.g., the first and second read-out lines R1 and R2), so that characteristics of the unit pixels may be sensed independently from each other. Furthermore, because adjacent sub-pixels (e.g., the first and second sub-pixels SPX1 and SPX2 share read-out lines (e.g., the second read-out line R2), characteristics of the unit pixels each may be sensed without an increase in the number of read-out lines.

Although in FIG. 9 there has been described an example where the characteristics of the first transistor T1 in the unit pixels are sensed, the present disclosure is not limited thereto. The threshold voltage of the first transistor T1 and the characteristics (e.g., the degree of degradation) of the light emitting element may be sensed by a typical external compensation method (i.e., by using a scan signal and a control signal corresponding to the external compensation method).

Figure 10:
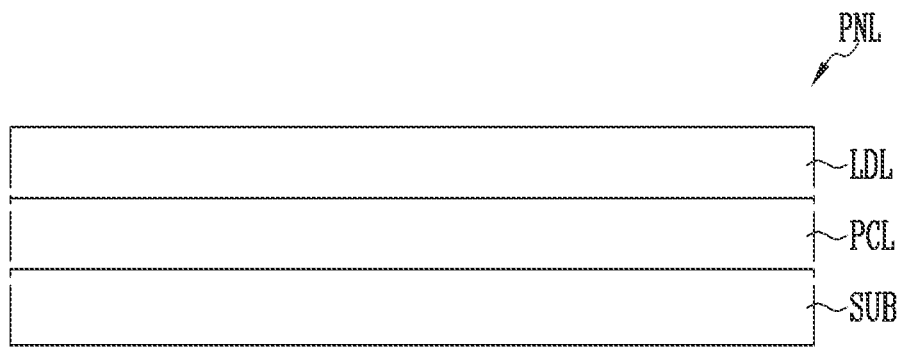
FIG. 10 is a sectional view illustrating an example of the display device of FIG. 5.

FIG. 10 is a sectional view illustrating an example of the display device of FIG. 5. FIG. 10 illustrates the display panel PNL provided in the display device.

Referring to FIG. 10, the display panel PNL may include a base layer SUB, a pixel circuit layer PCL, and a light emitting element layer LDL.

The base layer SUB may be made of insulating material such as glass or resin. The base layer SUB may be made of material having flexibility so as to be bendable or foldable, and have a single layer or multilayer structure.

For instance, examples of the material having flexibility may include at least one of the following: polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate. However, the constituent material of the base layer SUB is not limited thereto. For example, the base layer SUB may be formed of fiber glass reinforce plastic (FRP), etc.

The pixel circuit layer PCL may be disposed on the base layer SUB, and include the transistors T1, T2, and T3, the storage capacitor Cst, and the lines Si, SSi, Dj, Rp, PL1, and PL2 that are described with reference to FIG. 7.

The light emitting element layer LDL may be disposed on the pixel circuit layer PCL, and include the emission unit EMU described with reference to FIG. 7.

In one or more embodiments, the display panel PNL may further include a light conversion layer. The light conversion layer may be disposed on the light emitting element layer LDL, and include light conversion particles provided to convert a specific color (or a specific wavelength) of light to a different color of light, and a color filter configured to allow a specific color of light to selectively pass therethrough.

Figure 11:
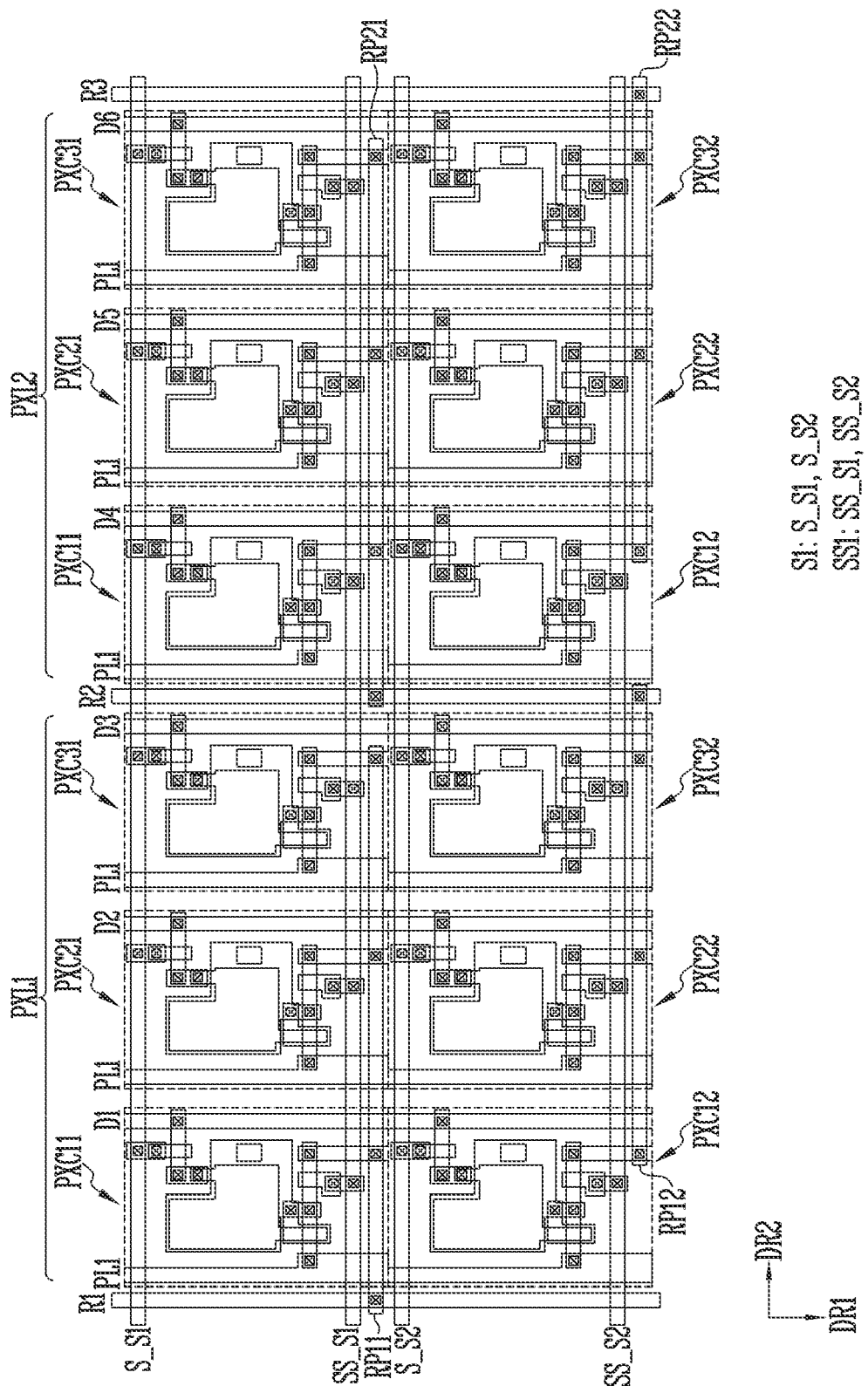
FIG. 11 is a plan view illustrating an example of a pixel circuit layer included in the display device of FIG. 10.
Figure 12:
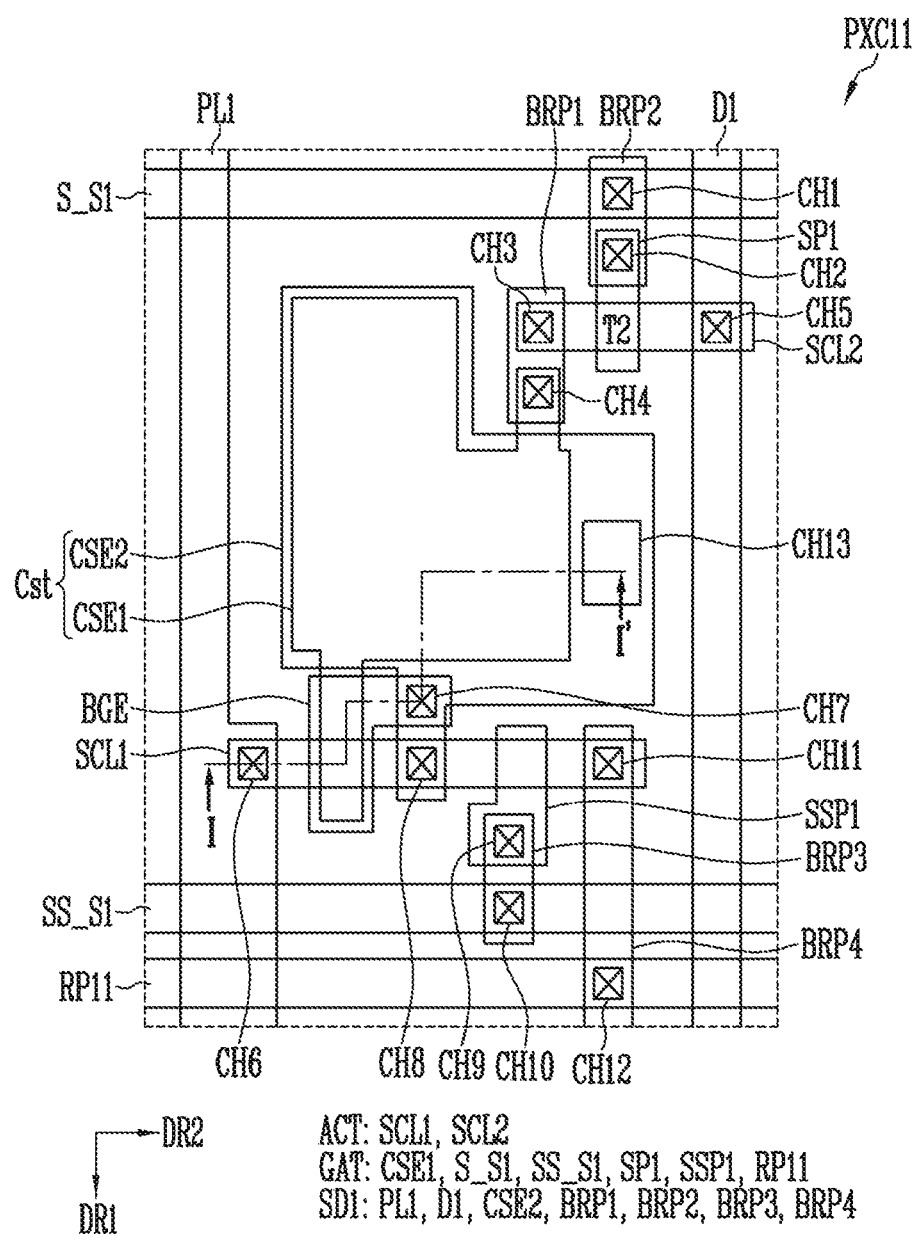
FIG. 12 is a plan view illustrating an enlargement of a pixel circuit included in the pixel circuit layer of FIG. 11.
Figure 13:
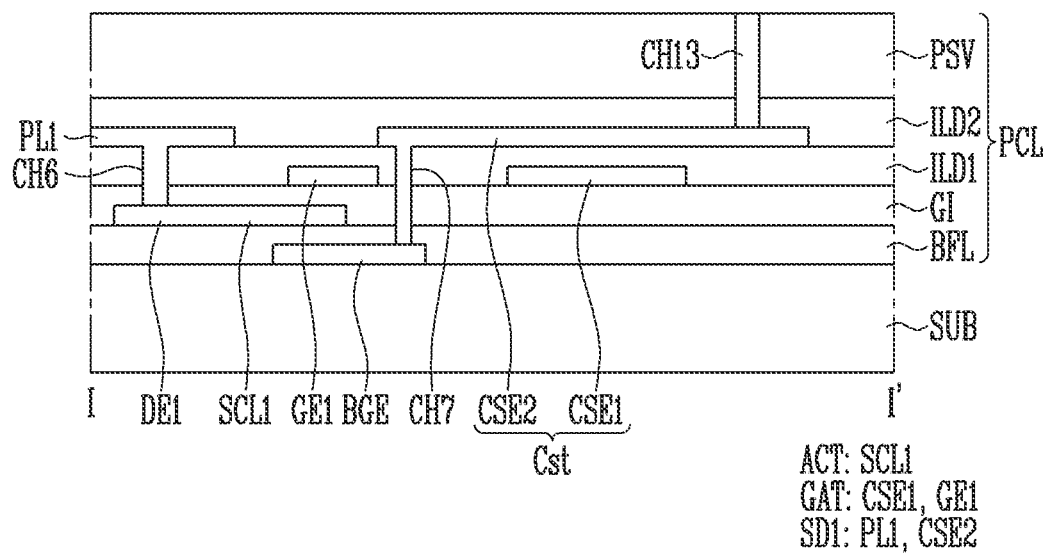
FIG. 13 is a sectional view taken along the line I-I' of FIG. 12.

FIG. 11 is a plan view illustrating an example of the pixel circuit layer included in the display device of FIG. 10. FIG. 11 illustrates a pixel circuit layer corresponding to that of FIG. 8. FIG. 12 is a plan view illustrating an enlargement of a pixel circuit included in the pixel circuit layer of FIG. 11. FIG. 13 is a sectional view taken along the line I-I' of FIG. 12.

Referring to FIGS. 8 and 11, the first pixel PXL1 (or a first pixel area) may include a 11-th pixel circuit PXC11 (or a 11-th pixel circuit area), a 12-th pixel circuit PXC12, a 21-th pixel circuit PXC21, a 22-th pixel circuit PXC22, a 31-th pixel circuit PXC31, and a 32-th pixel circuit PXC32. The 11-th pixel circuit PXC11 may include circuit elements that form the first unit pixel SSPX1 (refer to FIG. 8) of the first sub-pixel in the first pixel PXL1. Likewise, the 12-th pixel circuit PXC12 may include circuit elements that form the second unit pixel SSPX2 (refer to FIG. 8) of the first sub-pixel in the first pixel PXL1. The 21-th pixel circuit PXC21, the 22-th pixel circuit PXC22, the 31-th pixel circuit PXC31, and the 32-th pixel circuit PXC32 may include circuit elements that form the first and second unit pixels of the second sub-pixel in the first pixel PXL1, and the first and second unit pixels of the third sub-pixel, respectively. The second pixel PXL2 is substantially identical or similar to that of the first pixel PXL1, so that repetitive explanation thereof will be omitted.

The 11-th pixel circuit PXC11, the 21-th pixel circuit PXC21, and the 31-th pixel circuit PXC31 in the first pixel PXL1 may be connected to a first sub-scan line S_S1, a first sub-sensing line SS_S1, and a 11-th read-out pattern RP11. The 12-th pixel circuit PXC12, the 22-th pixel circuit PXC22, and the 32-th pixel circuit PXC32 in the first pixel PXL1 may be connected to a second sub-scan line S_S2, a second sub-sensing line SS_S2, and a 12-th read-out pattern RP12. Here, the first sub-scan line S_S1 and the second sub-scan line S_S2 may be included in the first scan line S1 described with reference to FIG. 8 and may be connected to each other. The first sub-sensing line SS_S1 and the second sub-sensing line SS_S2 may be included in the first sensing line SS1 described with reference to FIG. 8 and may be connected to each other. The 11-th read-out pattern RP11 may be connected to the first read-out line R1 described with reference to FIG. 8. The 12-th read-out pattern RP12 may be connected to the second read-out line R2 described with reference to FIG. 8.

Likewise, the 11-th pixel circuit PXC11, the 21-th pixel circuit PXC21, and the 31-th pixel circuit PXC31 in the second pixel PXL2 may be connected to the first sub-scan line S_S1, the first sub-sensing line SS_S1, and a 21-th read-out pattern RP21. The 12-th pixel circuit PXC12, the 22-th pixel circuit PXC22, and the 32-th pixel circuit PXC32 in the second pixel PXL2 may be connected to a second sub-scan line S_S2, a second sub-sensing line SS_S2, and a 22-th read-out pattern RP22. The 21-th read-out pattern RP21 may be connected to the second read-out line R2 described with reference to FIG. 8. The 22-th read-out pattern RP22 may be connected to the third read-out line R3 described with reference to FIG. 8

The 11-th pixel circuit PXC11, the 12-th pixel circuit PXC12, the 21-th pixel circuit PXC21, the 22-th pixel circuit PXC22, the 31-th pixel circuit PXC31, and the 32-th pixel circuit PXC32 are substantially identical or similar to each other. Therefore, hereinafter, the 11-th pixel circuit PXC11 will be described as a representative example embracing the 11-th pixel circuit PXC11, the 12-th pixel circuit PXC12, the 21-th pixel circuit PXC21, the 22-th pixel circuit PXC22, the 31-th pixel circuit PXC31, and the 32-th pixel circuit PXC32.

Referring to FIGS. 12 and 13, the pixel circuit layer PCL may include a buffer layer BFL, a semiconductor layer ACT, a first insulating layer GI, a first conductive layer GAT, a second insulating layer ILD1, a second conductive layer SD1, a third insulating layer ILD2, and a passivation layer PSV. Referring to FIG. 13, the buffer layer BFL, the semiconductor layer ACT, the first insulating layer GI, the first conductive layer GAT, the second insulating layer ILD1, the second conductive layer SD1, the third insulating layer ILD2, and the passivation layer PSV may be successively stacked on the base layer SUB.

The buffer layer BFL may be disposed on the overall surface of the base layer SUB. The buffer layer BFL may prevent impurity ions from being diffused, prevent penetration of water or outside air, and perform a surface planarization function. The buffer layer BFL may include silicon nitride, silicon oxide, silicon oxynitride, or the like. The buffer layer BFL may be omitted depending on the type of the base layer SUB, processing conditions, or the like.

In one or more embodiments, a back gate electrode BGE may be disposed between the base layer SUB and the buffer layer BFL. The back gate electrode BGE may form one electrode of the first transistor T1.

The semiconductor layer ACT may be disposed on the buffer layer BFL (or the base layer SUB). The semiconductor layer ACT may be an active layer that forms a channel of a transistor TR. The semiconductor layer ACT may include a source area and a drain area that respectively contact a first transistor electrode (e.g., a source electrode) and a second transistor electrode (e.g., a drain electrode), which will be described below. An area between the source area and the drain area may be a channel area.

The semiconductor layer ACT may include a first semiconductor pattern SCL1 and a second semiconductor pattern SCL2. The first semiconductor pattern SCL1 may be disposed, in a plan view, under a unit pixel area in which the 11-th pixel circuit PXC11 is formed, and form a channel of the first transistor T1 and a channel of the third transistor T3.

The second semiconductor pattern SCL2 may be spaced from the first semiconductor pattern SCL1, may be disposed at an upper side of the unit pixel area, and form a channel of the second transistor T2.

The semiconductor layer ACT may include an oxide semiconductor. The channel area of the semiconductor layer ACT may be an undoped semiconductor pattern, which is an intrinsic semiconductor. Each of the source area and the drain area may be a semiconductor pattern doped with a dopant. An n-type dopant may be used as the dopant.

The first insulating layer GI (or a gate insulating layer) may be disposed on the semiconductor layer ACT and the buffer layer BFL (or the base layer SUB). The first insulating layer GI may be disposed over an approximately overall surface of the base layer SUB. The first insulating layer GI may be a gate insulating layer having a gate insulating function.

The first insulating layer GI may include inorganic insulating material such as a silicon compound or metal oxide. For example, the first insulating layer GI may include silicon oxide, silicon nitride, silicon oxynitride, aluminum oxide, tantalum oxide, hafnium oxide, zirconium oxide, titanium oxide, or a combination thereof. The first insulating layer GI may have a single layer structure or a multilayer structure including stacked layers formed of different materials.

The first conductive layer GAT may be disposed on the first insulating layer GI. The first conductive layer GAT may include a first capacitor electrode CSE1, a first sub-scan line S_S1, a first scan pattern SP1 (or a scan conductive pattern), a first sub-sensing line SS_S1, a first sensing pattern SSP1 (or a sensing conductive pattern), and a 11-th read-out pattern RP11 (and a first read-out line R1).

As illustrated in FIG. 12, the first capacitor electrode CSE1 may be disposed between the first semiconductor pattern SCL1 and the second semiconductor pattern SCL2, and generally disposed in a central portion of the unit pixel area.

A portion of the first capacitor electrode CSE1 may protrude in a first direction DR1, and overlap the first semiconductor pattern SCL1 (or a portion of the first semiconductor pattern SCL1 that forms the first transistor T1). The portion of the first capacitor electrode CSE1 may form the gate electrode of the first transistor T1.

The first sub-scan line S_S1 may extend in a second direction DR2, and extend to other unit pixel areas. The first sub-scan line S_S1 may be disposed at the uppermost side of the unit pixel area, in a plan view.

The first scan pattern SP1 may be disposed to overlap the second semiconductor pattern SCL2, and may form the gate electrode of the second transistor T2. The first scan pattern SP1 may be connected to the first sub-scan line S_S1 by a second bridge pattern BRP2 of the second conductive layer SD1 which will be described below. However, the present disclosure is not limited thereto. The first scan pattern SP1 may protrude from the first sub-scan line S_S1, and may be integrally formed with the first sub-scan line S_S1.

The first sub-sensing line SS_S1 may extend in the second direction DR2, and extend to other unit pixel areas. The first sub-sensing line SS_S1 may be disposed between the first semiconductor pattern SCL1 and the 11-th read-out pattern RP11, in a plan view.

The first sensing pattern SSP1 may be disposed to overlap the first semiconductor pattern SCL1 (or a portion of the first semiconductor pattern SCL1 that forms the third transistor T3). The first sensing pattern SSP1 may be connected to the first sensing line SS_S1 by a third bridge pattern BRP3 of the second conductive layer SD1 which will be described below. However, the present disclosure is not limited thereto. In one or more embodiments, the first sensing pattern SSP1 may protrude from the first sub-sensing line SS_S1, and may be integrally formed with the first sub-sensing line SS_S1.

The 11-th read-out pattern RP11 may extend in the second direction DR2. As illustrated in FIG. 11, the 11-th read-out pattern RP11 may be disposed over three pixel circuits PXC11, PXC21, and PXC31. The 11-th read-out pattern RP11 may be disposed under the first sub-sensing line SS_S1, in a plan view, but the present disclosure is not limited thereto.

The first conductive layer GAT may include one or more metals selected from among molybdenum (Mo), aluminum (Al), platinum (Pt), palladium (Pd), silver (Ag), magnesium (Mg), gold (Au), nickel (Ni), neodymium (Nd), iridium (Ir), chrome (Cr), titanium (Ti), tantalum (Ta), tungsten (W), and copper (Cu). The first conductive layer GAT may have a single layer or multilayer structure.

The second insulating layer ILD1 (or an interlayer insulating layer) may be disposed on the first conductive layer GAT, and disposed over an approximately overall surface of the base layer SUB. The second insulating layer ILD1 may function to insulate the first conductive layer GAT and the second conductive layer SD1 from each other, and may be an interlayer insulating layer.

The second insulating layer ILD1 may include inorganic insulating material such as silicon oxide, silicon nitride, silicon oxynitride, hafnium oxide, aluminum oxide, titanium oxide, tantalum oxide, or zinc oxide, or organic insulating material such as polyacrylate-based resin, epoxy resin, phenolic resin, polyamide-based resin, polyimide-based resin, unsaturated polyesters resin, polyphenylen ether-based resin, polyphenylene sulfide-based resin, or benzocyclobutene (BCB). The second insulating layer ILD1 may have a single layer structure or a multilayer structure including stacked layers formed of different materials.

The second conductive layer SD1 may be disposed on the second insulating layer ILD1. The second conductive layer SD1 may include a second capacitor electrode CSE2, a first power line PL1, a first data line D1, and first to fourth bridge patterns BRP1, BRP2, BRP3, and BRP4.

The second capacitor electrode CSE2 may be disposed to overlap the first capacitor electrode CSE1 in a thickness direction of the substrate SUB, and have a surface area greater than that of the first capacitor electrode CSE1. A portion of the second capacitor electrode CSE2 may extend (or protrude) in the first direction DR1, overlap some areas of the first semiconductor pattern SCL1 (e.g., a source area of the first transistor T1 and a source area of the third transistor T3), and a partial area of the first semiconductor pattern SCL1 that is exposed through an eighth contact hole CH8. A portion of the second capacitor electrode CSE2 may form a second transistor electrode of each of the first transistor T1 and the third transistor T3.

The second capacitor electrode CSE2 may overlap the back gate electrode BGE, and may be connected to the back gate electrode BGE that is exposed through a seventh contact hole CH7.

The first power line PL1 may extend in the first direction DR1, overlap a partial area of the first semiconductor pattern SCL1 (e.g., a drain area of the first transistor T1), and may be connected to a partial area of the first semiconductor pattern SCL1 that is exposed through a sixth contact hole CH6. A portion of the first power line PL1 may form a first transistor electrode ET1 of the first transistor T1.

The first data line D1 may extend in the first direction DR1, overlap a partial area of the second semiconductor pattern SCL2 (e.g., a source area of the second transistor T2), and may be connected to a partial area of the second semiconductor pattern SCL2 that is exposed through a fifth contact hole CH5. A portion of the first data line D1 may form a first transistor electrode of the second transistor T2.

The first bridge pattern BRP1 may extend in the first direction DR1, overlap a partial area of the second semiconductor pattern SCL2 (e.g., a drain area of the second transistor T2), and may be connected to a partial area of the second semiconductor pattern SCL2 that is exposed through a third contact hole CH3. The first bridge pattern BRP1 may form a second transistor electrode of the second transistor T2.

Furthermore, the first bridge pattern BRP1 may overlap the first capacitor electrode CSE1, and may be connected to the first capacitor electrode CSE1 that is exposed through a fourth contact hole CH4.

The second bridge pattern BRP2 may extend in the first direction DR1, overlap each of the first sub-scan line S_S1 and the first scan pattern SP1, and may be connected to the first sub-scan line S_S1 and the first scan pattern SP1 respectively through a first contact hole CH1 and a second contact hole CH2. The second bridge pattern BRP2 may connect the first sub-scan line S_S1 and the first scan pattern SP1 to each other. In case that the first sub-scan line S_S1 and the first scan pattern SP1 are integrally formed, the second bridge pattern BRP2 may be omitted.

The third bridge pattern BRP3 may extend in the first direction DR1, overlap each of the first sub-sensing line SS_S1 and the first sensing pattern SSP1, and may be connected to the first sub-sensing line SS_S1 and the first sensing pattern SSP1 respectively through a tenth contact hole CH10 and a ninth contact hole CH9. The third bridge pattern BRP3 may connect the first sub-sensing line SS_S1 and the first sensing pattern SSP1 to each other. In case that the first sub-sensing line SS_S1 and the first sensing pattern SSP1 are integrally formed, the third bridge pattern BRP3 may be omitted.

The fourth bridge pattern BRP4 may extend in the first direction DR1, overlap a partial area of the first semiconductor pattern SCL1 (e.g., a source area of the third transistor T3), and may be connected to a partial area of the first semiconductor pattern SCL1 that is exposed through an eleventh contact hole CH11. The fourth bridge pattern BRP4 may form a first transistor electrode of the third transistor T3.

Furthermore, the fourth bridge pattern BRP4 may overlap the 11-th read-out pattern RP11, and may be connected to the 11-th read-out pattern RP11 that is exposed through a twelfth contact hole CH12.

The second conductive layer SD1 may include one or more metals selected from among molybdenum (Mo), aluminum (Al), platinum (Pt), palladium (Pd), silver (Ag), magnesium (Mg), gold (Au), nickel (Ni), neodymium (Nd), iridium (Ir), chrome (Cr), titanium (Ti), tantalum (Ta), tungsten (W), and copper (Cu), in a manner similar to that of the first conductive layer GAT. The second conductive layer SD1 may have a single layer or multilayer structure.

The third insulating layer ILD2 may be disposed on the second conductive layer SD1, and may be substantially identical or similar to the second insulating layer ILD1. In one or more embodiments, the third insulating layer ILD2 may be omitted.

The passivation layer PSV may be disposed on the third insulating layer ILD2. The passivation layer PSV may be provided in the form of an organic insulating layer, an inorganic insulating layer, or a structure including an organic insulating layer disposed on an inorganic insulating layer.

A thirteenth contact hole CH13, through which the second capacitor electrode CSE2 is exposed, may be formed in the passivation layer PSV. The second capacitor electrode CSE2 may be connected to the first electrode (or the light emitting element LD) of the light emitting element layer LDL (refer to FIG. 10) through the thirteenth contact hole CH13.

Figure 14:
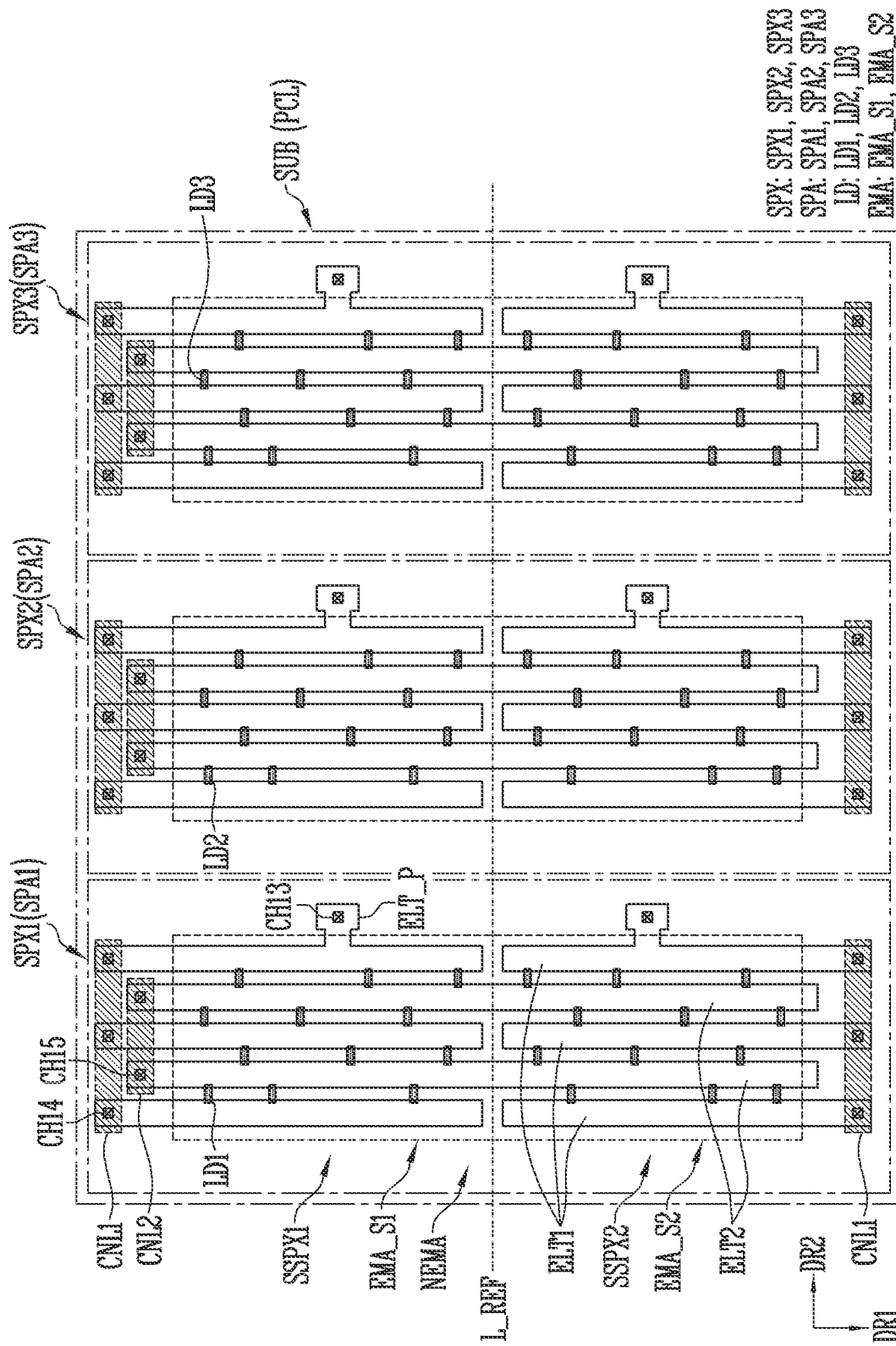
FIG. 14 is a plan view illustrating an example of a light emitting element layer included in the display device of FIG. 10.
Figure 15:
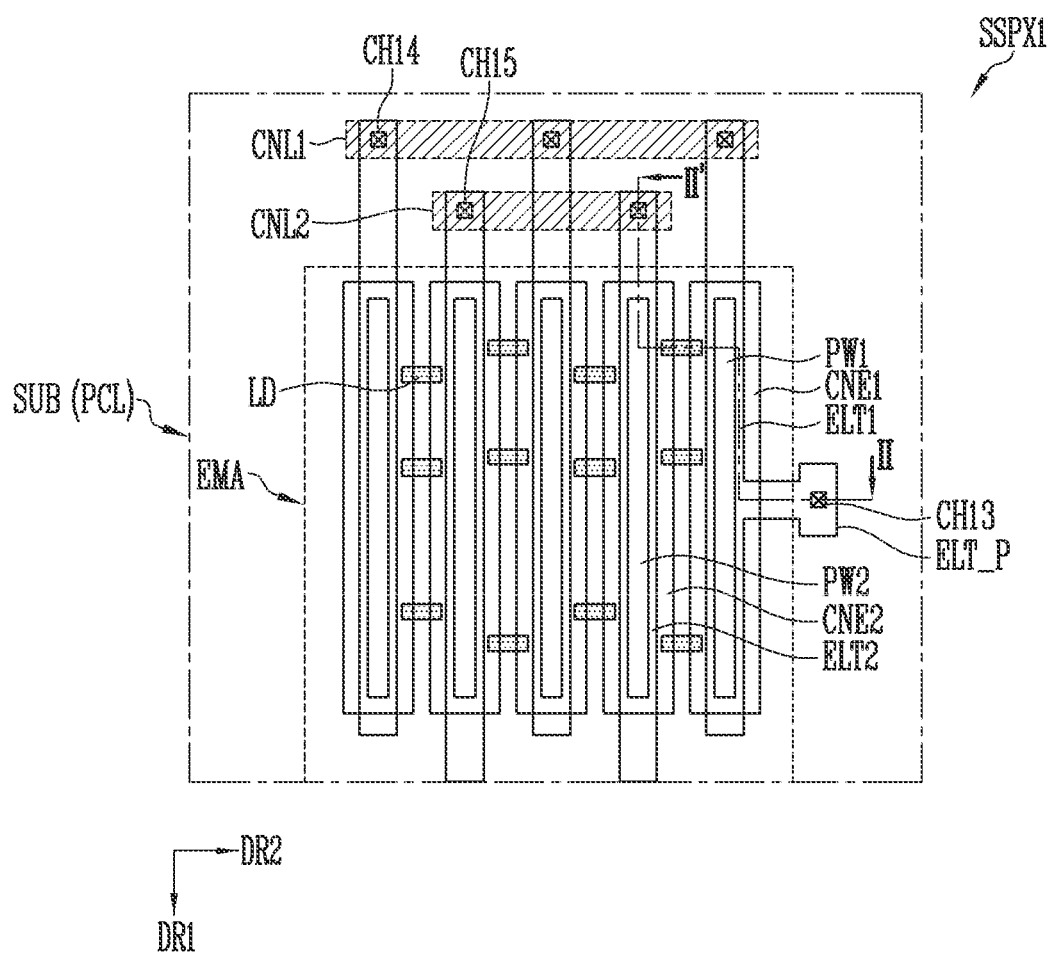
FIG. 15 is a plan view illustrating an enlargement of a first unit pixel included in the light emitting element layer of FIG. 14.

FIG. 14 is a plan view illustrating an example of the light emitting element layer included in the display device of FIG. 10. FIG. 14 illustrates the light emitting element layer LDL of the first pixel PXL1 (refer to FIG. 11). FIG. 15 is a plan view illustrating an enlargement of the first unit pixel included in the light emitting element layer of FIG. 14. The first to third sub-pixels SPX1 to SPX3 may be substantially the same as each other. Because first and second unit pixels SSPX1 and SSPX2 included in each of the first to third sub-pixels SPX1 to SPX3 may be top-and-bottom symmetrical structure based on a reference line L_REF, the light emitting element layer LDL will be described, focused on the first sub-pixel SPX1 and the first unit pixel SSPX1.

Referring to FIGS. 14 and 15, the first sub-pixel SPX1 may include a first electrode ELT1 and a second electrode ELT2 disposed at positions spaced from each other in the first sub-pixel area SPA1, and at least one light emitting element LD connected between the first and second electrodes ELT1 and ELT2.

In one or more embodiments, the first, second, and third light emitting elements LD1, LD2, and LD3 included in each of the first to third sub-pixels SPX1 to SPX3 may emit light having the same color or different colors. For example, each first light emitting element LD1 may be a red light emitting diode configured to emit red light. Each second light emitting element LD2 may be a green light emitting diode configured to emit green light. Each third light emitting element LD3 may be a blue light emitting diode configured to emit blue light.

For instance, all of the first, second, and third light emitting elements LD1, LD2, and LD3 may be formed of blue light emitting diodes configured to emit blue light. In this case, in order to form a full-color pixel PXL, a light conversion layer and/or a color filter for converting the color of light emitted from the corresponding sub-pixel SPX may be disposed over at least some of the first to third sub-pixels SPX1, SPX2, and SPX3.

In one or more embodiments, the first electrode ELT1 and the second electrode ELT2 may be disposed at positions spaced from each other in the first sub-pixel area SPA1, and disposed such that at least some areas thereof face (or oppose) each other. For example, the first and second electrodes ELT1 and ELT2 may extend in the first direction DR1, and may be disposed in parallel to each other at positions spaced from each other by a suitable distance (e.g., a set or predetermined distance) in the second direction DR2 that is substantially perpendicular to or intersects the first direction DR1. However, the present disclosure is not limited thereto. For example, the shapes and/or relative disposition relationship of the first and second electrodes ELT1 and ELT2 may be changed in various ways.

In one or more embodiments, the first sub-pixel area SPA1 may include an emission area EMA and a non-emission area NEMA. The emission area EMA may include a plurality of sub-emission areas separated from each other. The first electrode ELT1 may be disposed in each of the sub-emission areas. In one or more embodiments, the second electrode ELT2 may be disposed in the entirety of the emission area EMA, i.e., across the sub-emission areas. Here, the emission area EMA may be a unit area that expresses a single color of light, may be separated from an emission area configured to emit another single color of light, and may be defined by a pixel defining layer (or a bank, or a light shielding pattern) or the like that blocks light emitted from a light emitting element LD from passing through other areas.

For example, as illustrated in FIG. 14, the first sub-pixel area SPA may include one emission area EMA and a non-emission area NEMA. The emission area EMA may include first and second sub-emission areas EMA_S1 and EMA_S2 separated from each other in the first direction DR1 based on the reference line L_REF. The first electrode ELT1 may be disposed in each of the first and second sub-emission areas EMA_S1 and EMA_S2 based on the reference line L_REF. The second electrode ELT2 may be disposed in the entirety of the emission area EMA, i.e., across the first and second sub-emission areas EMA_S1 and EMA_S2. The first electrode ELT1 disposed in the second sub-emission area EMA_S2 may be spaced, in the first direction, from the first electrode ELT1 disposed in the first sub-emission area EMA_S1, and electrically separated or insulated from the first electrode ELT1 disposed in the first sub-emission area EMA_S1.

Although FIG. 14 illustrates that the emission area EMA includes the first and second sub-emission areas EMA_S1 and EMA_S2, this is for illustrative purposes. For example, the emission area EMA may include three or more sub-emission areas. Furthermore, although FIG. 14 illustrates that the first and second sub-emission areas EMA_S1 and EMA_S2 are consecutive (or adjacent) to each other, this is for illustrative purposes. The first and second sub-emission areas EMA_S1 and EMA_S2 may be spaced from each other by a pixel defining layer (or a bank) or the like disposed therebetween.

The first electrode ELT1 may be electrically connected to a first connection electrode CNL1 (or a first connection line) extending in the second direction DR2. The first electrodes ELT1 included in each sub-emission area may be electrically connected to each other by the first connection electrode CNL1.

In one or more embodiments, the first electrode ELT1 may be formed integrally with a first connection electrode CNL1. For example, the first electrode ELT1 may be formed of at least one branch diverging from the first connection electrode CNL1. In case that the first electrode ELT1 and the first connection electrode CNL1 are formed integrally with each other, the first connection electrode CNL1 may be regarded as one area of the first electrode ELT1. However, the present disclosure is not limited thereto. For example, in one or more embodiments of the present disclosure, the first electrode ELT1 and the first connection electrode CNL1 may be individually formed, and electrically connected to each other through at least one fourteenth contact hole CH14.

In one or more embodiments, the first electrode ELT1 may include a protrusion ELT_P. For example, the protrusion ELT_P may protrude from an intermediate portion of the first electrode ELT1 to the non-emission area NEMA in the second direction DR2. The protrusion ELT_P may be connected to the first transistor T1 (or the 11-th pixel circuit PXC) through the thirteenth contact hole CH13 described with reference to FIGS. 12 and 13. Depending on the disposition of the first transistor T1, the protrusion ELT_P may be omitted, and the first connection electrode CNL1 may be connected to the pixel circuit PXC (or the first transistor T1).

The second electrode ELT2 may be electrically connected to a second connection electrode CNL2 (or a second connection line) extending in the second direction DR2. The second connection electrode CNL2 may be connected to the second power line PL2 described with reference to FIG. 7. In one or more embodiments, the second connection electrode CNL2 (and the first connection electrode CNL1) may be disposed between the third insulating layer ILD2 and the passivation layer PSV that are described with reference to FIG. 13. The second electrode ELT2 may be connected to the second connection electrode CNL2 through a fifteenth contact hole CH15.

Although FIG. 14 illustrates that the second connection electrode CNL2 is disposed in only the corresponding sub-pixel SPX, this is for illustrative purposes, and the present disclosure is not limited thereto. For example, in one or more embodiments, the second connection electrode CNL2 may extend to an adjacent sub-pixel (e.g., the second and third sub-pixels SPX2 and SPX3 based on the first sub-pixel SPX1).

In one or more embodiments, each of the first and second electrodes ELT1 and ELT2 may have a single layer or multilayer structure. For example, the first electrode ELT1 may have a multilayer structure including a first reflective electrode and a first conductive capping layer. The second electrode ELT2 may have a multilayer structure including a second reflective electrode and a second conductive capping layer.

In one or more embodiments, the first connection electrode CNL1 may have a single layer or multilayer structure. For example, the first connection electrode CNL1 may include a first sub-connection electrode integrally connected with the first reflective electrode, and a second sub-connection electrode integrally connected with the first conductive capping layer. In one or more embodiments, the first connection electrode CNL1 may have the same cross-sectional structure (or stacked structure) as that of the first electrode ELT1, but the present disclosure is not limited thereto.

In one or more embodiments, the second connection electrode CNL2 may have a single layer or multilayer structure in a manner similar to that of the first connection electrode CNL1.

Referring to FIG. 15, a first partition wall PW1 may be disposed under the first electrode ELT1 and overlap one area of the first electrode ELT1. A second partition wall PW2 may be disposed under the second electrode ELT2 and overlap one area of the second electrode ELT2. The first and second partition walls PW1 and PW2 may be disposed in the emission area EMA at positions spaced from each other, and make the one areas of the first and second electrode ELT1 and ELT2 protrude upward. For example, the first electrode ELT1 may be disposed on the first partition wall PW1 and protrude in a height direction (or a thickness direction) of the base layer SUB by the first partition wall PW1. The second electrode ELT2 may be disposed on the second partition wall PW2 and protrude in the height direction of the base layer SUB by the second partition wall PW2.

In one or more embodiments, at least one light emitting element LD, e.g., a plurality of light emitting elements LD, may be arranged between the first and second electrodes ELT1 and ELT2. A plurality of light emitting elements LD may be connected in parallel to each other in the emission area EMA (or the first sub-emission area EMA_S1) in which the first electrode ELT1 and the second electrode ELT2 are disposed to face (or oppose) each other.

Although FIG. 15 illustrates that the light emitting elements LD are arranged between the first and second electrodes ELT1 and ELT2 in the second direction DR2, e.g., in a horizontal direction, the arrangement direction of the light emitting elements LD is not limited thereto. For example, at least one of the light emitting elements LD may be oriented in a diagonal direction.

Each of the light emitting elements LD may be electrically connected between the first electrode ELT1 and the second electrode ELT2. For example, the respective first ends of the light emitting elements LD may be electrically connected to the first electrode ELT1. The respective second ends of the light emitting elements LD may be electrically connected to the second electrode ELT2.

In one or more embodiments, the respective first ends of the light emitting elements LD may be electrically connected to the first electrode ELT1 by at least one contact electrode, e.g., a first contact electrode CNE1 (or a third electrode), rather than being directly disposed on the first electrode ELT1. However, the present disclosure is not limited thereto. For example, in one or more embodiments of the present disclosure, the first ends of the light emitting elements LD may directly contact the first electrode ELT1 and may be electrically connected to the first electrode ELT1.

Likewise, the respective second ends of the light emitting elements LD may be electrically connected to the second electrode ELT2 through at least one contact electrode, e.g., a second contact electrode CNE2 (or a fourth electrode), rather than being directly disposed on the second electrode ELT2. However, the present disclosure is not limited thereto. For example, in one or more embodiments of the present disclosure, the respective second ends of the light emitting elements LD may directly contact the second electrode ELT2 and may be electrically connected to the second electrode ELT2.

In one or more embodiments, each of the light emitting elements LD may be formed of a light emitting diode that is made of material having an inorganic crystal structure and has a subminiature size, e.g., ranging from the nanoscale to the microscale. For example, each of the light emitting elements LD may be a subminiature light emitting diode having a size ranging from the nanoscale to the microscale, as illustrated in any one of FIGS. 1A to 4B.

In one or more embodiments, the light emitting elements LD may be prepared in a diffused form in a suitable solution (e.g., a set or predetermined solution), and then supplied to the emission area EMA of the sub-pixel SPX by an inkjet printing scheme or a slit coating scheme. Furthermore, the light emitting elements LD may be concurrently (e.g., simultaneously) supplied to the sub-emission areas EMA_S1 and EMA_S2 in the emission area EMA. For example, the light emitting elements LD may be mixed with a volatile solvent and supplied to the emission area EMA. Here, if a suitable voltage (e.g., a set or predetermined voltage) is supplied to the first and second electrodes ELT1 and ELT2 of the sub-pixel SPX, an electric field is formed between the first and second electrodes ELT1 and ELT2, whereby the light emitting elements LD are self-aligned between the first and second electrodes ELT1 and ELT2. After the light emitting elements LD have been aligned, the solvent may be removed by a volatilization scheme or other schemes. In this way, the light emitting elements LD may be reliably arranged between the first and second electrodes ELT1 and ELT2. Furthermore, because the first contact electrode CNE1 and the second contact electrode CNE2 are formed on the first ends and the second ends of the light emitting elements LD, the light emitting elements LD may be reliably connected between the first and second electrodes ELT1 and ELT2.

In one or more embodiments, the first contact electrode CNE1 may be formed on the first ends EP1 of the light emitting elements LD and at least one area of the first electrode ELT1 corresponding to the first ends, whereby the first ends of the light emitting elements LD may be physically and/or electrically connected to the first electrode ELT1. Likewise, the second contact electrode CNE2 may be formed on the second ends EP2 of the light emitting elements LD and at least one area of the second electrode ELT2 corresponding to the second ends, whereby the second ends EP2 of the light emitting elements LD may be physically and/or electrically connected to the second electrode ELT2.

The light emitting elements LD disposed in the emission area EMA may be grouped to form a light source of the corresponding unit pixel (and the sub-pixel SPX). For example, the light emitting elements LD disposed in the first and second sub-emission areas EMA_S1 and EMA_S2 shown in FIG. 14 may form one light source. For example, if driving current flows through at least one sub-pixel SPX (or each of the unit pixels SSPX1 and SSPX2) during each frame period, the light emitting elements LD that are connected in the forward direction between the first and second electrodes ELT1 and ELT2 of the sub-pixel SPX may emit light having a luminance corresponding to the driving current.

FIGS. 16A to 16D are sectional views taken along the line II-II' of FIG. 15. FIGS. 16A to 16D each illustrate any one sub-pixel area SPA (e.g., the first sub-pixel area SPA1)

formed in the display panel PNL. In one or more embodiments, the first, second, and third sub-pixels SPX1, SPX2, and SPX3 described above and the unit pixels SSPX1 and SSPX2 included therein may have cross-sectional structures substantially identical or similar to each other. Therefore, for the sake of explanation, in FIGS. 16A to 16D, the structures of the first, second, and third sub-pixels SPX1, SPX2, and SPX3 and the unit pixels SSPX1 and SSPX2 included therein will be collectively described based on the first unit pixel SSPX1.

Figure 16A:
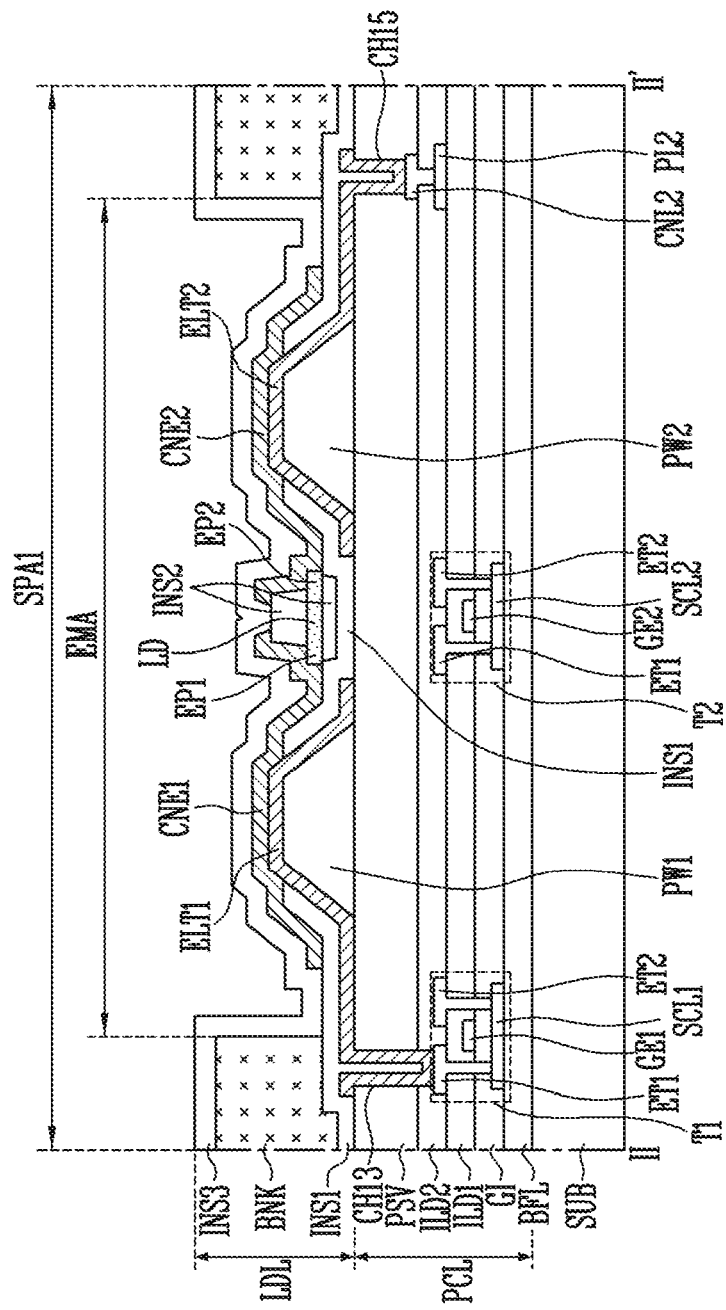
FIGS. 16A to 16D are sectional views taken along the line II-II' of FIG. 15.

Referring to FIG. 16A, the pixel circuit layer PCL and the light emitting element layer LDL may be successively disposed in each sub-pixel area SPA on the base layer SUB. In one or more embodiments, the pixel circuit layer PCL and the light emitting element layer LDL may be formed on the overall surface of the display area DA of the display panel PNL.

The pixel circuit layer PCL is the same as the pixel circuit layer PCL described with reference to FIGS. 11 to 13, and thus, redundant explanation thereof will be omitted.

The light emitting element layer LDL may include first and second partition walls PW1 and PW2, first and second electrodes ELT1 and ELT2, a fourth insulating layer INS1, light emitting elements LD, a fifth insulating layer INS2, first and second contact electrodes CNE1 and CNE2, and a sixth insulating layer INS3, which are successively disposed and/or formed on the pixel circuit layer PCL.

The first and second partition walls PW1 and PW2 may be disposed on the pixel circuit layer PCL. The first and second partition walls PW1 and PW2 may be disposed at positions spaced from each other in the emission area EMA. The first and second partition walls PW1 and PW2 may protrude in a height direction on the pixel circuit layer PCL. In one or more embodiments, the first and second partition walls PW1 and PW2 may have substantially the same height, but the present disclosure is not limited thereto.

In one or more embodiments, the first partition wall PW1 may be disposed between the pixel circuit layer PCL and the first electrode ELT1. The first partition wall PW1 may be disposed adjacent to the first ends EP1 of the light emitting elements LD. For example, one sidewall of the first partition wall PW1 may be positioned adjacent to the first ends EP1 of the light emitting elements LD and disposed to face (or oppose) the first ends EP1.

In one or more embodiments, the second partition wall PW2 may be disposed between the pixel circuit layer PCL and the second electrode ELT2. The second partition wall PW2 may be disposed adjacent to the second ends EP2 of the light emitting elements LD. For example, one sidewall of the second partition wall PW2 may be positioned adjacent to the second ends EP2 of the light emitting elements LD and disposed to face (or oppose) the second ends EP2.

Figure 16B:
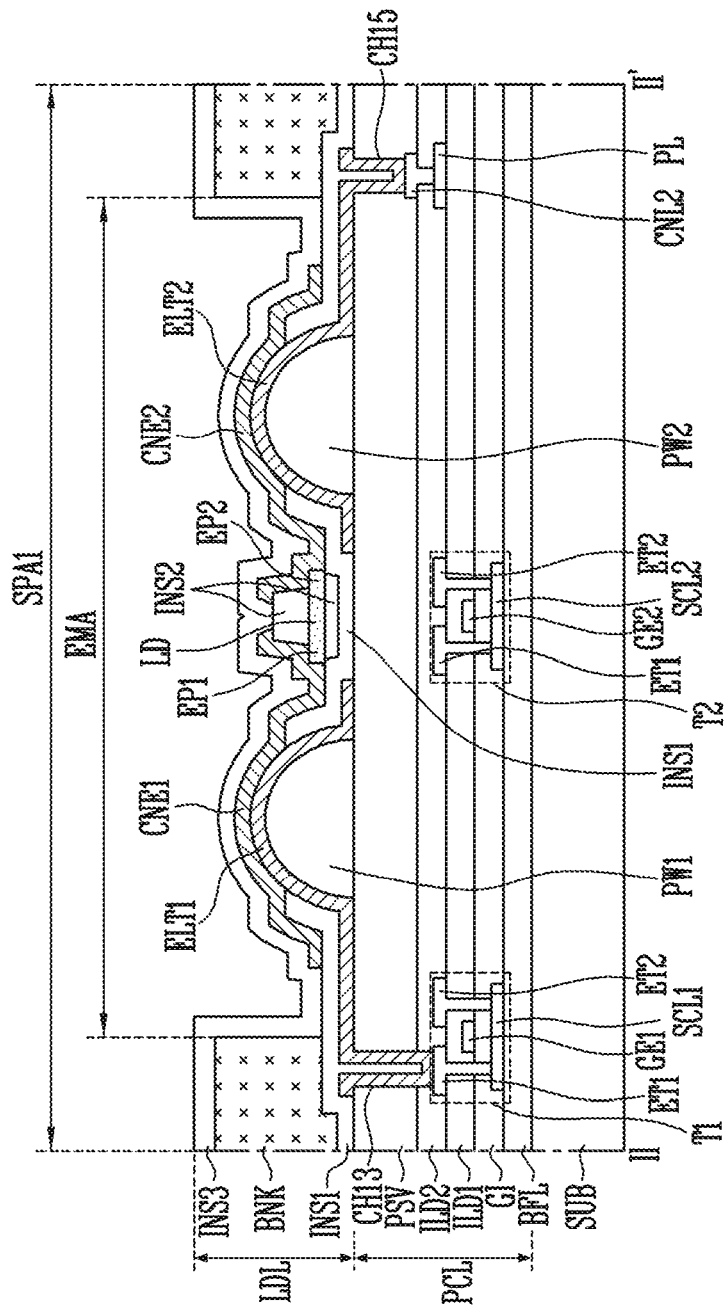

In one or more embodiments, each of the first and second partition walls PW1 and PW2 may have various shapes. For example, as illustrated in FIG. 16A, each of the first and second partition walls PW1 and PW2 may have a cross-sectional shape of a trapezoid that is reduced in width from a bottom to a top thereof. In this case, each of the first and second partition walls PW1 and PW2 may have an inclined surface on at least one side. Alternatively, as illustrated in FIG. 16B, each of the first and second partition walls PW1 and PW2 may have a semicircular or a semielliptical cross-section that is reduced in width from a bottom to a top thereof. In this case, each of the first and second partition walls PW1 and PW2 may have a curved surface on at least one side. In other words, the shape of each of the first and second partition walls PW1 and PW2 may be changed in various ways rather than being particularly limited. In one or more embodiments, at least one of the first and second partition walls PW1 and PW2 may be omitted or changed in position.

Each of the first and second partition walls PW1 and PW2 may include insulating material having inorganic material and/or organic material. For example, the first and second partition walls PW1 and PW2 may include at least one inorganic layer including various inorganic insulating materials that are known to those skilled in the art, such as $SiN_x$ or $SiO_x$. Alternatively, the first and second partition walls PW1 and PW2 may include at least one organic layer and/or photoresist layer containing various known organic insulating materials, or may form a single layer or multilayer insulator containing organic/inorganic materials in combination. In other words, the constituent materials of the first and second partition walls PW1 and PW2 may be changed in various ways.

In one or more embodiments, each of the first and second partition walls PW1 and PW2 may function as a reflective member. For example, the first and second partition walls PW1 and PW2, along with the first and second electrodes ELT1 and ELT2 provided thereon, may function as reflectors that guide light emitted from each light emitting element LD in a desired direction (e.g., an image display direction or the thickness direction of the substrate SUB), thus enhancing the light efficiency of the pixel PXL.

The first and second electrodes ELT1 and ELT2 may be respectively disposed over the first and second partition walls PW1 and PW2. The first and second electrodes ELT1 and ELT2 may be disposed at positions spaced from each other in the emission area EMA.

In one or more embodiments, the first and second electrodes ELT1 and ELT2 that are respectively disposed over the first and second partition walls PW1 and PW2 may have shapes corresponding to the respective shapes of the first and second partition walls PW1 and PW2. For example, the first and second electrodes ELT1 and ELT2 may have inclined surfaces or curved surfaces corresponding to the first and second partition walls PW1 and PW2, respectively, and protrude in a height direction (or a thickness direction) of the light emitting element layer LDL.

Each of the first and second electrodes ELT1 and ELT2 may include at least one conductive material. For example, each of the first and second electrodes ELT1 and ELT2 may include at least one of metal such as Ag, Mg, Al, Pt, Pd, Au, Ni, Nd, Ir, Cr, Ti or an alloy thereof, conductive oxide such as ITO, IZO, ZnO, or ITZO, and a conductive polymer such as PEDOT; however, it is not limited thereto.

Each of the first and second electrodes ELT1 and ELT2 may be formed of a single layer or multiple layers. For example, each of the first and second electrodes ELT1 and ELT2 may include at least one reflective electrode layer. Each of the first and second electrodes ELT1 and ELT2 may selectively further include at least one of at least one transparent electrode layer disposed on an upper portion and/or a lower portion of the reflective electrode layer, and at least one conductive capping layer that covers an upper portion of the reflective electrode layer and/or the transparent electrode layer.

In one or more embodiments, the reflective electrode layer of each of the first and second electrodes ELT1 and ELT2 may be formed of conductive material having a uniform reflectivity. For example, the reflective electrode layer may include at least one of metals such as Ag, Mg, Al, Pt, Pd, Au, Ni, Nd, Ir, Cr, and an alloy thereof; however, the present disclosure is not limited thereto. In other words, reflective electrode layer may be formed of various reflective conductive materials. Each of the first and second electrodes ELT1 and ELT2 that includes the reflective electrode layer may enable light emitted from the opposite ends of each of the light emitting elements LD, i.e., the first and second ends EP1 and EP2, to more reliably travel in a direction (e.g., in a frontal direction) in which an image is displayed. For example, if the first and second electrodes ELT1 and ELT2 respectively have inclined or curved surfaces corresponding to the shapes of the first and second partition walls PW1 and PW2 and are respectively disposed to face (or oppose) the first and second ends EP1 and EP2 of the light emitting elements LD, light emitted from the first and second ends EP1 and EP2 of each light emitting elements LD may be reflected by the first and second electrodes ELT1 and ELT2 and thus more reliably travel in the frontal direction of the display panel PNL (e.g., in an upward direction of the base layer SUB). Consequently, the efficiency of light emitted from the light emitting elements LD may be enhanced.

Furthermore, the transparent electrode layer of each of the first and second electrodes ELT1 and ELT2 may be formed of various transparent electrode materials. For example, the transparent electrode layer may include ITO, IZO or ITZO, but the present disclosure is not limited thereto. In one or more embodiments, each of the first and second electrodes ELT1 and ELT2 may have a triple-layer structure having a stacked structure of ITO/Ag/ITO. As such, if the first and second electrodes ELT1 and ELT2 each are formed of a multilayer structure of at least double or more layers, a voltage drop due to a signal delay (RC delay) may be reduced or minimized. Thus, a desired voltage can be effectively transmitted to the light emitting elements LD.

In addition, if each of the first and second electrodes ELT1 and ELT2 includes the conductive capping layer that covers the reflective electrode layer and/or the transparent electrode layer, it is possible to prevent the reflective electrode layer of the first and second electrodes ELT1 and ELT2 from being damaged due to defects caused during a process of manufacturing the pixel PXL. However, the conductive capping layer may be selectively included in the first and second electrodes ELT1 and ELT2, and may be omitted depending on embodiments. Furthermore, the conductive capping layer may be considered as a component of each of the first and second electrodes ELT1 and ELT2, or considered as a separate component disposed on the first and second electrodes ELT1 and ELT2.

The fourth insulating layer INS1 may be disposed on one area of each of the first and second electrode ELT1 and ELT2. For example, the fourth insulating layer INS1 may be formed to cover one area of each of the first and second electrodes ELT1 and ELT2, and may include an opening that exposes another area of each of the first and second electrodes ELT1 and ELT2.

In one or more embodiments, the fourth insulating layer INS1 may be primarily formed to cover the overall surfaces of the first and second electrodes ELT1 and ELT2. After the light emitting elements LD are supplied and aligned on the fourth insulating layer INS1, the fourth insulating layer INS1 may be partially open to expose the first and second electrodes ELT1 and ELT2 in first and second contactors (e.g., predetermined contactors), as illustrated in FIG. 16A. Alternatively, the fourth insulating layer INS1 may be patterned in the form of an individual pattern that is sectionally disposed under the light emitting elements LD after the supply and alignment of the light emitting elements LD have been completed.

In other words, the fourth insulating layer INS1 may be interposed between the first and second electrodes ELT1 and ELT2 and the light emitting elements LD, and may expose at least one area of each of the first and second electrodes ELT1 and ELT2. After the first and second electrodes ELT1 and ELT2 are formed, the fourth insulating layer INS1 may be formed to cover the first and second electrodes ELT1 and ELT2, so that it is possible to prevent the first and second electrodes ELT1 and ELT2 from being damaged or to prevent metal from being precipitated during a subsequent process. Furthermore, the fourth insulating layer INS1 may stably support each light emitting element LD. In one or more embodiments, the fourth insulating layer INS1 may be omitted.

The light emitting elements LD may be supplied to and aligned in the emission area EMA in which the fourth insulating layer INS1 is formed. For example, a plurality of light emitting elements LD may be supplied to the emission area EMA by an inkjet method or the like, and the light emitting elements LD may be aligned between the first and second electrodes ELT1 and ELT2 by suitable alignment voltages (e.g., set or predetermined alignment voltages or alignment signals) applied to the first and second electrodes ELT1 and ELT2.

The bank BNK may be disposed on the fourth insulating layer INS1. For example, the bank BNK may be formed between other sub-pixels to enclose the emission area EMA of the sub-pixel SPX, thus forming a pixel defining layer for defining the emission area EMA of the sub-pixel SPX.

In one or more embodiments, the bank BNK may be formed to have a second height greater than a first height of the first and second partition walls PW1 and PW2. In this case, at the step of supplying the light emitting elements LD to each emission area EMA, the bank BNK may function as a dam structure configured to prevent a solution mixed with the light emitting elements LD from being drawn into the emission area EMA of an adjacent sub-pixel SPX or control the amount of solution such that a constant amount of solution is supplied to each emission area EMA.

The bank BNK may be formed to prevent light emitted from each emission area EMA from entering an adjacent emission area EMA and causing optical interference. To this end, the bank BNK may be formed to prevent light emitted from the light emitting elements LD of each sub-pixel SPX from passing through the bank BNK.

In one or more embodiments, the bank BNK may not be disposed between the sub-emission areas EMA_S1 and EMA_S2 (refer to FIG. 14), but the present disclosure is not limited thereto.

The fifth insulating layer INS2 may be disposed over the light emitting elements LD, for example, the light emitting elements LD aligned between the first and second electrodes ELT1 and ELT2, and may allow the first and second ends EP1 and EP2 of the light emitting elements LD to be exposed. For example, the fifth insulating layer INS2 may be partially disposed only over some areas of the light emitting elements LD without covering the first and second ends EP1 and EP2 of the light emitting elements LD. The fifth insulating layer INS2 may be formed in an independent pattern in each emission area EMA, but the present disclosure is not limited thereto. Furthermore, as illustrated in FIG. 16A, if space is present between the fourth insulating layer INS1 and the light emitting elements LD before the fifth insulating layer INS2 is formed, the space may be filled with the fifth insulating layer INS2. Consequently, the light emitting elements LD may be more stably supported.

The first and second contact electrodes CNE1 and CNE2 may be disposed on the first and second electrodes ELT1 and ELT2 and the first and second ends EP1 and EP2 of the light emitting elements LD. In one or more embodiments, the first and second contact electrodes CNE1 and CNE2 may be disposed at the same layer, as illustrated in FIG. 16A. In this case, although the first and second contact electrodes CNE1 and CNE2 are formed through the same process using the same conductive material, the present disclosure is not limited thereto.

The first and second contact electrodes CNE1 and CNE2 may respectively electrically connect the first and second ends EP1 and EP2 of the light emitting elements LD to the first and second electrodes ELT1 and ELT2.

For example, the first contact electrode CNE1 may be disposed on the first electrode ELT1 to make contact with the first electrode ELT1. For example, the first contact electrode CNE1 may be disposed to contact the first electrode ELT1 on one area of the first electrode ELT1 that is not covered by the fourth insulating layer INS1. Furthermore, the first contact electrode CNE1 may be disposed on the first end EP1 of at least one light emitting element adjacent to the first electrode ELT1, e.g., on the respective first ends EP1 of a plurality of light emitting elements LD so that the first contact electrode CNE1 can contact the first ends EP1. In other words, the first contact electrode CNE1 may be disposed to cover the first ends EP1 of the light emitting elements LD and at least one area of the corresponding first electrode ELT1. Hence, the first ends EP1 of the light emitting elements LD may be electrically connected to the first electrode ELT1.

Likewise, the second contact electrode CNE2 may be disposed on the second electrode ELT2 to contact the second electrode ELT2. For example, the second contact electrode CNE2 may be disposed to contact the second electrode ELT2 on one area of the second electrode ELT2 that is not covered by the fourth insulating layer INS1. Furthermore, the second contact electrode CNE2 may be disposed on the second end EP2 of at least one light emitting element adjacent to the second electrode ELT2, e.g., on the second ends EP2 of a plurality of light emitting elements LD so that the second contact electrode CNE2 can contact the second ends EP2. In other words, the second contact electrode CNE2 may be disposed to cover the second ends EP2 of the light emitting elements LD and at least one area of the corresponding second electrode ELT2. Hence, the second ends EP2 of the light emitting elements LD may be electrically connected to the second electrode ELT2.

The sixth insulating layer INS3 may be formed and/or disposed on one surface of the base layer SUB on which the first and second partition walls PW1 and PW2, the first and second electrodes ELT1 and ELT2, the light emitting elements LD, the first and second contact electrodes CNE1 and CNE2, and the bank BNK are formed, so that the sixth insulating layer INS3 may cover the first and second partition walls PW1 and PW2, the first and second electrodes ELT1 and ELT2, the light emitting elements LD, the first and second contact electrodes CNE1 and CNE2, and the bank BNK. The sixth insulating layer INS3 may include a thin-film encapsulation layer including at least one inorganic layer and/or organic layer, but the present disclosure is not limited thereto. In one or more embodiments, at least one overcoat layer, may be further disposed over the sixth insulating layer INS3.

In one or more embodiments, each of the fourth to sixth insulating layers INS1, INS2, and INS3 may have a single layer or multilayer structure, and include at least one inorganic insulating material and/or organic insulating material. For example, each of the fourth to sixth insulating layers INS1, INS2, and INS3 may include various kinds of well-known organic/inorganic insulating materials as well as $SiN_x$, and the constituent material of each of the fourth to sixth insulating layers INS1, INS2, and INS3 is not particularly limited. The fourth to sixth insulating layers INS1, INS2, and INS3 may include different insulating materials, or at least some of the fourth to sixth insulating layers INS1, INS2, and INS3 may include the same insulating material.

In one or more embodiments, the first and second contact electrodes CNE1 and CNE2 may be disposed on different layers.

Figure 16C:
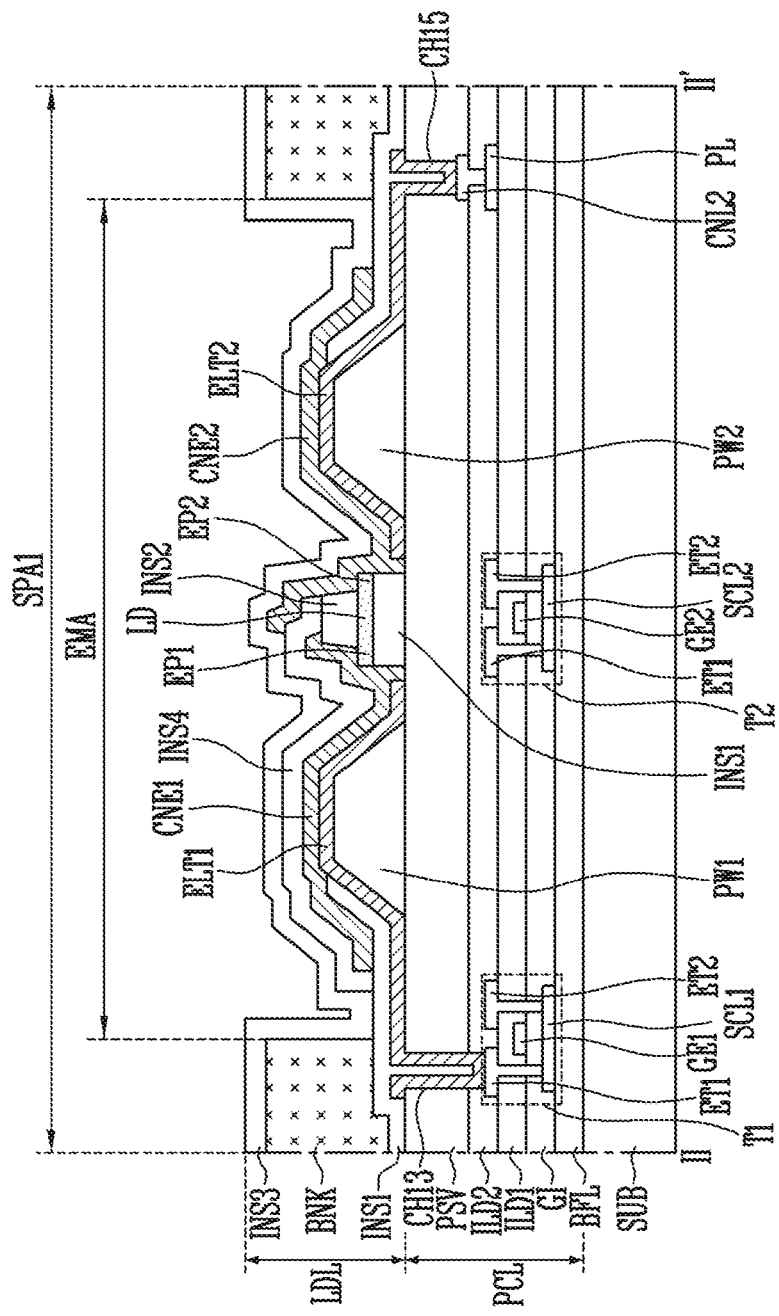

Referring to FIG. 16C, the first contact electrode CNE1 may be disposed in the sub-pixel area SPA in which the fifth insulating layer INS2 is disposed. In one or more embodiments, the first contact electrode CNE1 may be disposed on the first electrode ELT1 disposed in the corresponding sub-pixel area SPA such that the first contact electrode CNE1 contacts one area of the first electrode ELT1. Furthermore, the first contact electrode CNE1 may be disposed on the first end EP1 of at least one light emitting element LD disposed in the corresponding sub-pixel area SPA such that that the first contact electrode CNE1 contacts the first end EP1. Due to the first contact electrode CNE1, the first end EP1 of at least one light emitting element LD disposed in the sub-pixel area SPA may be electrically connected to the first electrode ELT1 disposed in the corresponding sub-pixel area SPA.

A seventh insulating layer INS4 may be disposed in the sub-pixel area SPA in which the first contact electrode CNE1 is disposed. In one or more embodiments, the seventh insulating layer INS4 may cover the fifth insulating layer INS2 and the first contact electrode CNE1 that are disposed in the corresponding sub-pixel area SPA.

In one or more embodiments, the seventh insulating layer INS4 may have a single layer or multilayer structure and include at least one inorganic insulating material and/or organic insulating material, in a manner similar to that of the fourth to sixth insulating layers INS1, INS2, and INS3. For example, the seventh insulating layer INS4 may include various kinds of known organic/inorganic insulating materials including SiNx. Furthermore, the seventh insulating layer INS4 may include insulating material different from that of the fourth to sixth insulating layers INS1, INS2, and INS3, or may include the same insulating material as that of at least some of the fourth to sixth insulating layers INS1, INS2, and INS3.

The second contact electrode CNE2 may be disposed in each sub-pixel area SPA in which the seventh insulating layer INS4 is disposed. In one or more embodiments, the second contact electrode CNE2 may be disposed on the second electrode ELT2 disposed in the corresponding sub-pixel area SPA such that the second contact electrode CNE2 contacts one area of the second electrode ELT2. Furthermore, the second contact electrode CNE2 may be disposed on the second end EP2 of at least one light emitting element LD disposed in the corresponding sub-pixel area SPA such that that the second contact electrode CNE2 contacts the second end EP2. Due to the second contact electrode CNE2, the second end EP2 of at least one light emitting element LD disposed in each sub-pixel area SPA may be electrically connected to the second electrode ELT2 disposed in the corresponding sub-pixel area SPA.

Figure 16D:
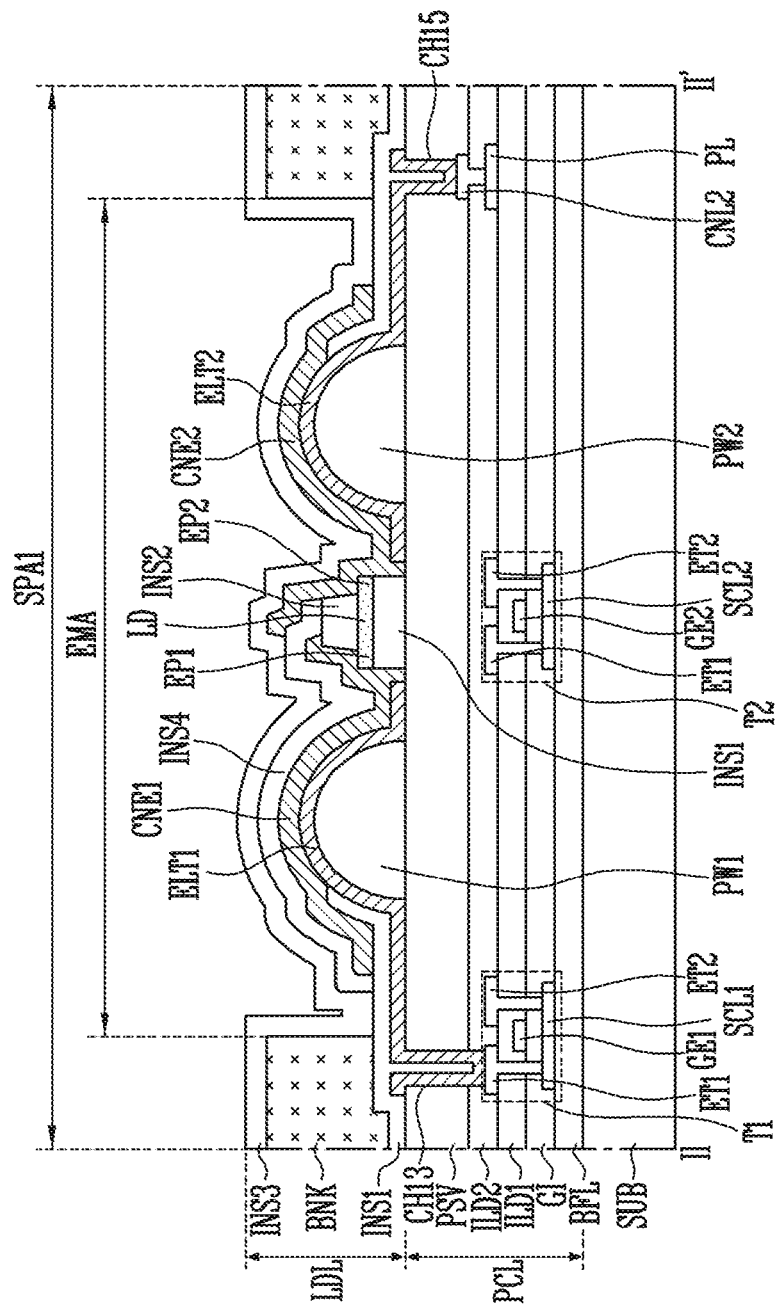

In one or more embodiments, each of the first and second partition walls PW1 and PW2 may have various shapes. For example, as illustrated in FIG. 16C, each of the first and second partition walls PW1 and PW2 may have a cross-sectional shape of a trapezoid that is reduced in width from a bottom to a top thereof. Alternatively, as illustrated in FIG. 16D, each of the first and second partition walls PW1 and PW2 may have a semicircular or a semielliptical cross-section that is reduced in width from a bottom to a top thereof.

Figure 17:
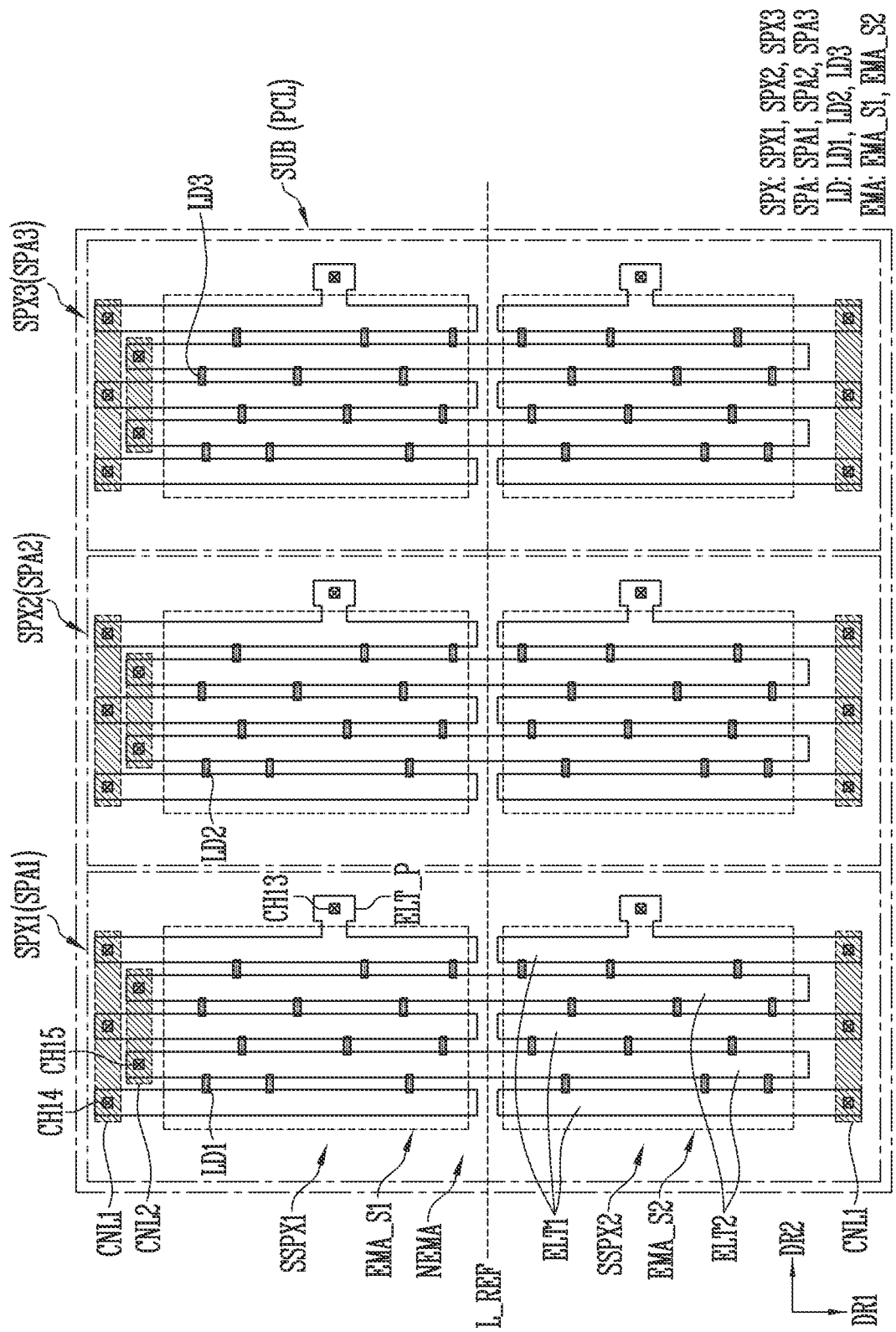
FIG. 17 is a plan view illustrating an example of the light emitting element layer included in the display device of FIG. 10.

FIG. 17 is a plan view illustrating an example of the light emitting element layer included in the display device of FIG. 10. FIG. 17 illustrates the light emitting element layer LDL of the first pixel PXL1 (refer to FIG. 11), in a manner similar to that of FIG. 14. Because the first to third sub-pixels SPX1 to SPX3 are substantially equal to each other, the light emitting element layer LDL will be described based on the first sub-pixel SPX1.

Referring to FIGS. 14 and 17, the first sub-pixel SPX1 of FIG. 17, except an emission area EMA, may be substantially the same as the first sub-pixel SPX1 of FIG. 14. Therefore, repetitive explanation thereof will be omitted.

As illustrated in FIG. 17, the emission area EMA may include a first sub-emission area EMA_S1 and a second sub-emission area EMA_S2 that are spaced from each other in the first direction DR1 based on a reference line L_REF. For example, the bank BNK described with reference to FIG. 16A may be disposed along the reference line L_REF between the first and second sub-emission areas EMA_S1 and EMA_S2. In other words, the bank BNK may also be disposed between the first electrodes ELT1, in a plan view.

In other words, the sub-emission areas EMA_S1 and EMA_S2 in the emission area EMA may be set or defined in various ways.

Figure 18:
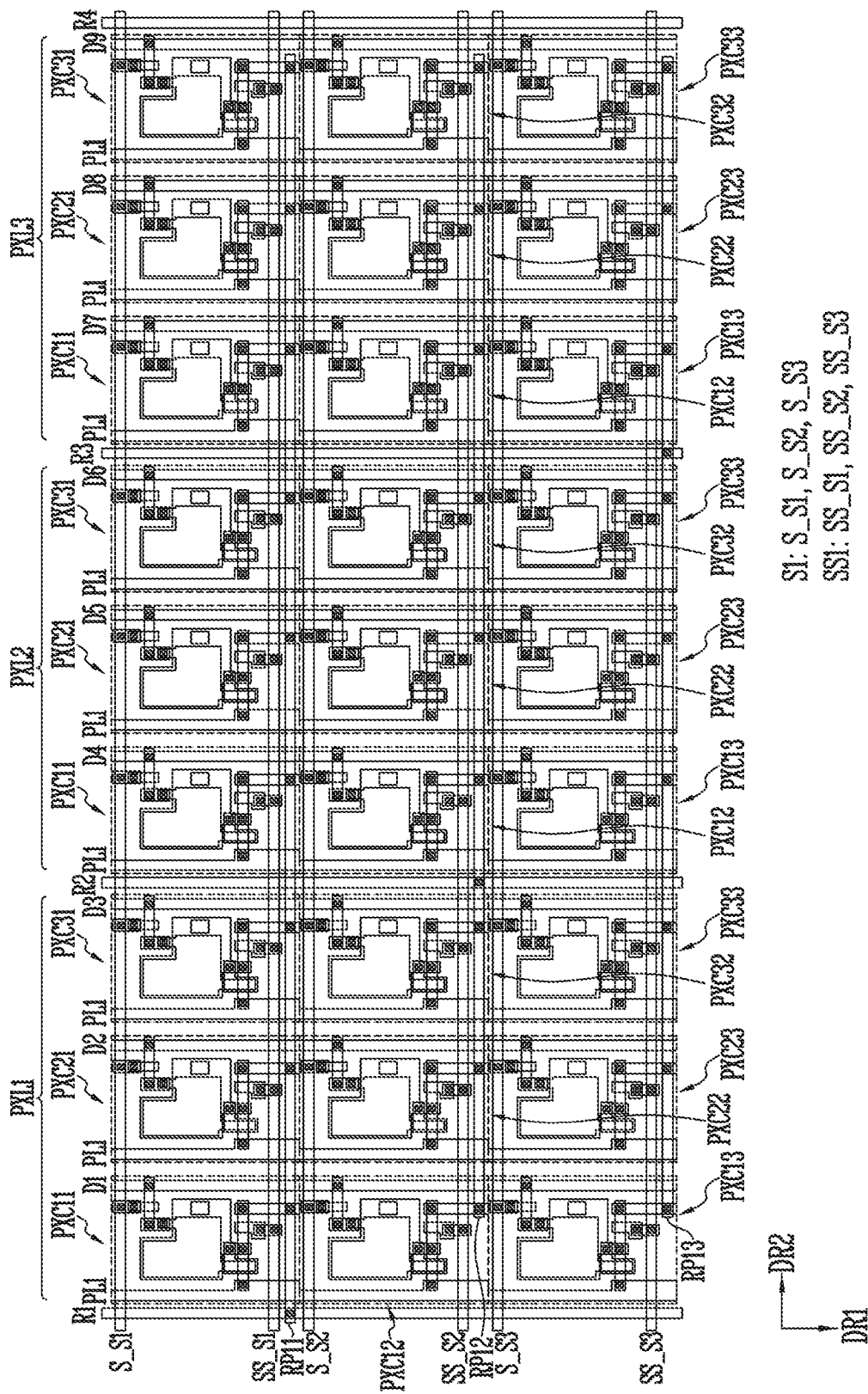
FIG. 18 is a plan view illustrating an example of the pixel circuit layer included in the display device of FIG. 10.

FIG. 18 is a plan view illustrating an example of the pixel circuit layer included in the display device of FIG. 10. FIG. 18 illustrates a pixel circuit layer corresponding to that of FIG. 11. Here, FIG. 18 illustrates the case where the sub-pixels SPX1 to SPX3 of FIG. 6B each include three unit pixels or three pixel circuits (e.g., 11-th to 13-th pixel circuits PXC11, PXC12, and PXC13, 21-th to 23-th pixel circuits PXC21, PXC22, and PXC23, or 31-th to 33-th pixel circuits PXC31, PXC32, and PXC33) (i.e., the case of k=3). Because each of the pixel circuits PXC11, PXC12, PXC13, PXC21, PXC22, PXC23, PXC31, PXC32, and PXC33 is substantially identical or similar to the 11-th pixel circuit PXC11 described with reference to FIG. 12, redundant explanation thereof will be omitted.

Referring to FIGS. 6B and 18, the first pixel PXL1 (or the first pixel area) may include a 11-th pixel circuit PXC11 (or a 11-th pixel circuit area), a 12-th pixel circuit PXC12, a 13-th pixel circuit PXC13, a 21-th pixel circuit PXC21, a 22-th pixel circuit PXC22, a 23-th pixel circuit PXC23, a 31-th pixel circuit PXC31, a 32-th pixel circuit PXC32, and a 33-th pixel circuit PXC33.

The 11-th pixel circuit PXC11, the 21-th pixel circuit PXC21, and the 31-th pixel circuit PXC31 in the first pixel PXL1 may be connected to a first sub-scan line S_S1, a first sub-sensing line SS_S1, and a 11-th read-out pattern RP11. The 12-th pixel circuit PXC12, the 22-th pixel circuit PXC22, and the 32-th pixel circuit PXC32 in the first pixel PXL1 may be connected to a second sub-scan line S_S2, a second sub-sensing line SS_S2, and a 12-th read-out pattern RP12. The 13-th pixel circuit PXC13, the 23-th pixel circuit PXC23, and the 33-th pixel circuit PXC33 in the first pixel PXL1 may be connected to a third sub-scan line S_S3, a third sub-sensing line SS_S3, and a 13-th read-out pattern RP13. Here, the first sub-scan line S_S1, the second sub-scan line S_S2, and the third sub-scan line S_S3 may be included in the i-th scan line Si described with reference to FIG. 6B and may be connected to each other. The first sub-sensing line SS_S1, the second sub-sensing line SS_S2, and the third sub-sensing line SS_S3 may be included in the i-th sensing line SSi described with reference to FIG. 6B and may be connected to each other. The 11-th read-out pattern RP11 may be connected to the first read-out line R1. The 12-th read-out pattern RP12 may be connected to the second read-out line R2. The 13-th read-out pattern RP13 may be connected to the third read-out line R3.

Likewise, the 11-th pixel circuit PXC11, the 21-th pixel circuit PXC21, and the 31-th pixel circuit PXC31 in the second pixel PXL2 may be connected to the first sub-scan line S_S1, the first sub-sensing line SS_S1, and the 11-th read-out pattern RP11. The 12-th pixel circuit PXC12, the 22-th pixel circuit PXC22, and the 32-th pixel circuit PXC32 in the second pixel PXL2 may be connected to the second sub-scan line S_S2, the second sub-sensing line SS_S2, and the 12-th read-out pattern RP12. The 13-th pixel circuit PXC13, the 23-th pixel circuit PXC23, and the 33-th pixel circuit PXC33 in the second pixel PXL2 may be connected to the third sub-scan line S_S3, the third sub-sensing line SS_S3, and the 13-th read-out pattern RP13.

Likewise, the 11-th pixel circuit PXC11, the 21-th pixel circuit PXC21, and the 31-th pixel circuit PXC31 in the third pixel PXL3 may be connected to the first sub-scan line S_S1, the first sub-sensing line SS_S1, and the 11-th read-out pattern RP11. The 12-th pixel circuit PXC12, the 22-th pixel circuit PXC22, and the 32-th pixel circuit PXC32 in the third pixel PXL3 may be connected to the second sub-scan line S_S2, the second sub-sensing line SS_S2, and the 12-th read-out pattern RP12. The 13-th pixel circuit PXC13, the 23-th pixel circuit PXC23, and the 33-th pixel circuit PXC33 in the third pixel PXL3 may be connected to the third sub-scan line S_S3, the third sub-sensing line SS_S3, and the 13-th read-out pattern RP13.

In other words, in case that one sub-pixel includes three unit pixels, the first unit pixels (i.e., the 11-th, 21-th, and 31-th pixel circuits PXC11, PXC21, and PXC31) in three pixels (i.e., the first to third pixels PXL1, PXL2, and PXL3) may share the first read-out line R1, the second unit pixels (i.e., the 12-th, 22-th, and 32-th pixel circuits PXC12, PXC22, and PXC32) may share the second read-out line R2, and the third unit pixels (i.e., the 13-th, 23-th, and 33-th pixel circuits PXC13, PXC23, and PXC33) may share the third read-out line R3. In addition, the first sub-pixel in the first pixel PXL1 (i.e., the 11-th, 12-th, and 13-th pixel circuits PXC11, PXC12, and PXC13) may be connected to the first data line D1, the second sub-pixel in the first pixel PXL1 (i.e., the 21-th, 22-th, and 23-th pixel circuits PXC21, PXC22, and PXC23) may be connected to the second data line D2, and the third sub-pixel in the first pixel PXL1 (i.e., the 31-th, 32-th, and 33-th pixel circuits PXC31, PXC32, and PXC33) may be connected to the third data line D3. The first sub-pixel in the second pixel PXL2 (i.e., the 11-th, 12-th, and 13-th pixel circuits PXC11, PXC12, and PXC13) may be connected to the fourth data line D4, the second sub-pixel in the second pixel PXL2 (i.e., the 21-th, 22-th, and 23-th pixel circuits PXC21, PXC22, and PXC23) may be connected to the fifth data line D5, and the third sub-pixel in the second pixel PXL2 (i.e., the 31-th, 32-th, and 33-th pixel circuits PXC31, PXC32, and PXC33) may be connected to the sixth data line D6. The first sub-pixel in the third pixel PXL3 (i.e., the 11-th, 12-th, and 13-th pixel circuits PXC11, PXC12, and PXC13) may be connected to the seventh data line D7, the second sub-pixel in the third pixel PXL3 (i.e., the 21-th, 22-th, and 23-th pixel circuits PXC21, PXC22, and PXC23) may be connected to the eighth data line D8, and the third sub-pixel in the third pixel PXL3 (i.e., the 31-th, 32-th, and 33-th pixel circuits PXC31, PXC32, and PXC33) may be connected to the ninth data line D9.

As illustrated in FIG. 6B, in case that one sub-pixel includes k unit pixels, k-th unit pixels in k sub-pixels may share a k-th read-out line.

Figure 19:
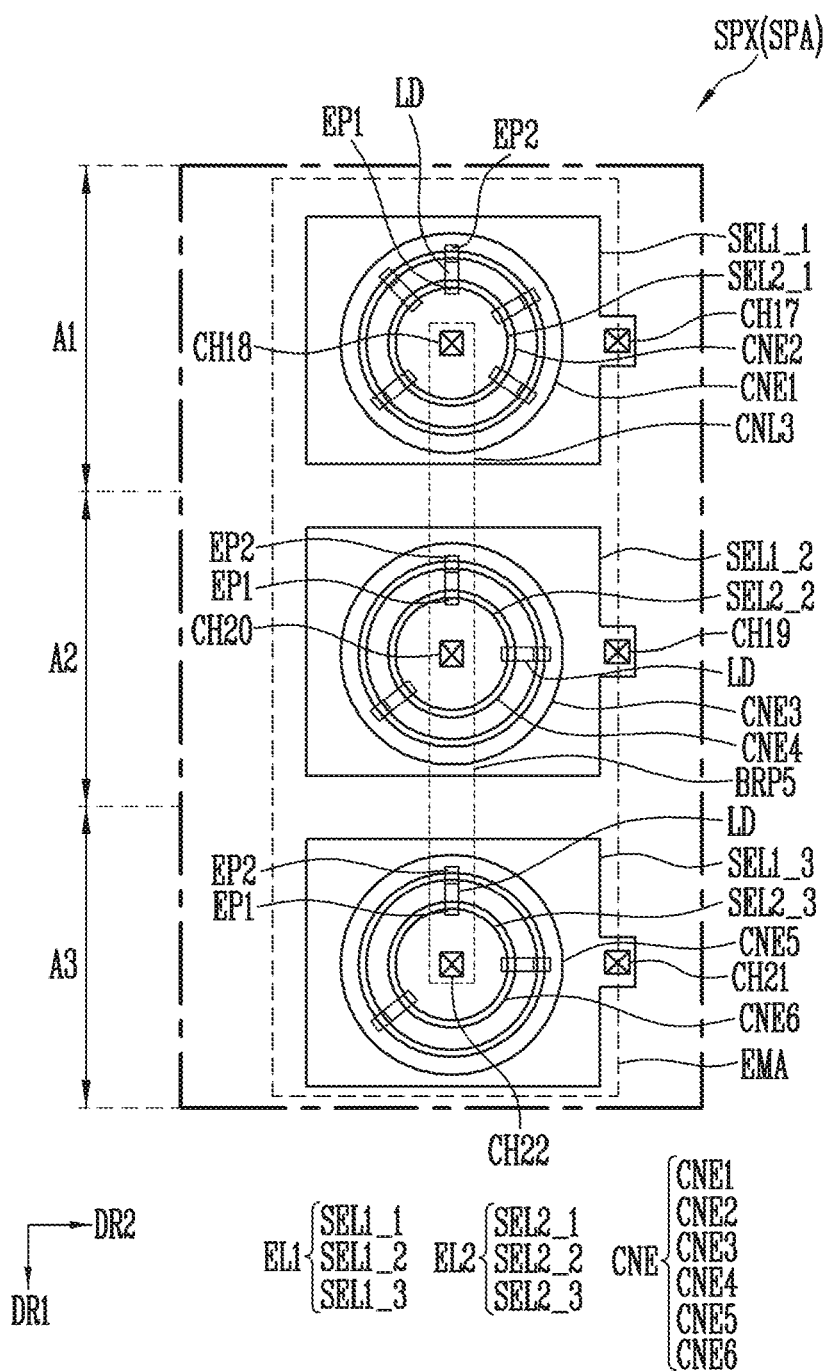
FIG. 19 is a plan view illustrating an example of the light emitting element layer included in the display device of FIG. 10.

FIG. 19 is a plan view illustrating an example of the light emitting element layer included in the display device of FIG. 10. FIG. 19 illustrates a light emitting element layer corresponding to the pixel circuit layer (e.g., the 11-th to 13-th pixel circuits PXC11, PXC12, and PXC13) of FIG. 18.

Referring to FIG. 19, a sub-pixel SPX (or a sub-pixel area) may include first to third areas A1, A2, and A3 divided from each other in the first direction DR1. The 11-th to 13-th pixel circuits PXC11, PXC12, and PXC13 described with reference to FIG. 18 may be provided in each of the first to third areas A1, A2, and A3.

The sub-pixel SPX (or the light emitting element layer) may include first and second electrodes EL1 and EL2, a contact electrode CNE, and light emitting elements LD that are provided in the emission area EMA.

The first electrode EL1 and the second electrode EL2 may be spaced from each other. The first electrode EL1 may include a 1-1-th sub-electrode SEL1_1 provided in the first area A1, a 1-2-th sub-electrode SEL1_2 provided in the second area A2, and a 1-3-th sub-electrode SEL1_3 provided in the third area A3. The 1-1-th sub-electrode SEL1_1, the 1-2-th sub-electrode SEL1_2, and the 1-3-th sub-electrode SEL1_3 may be spaced from each other on a plane. The second electrode EL2 may include a 2-1-th sub-electrode SEL2_1 provided in the first area A1, a 2-2-th sub-electrode SEL2_2 provided in the second area A2, and a 2-3-th sub-electrode SEL2_3 provided in the third area A3. The 2-1-th sub-electrode SEL2_1, the 2-2-th sub-electrode SEL2_2, and the 2-3-th sub-electrode SEL2_3 may be spaced from each other on a plane.

The 2-1-th sub-electrode SEL2_1 may be disposed, in a plan view, in a central portion of the first area A1 and have a circular shape. The 1-1-th sub-electrode SEL1_1 may have a shape enclosing the perimeter of the 2-1-th sub-electrode SEL2_1 in a circumferential direction. The 2-1-th sub-electrode SEL2_1 may be provided in a shape of an isolated circular island enclosed by the 1-1-th sub-electrode SEL1_1, but the present disclosure is not limited thereto. The 1-1-th sub-electrode SEL1_1 and the 2-1-th sub-electrode SEL2_1 may be spaced from each other by a suitable distance (e.g., a set or predetermined distance).

Likewise, the 2-2-th sub-electrode SEL2_2 may be disposed, in a plan view, in a central portion of the second area A2 and have a circular shape. The 1-2-th sub-electrode SEL1_2 may have a shape enclosing the perimeter of the 2-2-th sub-electrode SEL2_2 in a circumferential direction.

The 2-3-th sub-electrode SEL2_3 may be disposed, in a plan view, in a central portion of the third area A3 and have a circular shape. The 1-3-th sub-electrode SEL1_3 may have a shape enclosing the perimeter of the 2-3-th sub-electrode SEL2_3 in a circumferential direction.

In one or more embodiments, the distance between the 1-1-th sub-electrode SEL1_1 and the 2-1-th sub-electrode SEL2_1, the distance between the 1-2-th sub-electrode SEL1_2 and the 2-2-th sub-electrode SEL2_2, and the distance between the 1-3-th sub-electrode SEL1_3 and the 2-3-th sub-electrode SEL2_3 may be the same as each other. Hence, the light emitting elements LD may be more regularly aligned in the first to third areas A1, A2, and A3. However, the present disclosure is not limited thereto. In one or more embodiments, the distance between the 1-1-th sub-electrode SEL1_1 and the 2-1-th sub-electrode SEL2_1, the distance between the 1-2-th sub-electrode SEL1_2 and the 2-2-th sub-electrode SEL2_2, and the distance between the 1-3-th sub-electrode SEL1_3 and the 2-3-th sub-electrode SEL2_3 may differ from each other.

Each of the 1-1-th to 1-3-th sub-electrodes SEL1_1, SEL1_2, and SEL1_3 and the 2-1-th to 2-3-th sub-electrodes SEL2_1, SEL2_2, and SEL2_3 may be formed of material having a desired reflectivity (e.g., a set or predetermined reflectivity) to allow light emitted from each of the light emitting elements LD provided in the corresponding area to travel in the image display direction of the display device.

Each of the 1-1-th to 1-3-th sub-electrodes SEL1_1, SEL1_2, and SEL1_3 and the 2-1-th to 2-3-th sub-electrodes SEL2_1, SEL2_2, and SEL2_3 may be formed of conductive material having a desired reflectivity (e.g., a set or predetermined reflectivity).

In the first area A1, the 2-1-th sub-electrode SEL2_1 and the 1-1-th sub-electrode SEL1_1 that encloses the perimeter of the 2-1-th sub-electrode SEL2_1, along with a plurality of light emitting elements LD connected in parallel therebetween, may form a first serial set. Likewise, in the second area A2, the 2-2-th sub-electrode SEL2_2 and the 1-2-th sub-electrode SEL1_2 that encloses the perimeter of the 2-2-th sub-electrode SEL2_2, along with a plurality of light emitting elements LD connected in parallel therebetween, may form a second serial set. Furthermore, in the third area A3, the 2-3-th sub-electrode SEL2_3 and the 1-3-th sub-electrode SEL1_3 that encloses the perimeter of the 2-3-th sub-electrode SEL2_3, along with a plurality of light emitting elements LD connected in parallel therebetween, may form a third serial set.

The first to third serial sets SET1, SET2, and SET3 are disposed in the emission area EMA of the sub-pixel SPX. The first to third serial sets SET1, SET2, and SET3 may form an emission unit EMU (refer to FIG. 7) of the sub-pixel SPX.

In one or more embodiments, the 1-1-th sub-electrode SEL1_1 may be connected, through a 17-th contact hole CH17, to a pixel circuit (e.g., the 11-th pixel circuit PXC11 illustrated in FIG. 18) included in the pixel circuit layer PCL (refer to FIG. 16A). For example, the 1-1-th sub-electrode SEL1_1 may be electrically connected to a first transistor electrode ET1 (or a second transistor electrode ET2) of the first transistor T1 illustrated in FIG. 16A through the seventeenth contact hole CH17. Likewise, the 1-2-th sub-electrode SEL1_2 may be connected to a pixel circuit (e.g., the 12-th pixel circuit PXC12 illustrated in FIG. 18) through a nineteenth contact hole CH19. The 1-3-th sub-electrode SEL1_3 may be connected to a pixel circuit (e.g., the 13-th pixel circuit PXC13 illustrated in FIG. 18) through a twenty-first contact hole CH21.

Each of the light emitting elements LD may be formed of a light emitting diode that is made of material having an inorganic crystal structure and has a subminiature size, e.g., ranging from the nanoscale to the microscale. For example, each of the light emitting elements LD may be a subminiature light emitting diode having a size ranging from the nanoscale to the microscale, as illustrated in any one of FIGS. 1A to 4B.

In the first area A1, the light emitting elements LD may be aligned along the perimeter of the 2-1-th sub-electrode SEL2_1. For example, the light emitting elements LD may be radially aligned around the 2-1-th sub-electrode SEL2_1 having a circular shape between the 1-1-th sub-electrode SEL1_1 and the 2-1-th sub-electrode SEL2_1. In the second area A2, the light emitting elements LD may be aligned along the perimeter of the 2-2-th sub-electrode SEL2_2. For example, the light emitting elements LD may be radially aligned around the 2-2-th sub-electrode SEL2_2 having a circular shape between the 1-2-th sub-electrode SEL1_2 and the 2-2-th sub-electrode SEL2_2. In the third area A3, the light emitting elements LD may be aligned along the perimeter of the 2-3-th sub-electrode SEL2_3. For example, the light emitting elements LD may be radially aligned around the 2-3-th sub-electrode SEL2_3 having a circular shape between the 1-3-th sub-electrode SEL1_3 and the 2-3-th sub-electrode SEL2_3.

In one or more embodiments, at least one reverse light emitting element LDr (refer to FIG. 7) connected in a reverse direction between two adjacent sub-electrodes in each serial set may be further disposed, or at least one defective light emitting element, e.g., an invalid light source, which is not connected to two adjacent sub-electrodes in each serial set may be further disposed between the two sub-electrodes.

The light emitting elements LD may be diffused in a solution and supplied into the emission area EMA of sub-pixel SPX. As described with reference to FIG. 15, if the first and second electrodes EL1 and EL2 are supplied with corresponding alignment signals (or alignment voltages), the light emitting elements LD may be aligned between the first and second electrodes EL1 and EL2.

Before the light emitting elements LD are aligned in the emission area EMA, the 1-1-th sub-electrode SEL1_1, the 1-2-th sub-electrode SEL1_2, and the 1-3-th sub-electrode SEL1_3 that are included in the first electrode EL1 may be electrically and/or physically connected to each other. Furthermore, the 2-1-th sub-electrode SEL2_1, the 2-2-th sub-electrode SEL2_2, and the 2-3-th sub-electrode SEL2_3 that are included in the second electrode EL2 may be electrically connected to each other through an eighteenth contact hole CH18, a twentieth contact hole CH20, a twenty-second contact hole CH22, and a fifth bridge pattern BRP5. Here, the fifth bridge pattern BRP5 may be provided on the third insulating layer ILD2 (or between the third insulating layer ILD2 and the passivation layer PSV) described with reference to FIG. 13.

After the light emitting elements LD are aligned, the 1-1-th sub-electrode SEL1_1, the 1-2-th sub-electrode SEL1_2, and the 1-3-th sub-electrode SEL1_3 may be separated from each other, disposed on the same column, and spaced from each other. The first electrode EL1 may be provided in the form of including the 1-1-th, 1-2-th, and 1-3-th sub-electrodes SEL1_1, SEL1_2, and SEL1_3 disposed on the same column and spaced from each other, by removing or disconnecting a portion of the first electrode EL1 after the light emitting elements LD are aligned.

As described above, when the light emitting elements LD are aligned, the first and second electrodes EL1 and EL2 may function as alignment electrodes (or alignment lines) for alignment of the light emitting elements LD. After the light emitting elements LD are aligned in the emission area EMA, the 1-1-th to 1-3-th sub-electrodes SEL1_1, SEL1_2, and SEL1_3 and the 2-1-th to 2-3-th sub-electrodes SEL2_1, SEL2_2, and SEL2_3 may function as driving electrodes configured to drive the light emitting elements LD.

The first end EP1 of each of the light emitting elements LD may be directly connected to one sub-electrode of two sub-electrodes adjacent to each other in the first direction DR1, or may be connected to the one sub-electrode through a contact electrode CNE. Furthermore, the second end EP2 of each of the light emitting elements LD may be directly connected to the remaining sub-electrode of the two adjacent sub-electrodes, or may be electrically connected to the remaining sub-electrode through a contact electrode CNE.

Contact electrodes CNE may be respectively disposed on the 1-1-th to 1-3-th sub-electrodes SEL1_1, SEL1_2, and SEL1_3 and the 2-1-th to 2-3-th sub-electrodes SEL2_1, SEL2_2, and SEL2_3.

Each contact electrode CNE may be formed of various transparent conductive materials. The contact electrodes CNE may include a first contact electrode CNE1 disposed on the 1-1-th sub-electrode SEL1_1, a second contact electrode CNE2 disposed on the 2-1-th sub-electrode SEL2_1, a third contact electrode CNE3 disposed on the 1-2-th sub-electrode SEL1_2, a fourth contact electrode CNE4 disposed on the 2-2-th sub-electrode SEL2_2, a fifth contact electrode CNE5 disposed on the 1-3-th sub-electrode SEL1_3, and a sixth contact electrode CNE6 disposed on the 2-3-th sub-electrode SEL2_3.

The first contact electrode CNE1 may connect the 1-1-th sub-electrode SEL1_1 with one end of the opposite ends EP1 and EP2 of each of the light emitting elements LD in the first area A1. In a plan view, the first contact electrode CNE1 may overlap the one end of each of the light emitting elements LD and the 1-1-th sub-electrode SEL1_1.

The second contact electrode CNE2 may connect the 2-1-th sub-electrode SEL2_1 with a remaining end of the opposite ends EP1 and EP2 of each of the light emitting elements LD in the first area A1. In a plan view, the second contact electrode CNE2 may overlap the remaining end of each of the light emitting elements LD and the 2-1-th sub-electrode SEL2_1.

Likewise, the third contact electrode CNE3 may connect the 1-2-th sub-electrode SEL1_2 with one end of the opposite ends EP1 and EP2 of each of the light emitting elements LD in the second area A2. The fourth contact electrode CNE4 may connect the 2-2-th sub-electrode SEL2_2 with a remaining end of the opposite ends EP1 and EP2 of each of the light emitting elements LD in the second area A2. The fifth contact electrode CNE5 may connect the 1-3-th sub-electrode SEL1_3 with one end of the opposite ends EP1 and EP2 of each of the light emitting elements LD in the third area A3. The sixth contact electrode CNE6 may connect the 2-3-th sub-electrode SEL2_3 with a remaining end of the opposite ends EP1 and EP2 of each of the light emitting elements LD in the third area A3.

Each of the first to sixth contact electrodes CNE1 to CNE6 may have a circular shape, but the present disclosure is not limited thereto, and for example, it may be changed in various shapes so long as it can reliably electrically and/or physically connect one sub-electrode disposed thereunder with one of the opposite ends EP1 and EP2 of each of the light emitting elements LD.

As described with reference to FIG. 19, the emission area EMA of the sub-pixel SPX is divided into the first to third areas A1, A2, and A3 in the second direction DR2. In each of the first to third areas A1, A2, and A3, two sub-electrodes spaced from each other, and light emitting elements LD connected in parallel to each other between the sub-electrodes may be provided. The light emitting elements LD disposed in each of the first to third areas A1, A2, and A3 may be disposed (or aligned) in various directions along the circumferential direction of one sub-electrode of two sub-electrodes disposed in the corresponding area, the one sub-electrode having an isolated island shape enclosed by the other sub-electrode. In this case, the light emitting elements LD may not be disposed (or aligned) to be biased in a specific direction in the emission area EMA of each pixel PXL. Therefore, light emitted from each of the light emitting elements LD may be prevented from being concentrated in a specific direction. Hence, the amount (or the intensity) of light emitted from the emission area EMA of each pixel PXL may be similar to or substantially equal to the amount (or intensity) of light emitted from the emission area EMA of an adjacent pixel PXL. Therefore, the display device in accordance with one or more embodiments of the present disclosure may have uniform light output distribution over the overall area thereof.

Because a cross-section of a sub-pixel SPX (or a display device) based on one of the light emitting elements LD illustrated in FIG. 19 is substantially equal or similar to the cross-section of the display device described with reference to FIGS. 16A to 16D, explanation of a cross-sectional structure of the sub-pixel SPX will be omitted.

Figure 20:
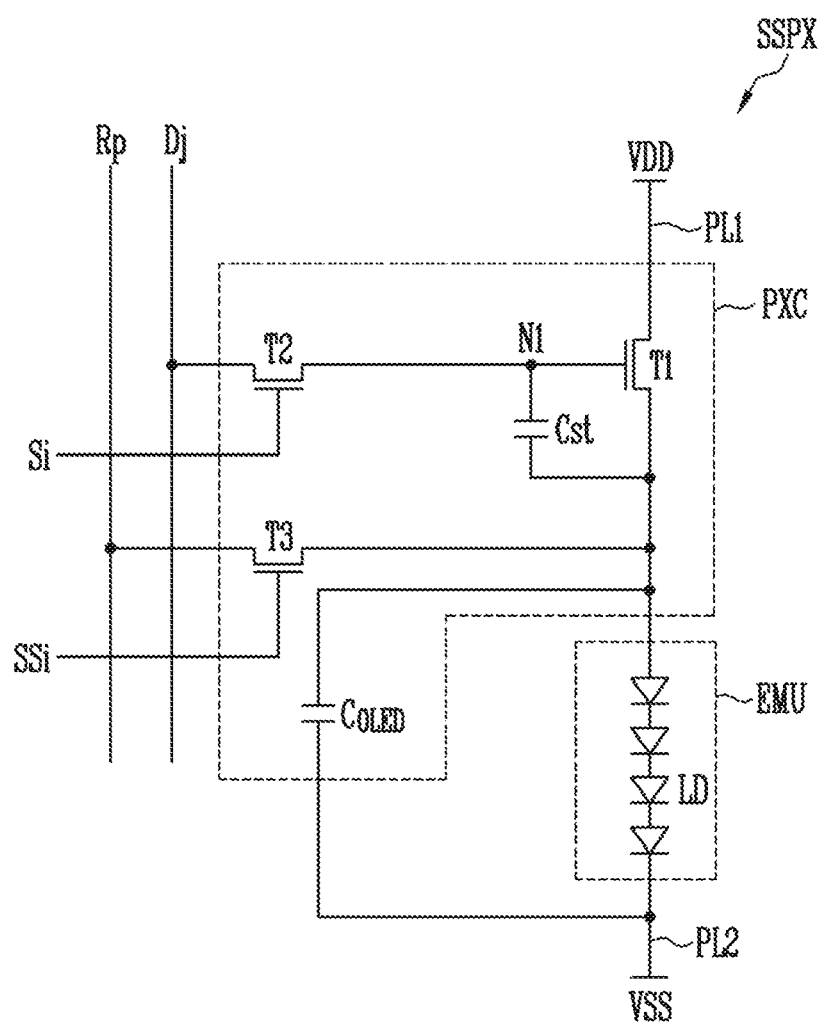
FIG. 20 is a circuit diagram illustrating an example of the unit pixel included in the display device of FIG. 6A.
Figure 21:
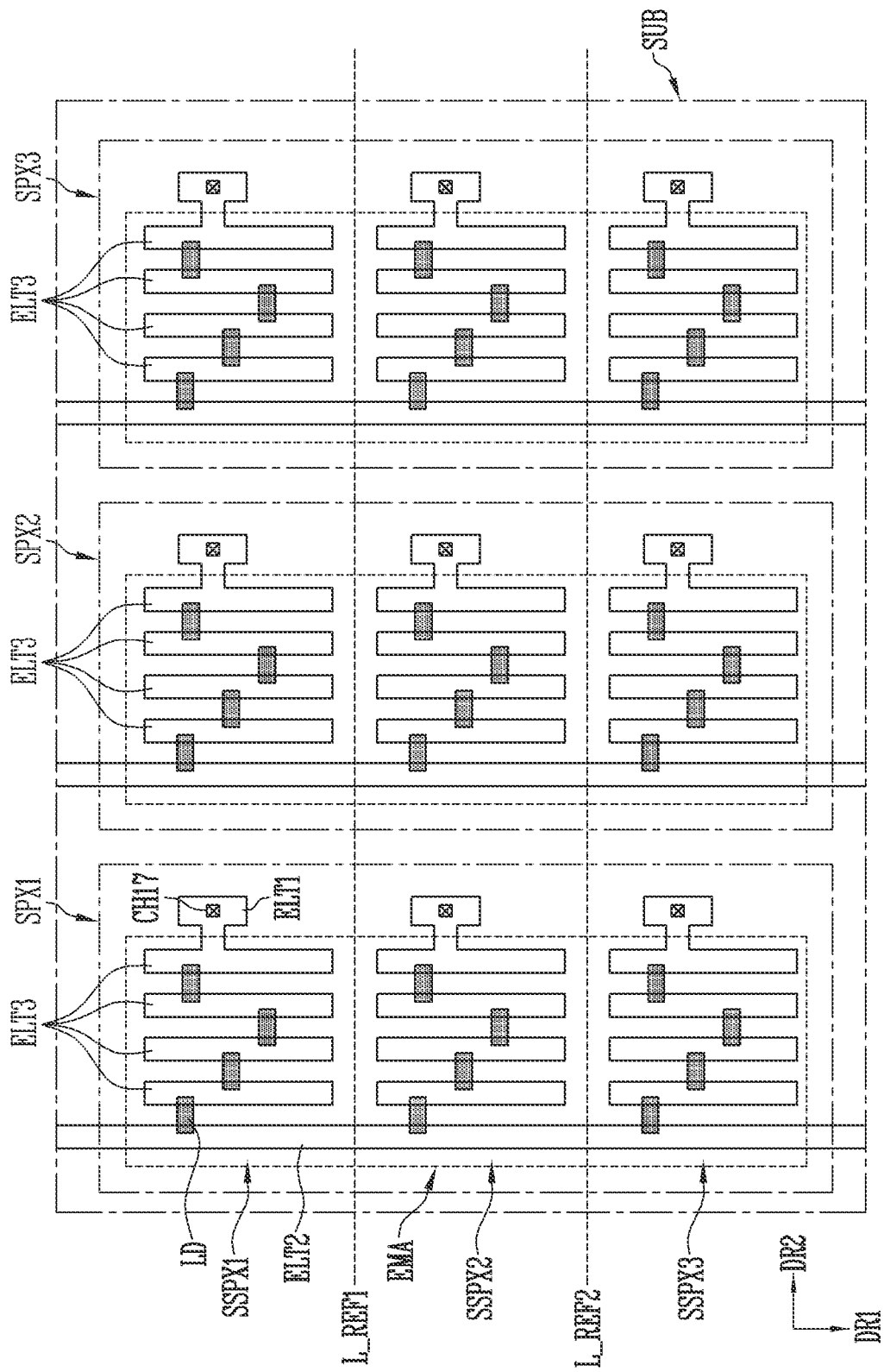
FIG. 21 is a plan view illustrating an example of the light emitting element layer included in the display device of FIG. 10.

FIG. 20 is a circuit diagram illustrating an example of the unit pixel included in the display device of FIG. 6A. FIG. 21 is a plan view illustrating an example of the light emitting element layer included in the display device of FIG. 10. FIG. 21 illustrates a light emitting element layer corresponding to the pixel circuit layer (e.g., the pixel circuits of the first pixel PXL1) of FIG. 18.

Referring to FIGS. 7 and 20, a unit pixel SSPX of FIG. 20 is different from the unit pixel SSPX of FIG. 7 in that the unit pixel SSPX includes an emission unit EMU (or a light emitting element string) including light emitting elements LD connected in series to each other. The unit pixel SSPX of FIG. 20 other than the emission unit EMU is substantially equal or similar to the unit pixel SSPX of FIG. 7, and thus, redundant explanation thereof will be omitted.

Referring to FIG. 21, each of the sub-pixels SPX1, SPX2, and SPX3 may include three light emitting element strings. Each of the light emitting element strings may include light emitting elements LD connected in series to each other.

The emission area EMA may be divided into first to third sub-emission areas (i.e., areas respectively corresponding to the first to third unit pixels SSPX1, SSPX2, and SSPX3) by first and second reference lines L_REF1 and L_REF2. Arrangement structures of the light emitting elements LD in the first to third sub-emission areas are substantially equal or similar to each other, so that an arrangement structure of the light emitting elements LD will be explained based on the first sub-emission area (or the first unit pixel SSPX1).

The first sub-pixel SPX1 (or the first unit pixel SSPX1) may include a first electrode ELT1 and a second electrode ELT2 disposed in the emission area EMA (or the sub-pixel area) at positions spaced from each other, and third electrodes ELT3 arranged between the first electrode ELT1 and the second electrode ELT2. Furthermore, the first sub-pixel SPX1 (or the first unit pixel SSPX1) may include light emitting elements LD connected in series between the first and second electrodes ELT1 and ELT2 by the third electrodes ELT3.

In one or more embodiments, the first electrode ELT1 and the second electrode ELT2 may be disposed at positions spaced from each other in the emission area EMA (or the sub-pixel area) such that at least partial areas thereof face (or oppose) each other. For example, the first and second electrodes ELT1 and ELT2 each may extend in the first direction DR1, and may be spaced from each other by a suitable distance (e.g., a set or predetermined distance) in the second direction DR2. However, the present disclosure is not limited thereto. For example, the shapes and/or relative disposition relationship of the first and second electrodes ELT1 and ELT2 may be changed in various ways.

The third electrodes ELT3 may extend in the first direction DR1 and may be disposed at regular intervals along the second direction DR2 between the first and second electrodes ELT1 and ELT2. For example, as illustrated in FIG. 21, four third electrodes ELT3 may be disposed at regular intervals along the second direction DR2 between the first and second electrodes ELT1 and ELT2, but the present disclosure is not limited thereto. The number of third electrodes ELT3 may be changed in various ways.

In one or more embodiments, the first electrode ELT1 may be disposed in each of the sub-emission areas. The second electrode ELT2 may be disposed in the entirety of the emission area EMA, i.e., across the sub-emission areas. The third electrode ELT3 may be disposed between the first and second electrodes ELT1 and ELT2 in the corresponding sub-emission area (e.g., in the area corresponding to the first unit pixel SSPX1).

In one or more embodiments, the first electrode ELT1 may be formed integrally with one of the third electrodes ELT3.

Each of the first to third electrodes ELT1, ELT2, and ELT3 may have a single layer structure or a multilayer structure, as described with reference to FIG. 15. Furthermore, each of the first to third electrodes ELT1, ELT2, and ELT3 may protrude in an upward direction (or a height direction or a thickness direction of the base layer SUB) by a partition wall that is disposed to overlap with the corresponding electrode.

The light emitting elements LD each may be disposed between two adjacent electrodes of the first to third electrodes ELT1, ELT2, ELT3 and electrically connected to the two adjacent electrodes. For example, a light emitting element LD may be disposed between the first electrode ELT1 and a first sub-electrode (i.e., a third electrode closest to the first electrode ELT1 among the third electrodes ELT3). A first end of the light emitting element LD may be electrically connected to the first electrode ELT1, and a second end of the light emitting element LD may be electrically connected to the first sub-electrode. Likewise, a light emitting element LD may be disposed between the second electrode ELT2 and a second sub-electrode (i.e., a third electrode closest to the second electrode ELT2 among the third electrodes ELT3). A first end of the light emitting element LD may be electrically connected to the second sub-electrode, and a second end of the light emitting element LD may be electrically connected to the second electrode ELT2. In this way, the light emitting elements LD in the first sub-emission area may be connected in series between the first and second electrodes ELT1 and ELT2.

Although FIG. 21 illustrates that the light emitting elements LD are connected in series in one sub-emission area (or one unit pixel), the light emitting elements LD are not limited thereto. For example, in the one sub-emission area, at least some of the light emitting elements LD may be connected in parallel to other light emitting elements. In other words, in FIG. 21, the light emitting elements LD in the one sub-emission area may be arranged in a serial/parallel combined connection structure.

While the spirit and scope of the present disclosure are described by detailed embodiments, it should be noted that the above-described embodiments are merely descriptive and should not be considered limiting. It should be understood by those skilled in the art that various changes, substitutions, and alternations may be made herein without departing from the scope of the present disclosure as defined by the following claims.

The scope of the present disclosure is not limited by detailed descriptions of the present specification, and should be defined by the accompanying claims. Furthermore, all changes or modifications of the present disclosure derived from the meanings and scope of the claims, and equivalents thereof should be construed as being included in the scope of the present disclosure.

The invention claimed is:
1. A display device comprising:
a first scan line;
a first data line and a second data line;
a first read-out line and a second read-out line;
a first sub-pixel directly connected to the first scan line, the first data line, and the first read-out line;
a second sub-pixel directly connected to the first scan line, the first data line, and the second read-out line; and
a third sub-pixel directly connected to the first scan line, the second data line, and the first read-out line,
wherein each of the first sub-pixel, the second sub-pixel, and the third sub-pixel comprises at least two light emitting elements.

2. The display device according to claim 1, further comprising:
a third read-out line; and
a fourth sub-pixel directly connected to the first scan line, the second data line, and the third read-out line.

3. The display device according to claim 2, wherein the first sub-pixel comprises:
a first light emitting element;
a first transistor configured to transmit, to the first light emitting element, driving current corresponding to a first data signal received through the first data line in response to a first scan signal received through the first scan line; and
a second transistor directly connected between one electrode of the first light emitting element and the first read-out line.

4. The display device according to claim 3, wherein the second sub-pixel comprises:
a second light emitting element;
a first transistor configured to transmit, to the second light emitting element, the driving current corresponding to the first data signal received through the first data line in response to the first scan signal received through the first scan line; and
a second transistor directly connected between one electrode of the second light emitting element and the second read-out line,
wherein the second sub-pixel is configured to emit light having a color same as a color of light emitted from the first sub-pixel.

5. The display device according to claim 4, further comprising a second scan line,
wherein the second transistor of each of the first sub-pixel and the second sub-pixel comprises a gate electrode directly connected to the second scan line.

6. The display device according to claim 1, wherein the first data line, the second data line, the first read-out line, and the second read-out line extend in a first direction,
wherein the second sub-pixel is adjacent to the first sub-pixel in the first direction,
wherein the third sub-pixel is adjacent to the first sub-pixel in a second direction, and
wherein the second direction is perpendicular to the first direction.

7. The display device according to claim 6, wherein a first distance between the first data line and the second data line is less than a second distance between the first read-out line and the second read-out line.

8. The display device according to claim 7, further comprising:
a substrate;
a pixel circuit layer on the substrate, and comprising the first data line, the second data line, the first scan line, the first read-out line, and the second read-out line;
a first electrode on the pixel circuit layer; and
second electrodes on the pixel circuit layer and facing the first electrode, and spaced from each other and electrically separated from each other,
wherein a first light emitting element of the first sub-pixel is located between a first sub-electrode of the second electrodes and the first electrode, and
wherein a second light emitting element of the second sub-pixel is located between a second sub-electrode of the second electrodes and the first electrode.

9. The display device according to claim 8, wherein the first electrode extends in the first direction, and
wherein the second electrodes extend in the first direction and are spaced from each other along the first direction.

10. The display device according to claim 8, further comprising a bank on the pixel circuit layer,
wherein the first light emitting element of the first sub-pixel and the second light emitting element of the second sub-pixel are in one emission area defined by the bank.

11. The display device according to claim 8, further comprising:
a third electrode between the first sub-electrode and the first electrode, and spaced from the first sub-electrode and the first electrode,
wherein the first light emitting element is located between two adjacent electrodes from among the first sub-electrode, the first electrode, and the third electrode.

12. The display device according to claim 1, further comprising:
a third read-out line; and
a fourth sub-pixel directly connected to the first scan line, the first data line, and the third read-out line.

13. The display device according to claim 12, further comprising:
a third data line; and
a fifth sub-pixel directly connected to the first scan line, the third data line, and the first read-out line.

14. The display device according to claim 12, further comprising:
a substrate;
a pixel circuit layer on the substrate, and comprising the first data line, the second data line, the first scan line, the first read-out line, and the second read-out line; and
a first sub-electrode and a second sub-electrode located in each of first area, second area, and third area on the pixel circuit layer and spaced from each other,
wherein a first light emitting element of the first sub-pixel is located between the first sub-electrode and the second sub-electrode in the first area,
wherein a second light emitting element of the second sub-pixel is located between the first sub-electrode and the second sub-electrode in the second area, and
wherein a third light emitting element of the fourth sub-pixel is located between the first sub-electrode and the second sub-electrode in the third area.

15. The display device according to claim 14, wherein in each of the first area, the second area, and the third area, one sub-electrode of the first sub-electrode and the second sub-electrode has a circular planar shape, and another sub-electrode of the first sub-electrode and the second sub-electrode has a shape enclosing a perimeter of the one sub-electrode.

16. The display device according to claim 15, wherein the first light emitting element, the second light emitting element, and the third light emitting element are located between the first sub-electrode and the second sub-electrode along a circumferential direction with respect to the first sub-electrode in a corresponding area.

17. A display device comprising:
   one first scan line;
   one first data line;
   first to k-th read-out lines (here, k is an integer of 2 or more); and
   first sub-pixels directly connected to the one first scan line and the one first data line, the first sub-pixels simultaneously emitting light in response to a same scan signal provided to the one first scan line and a same data signal provided to the one first data line,
   wherein a first sub-pixel of the first sub-pixels is directly connected to the first read-out line, and
   wherein a k-th sub-pixel of the first sub-pixels is directly connected to the k-th read-out line.

18. The display device according to claim 17, comprising:
   a second data line;
   a k+1-th read-out line; and
   second sub-pixels directly connected to the one first scan line and the second data line,
   wherein a first sub-pixel of the second sub-pixels is directly connected to a second read-out line of the first to the k-th read-out lines, and
   wherein a k-th sub-pixel of the second sub-pixels is directly connected to the k+1-th read-out line.

19. The display device according to claim 17, further comprising:
   a second data line; and
   second sub-pixels directly connected to the one first scan line and the second data line,
   wherein a first sub-pixel of the second sub-pixels is directly connected to the first read-out line, and
   wherein a k-th sub-pixel of the second sub-pixels is directly connected to the k-th read-out line.

20. The display device according to claim 19, wherein each of the first sub-pixels comprises:
   at least one light emitting element;
   a first transistor configured to transmit, to the at least one light emitting element, driving current corresponding to a first data signal received through the one first data line in response to a first scan signal received through the one first scan line; and
   a second transistor directly connected to one electrode of the at least one light emitting element and a corresponding read-out line of the first to the k-th read-out lines.

* * * * *